(12) United States Patent
Lee et al.

(10) Patent No.: US 8,829,589 B2
(45) Date of Patent: Sep. 9, 2014

(54) THREE-DIMENSIONAL SEMICONDUCTOR MEMORY DEVICE

(71) Applicants: Changhyun Lee, Suwon-si (KR); Byoungkeun Son, Gyeonggi-do (KR); Youngwoo Park, Seoul (KR)

(72) Inventors: Changhyun Lee, Suwon-si (KR); Byoungkeun Son, Gyeonggi-do (KR); Youngwoo Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 13/757,273

(22) Filed: Feb. 1, 2013

(65) Prior Publication Data

US 2013/0140623 A1    Jun. 6, 2013

Related U.S. Application Data

(63) Continuation-in-part of application No. 13/217,416, filed on Aug. 25, 2011, now Pat. No. 8,643,080.

(30) Foreign Application Priority Data

Sep. 17, 2010    (KR) .................. 10-2010-0092000

(51) Int. Cl.
*H01L 29/788*    (2006.01)
*H01L 29/04*    (2006.01)
*H01L 29/792*    (2006.01)

(52) U.S. Cl.
CPC .............. *H01L 29/788* (2013.01); *H01L 29/04* (2013.01); *H01L 29/792* (2013.01)
USPC ................ 257/316; 257/3; 257/315; 257/326

(58) Field of Classification Search
CPC .............. H01L 29/792; H01L 29/7889; H01L 29/7926; H01L 29/11551; H01L 27/11556; H01L 27/11578
USPC ...................... 257/316, 326, 3, 315
See application file for complete search history.

(56) References Cited

U.S. PATENT DOCUMENTS

| | | |
|---|---|---|
| 2007/0158736 A1 | 7/2007 | Arai et al. |
| 2007/0184615 A1 | 8/2007 | Brazzelli et al. |
| 2008/0067583 A1 | 3/2008 | Kidoh et al. |
| 2008/0253187 A1 | 10/2008 | Aritome |
| 2008/0265236 A1 | 10/2008 | Lee et al. |
| 2009/0141547 A1 | 6/2009 | Jin et al. |

FOREIGN PATENT DOCUMENTS

KR    10-2009-0093700 A    9/2009

OTHER PUBLICATIONS

Jang et al., Vertical Cell Array using TCAT (Terabit Cell Array Transistor) Technology for Ultra High Density NAND Flash Memory, Symposium on VLSI Technology, Digest of Technical Papers, pp. 193-13 (2009).

*Primary Examiner* — Long K Tran
*Assistant Examiner* — Dzung Tran
(74) *Attorney, Agent, or Firm* — F.Chau & Associates, LLC

(57) ABSTRACT

A three-dimensional semiconductor memory device may include gap-fill insulating layers extending upward from a substrate, an electrode structure delimited by sidewalls of the gap-fill insulating layers, vertical structures provided between adjacent ones of the gap-fill insulating layers to penetrate the electrode structure, and at least one separation pattern extending along the gap-fill insulating layers and penetrating at least a portion of the electrode structure. The separation pattern may include at least one separation semiconductor layer.

21 Claims, 43 Drawing Sheets

THREE-DIMENSIONAL SEMICONDUCTOR MEMORY DEVICE

CROSS-REFERENCE TO RELATED APPLICATIONS

This application is a continuation-in-part of U.S. patent application Ser. No. 13/217,416 filed Aug. 25, 2011, which claims priority under 35 U.S.C. §119 to Korean Patent Application No. 10-2010-0092000, filed on Sep. 17, 2010, in the Korean Intellectual Property Office, the disclosure of which is herein incorporated by reference in its entirety.

BACKGROUND

Embodiments of the inventive concept relate generally to semiconductor devices, and more particularly, to three-dimensional (3D) semiconductor memory devices including three-dimensionally arranged memory cells.

A 3D-IC memory fabrication process that has memory cells stacked in 3 dimensions may be used to increase memory capacity.

The 3D-IC memory fabrication process includes a punch-and-plug process in which multiple thin layers are sequentially stacked on a substrate and then penetrated to form plugs. The punch-and-plug process may increase memory capacity without a drastic increase in manufacturing costs.

SUMMARY

Exemplary embodiments of the inventive concept may provide high-capacity storage three-dimensional (3D) semiconductor devices with an electrode structure fabricated by a simple process and methods of fabricating a three-dimensional semiconductor device capable of removing a sacrificial layer as well as forming an electrode structure in a stable manner.

According to an exemplary embodiment of the inventive concepts, a three-dimensional (3D) semiconductor device may include gap-fill insulating layers extending upward from a substrate, an electrode structure delimited by sidewalls of the gap-fill insulating layers, vertical structures provided between adjacent ones of the gap-fill insulating layers to penetrate the electrode structure, and at least one separation pattern extending substantially in parallel with the gap-fill insulating layers and penetrating at least a portion of the electrode structure. The at least one separation pattern may include at least one separation semiconductor layer.

In an exemplary embodiment, at least one of the vertical structures may be provided in a corresponding channel hole of channel holes penetrating the electrode structure and include a vertical semiconductor layer filling a portion of the corresponding channel hole.

In an exemplary embodiment, the at least one separation pattern may be provided in a first trench exposing the substrate, and the separation semiconductor layer may fill at least a portion of the first trench and the vertical separation patterns and the memory layers are formed of same layers.

In an exemplary embodiment, the at least one separation pattern may include vertical barrier patterns. At least one of the vertical barrier patterns may include the separation semiconductor layer and a separation insulating layer surrounded by the separation semiconductor layer, and the vertical barrier patterns may be provided in vertical holes disposed along an extending direction of the gap-fill insulating layers and exposing the substrate.

In an exemplary embodiment, the vertical barrier patterns may have substantially the same shape as the vertical structures.

In an exemplary embodiment, the vertical barrier patterns may be disposed spaced apart from each other along the extending direction of the gap-fill insulating layers, and the at least one separation pattern further include connection insulating layers interposed between the vertical barrier patterns.

In an exemplary embodiment, the electrode structure may include a string selection line and word lines provided under the string selection line. Bottom surfaces of the connection insulating layers may be lower than a bottom surface of the string selection line.

In an exemplary embodiment, the bottom surfaces of the connection insulating layers may be higher than a top surface of an uppermost one of the word lines.

In an exemplary embodiment, the vertical barrier patterns may be connected to each other along the extending direction of the gap-fill insulating layers, and the separation semiconductor layers of the vertical barrier patterns may be connected to each other.

In an exemplary embodiment, the vertical barrier patterns further include vertical separation patterns interposed between sidewalls of the vertical holes and the separation semiconductor layers, the vertical separation patterns may be connected to each other along the extending direction of the gap-fill insulating layers, and the separation semiconductor layers may be spaced apart from each other by the vertical separation patterns.

In an exemplary embodiment, the vertical structures include memory layers provided on sidewalls of channel holes penetrating the electrode structure, and the vertical separation patterns include at least one layer formed of the same material as the memory layers.

In an exemplary embodiment, the electrode structure may include horizontal structures sequentially stacked on the substrate, and the three-dimensional semiconductor device may include a cell array region provided with the vertical structures, and a pad region provided at one side or two opposite sides of the cell array region to include a stepwise structure formed by end portions of the horizontal structures. The at least one separation pattern extends from the cell array region to the pad region.

In an exemplary embodiment, the pad region may include a plurality of pad portions sequentially stacked on the substrate, and contact plugs electrically connected to the pad portions. The at least one separation pattern extends between the contact plugs.

In an exemplary embodiment, the pad region may include a plurality of pad portions sequentially stacked on the substrate, and the at least one separation pattern may penetrate a sidewall of a lowermost one of the pad portions.

In an exemplary embodiment, in plain view, the at least one separation pattern at least one may be shaped substantially like circles partially overlapping each other along the extending direction of the gap-fill insulating layers.

In an exemplary embodiment, the electrode structure may include electrodes and insulating layers alternatingly stacked on each other, and the three-dimensional semiconductor device may further include memory layers interposed between the electrodes and the vertical structures. The memory layers extend between the at least one separation pattern and the electrodes and electrically isolate the at least one separation pattern from the electrodes.

According to an exemplary embodiment of the inventive concepts, a three-dimensional semiconductor device may include horizontal structures sequentially stacked on a substrate, vertical structures penetrating the horizontal structures, and at least one separation pattern extending between the vertical structures and penetrating at least partially the horizontal structures. The horizontal structures include end portions constituting a stepwise pad region, and the at least one separation pattern includes vertical barrier patterns penetrating the pad region and including at least one layer formed of the same material as the vertical structures.

In an exemplary embodiment, the vertical structures may be provided in channel holes penetrating the horizontal structures, and the vertical barrier patterns may be provided in vertical holes penetrating the pad region.

In an exemplary embodiment, the at least one separation pattern further includes connection insulating layers connecting the vertical barrier patterns with each other and penetrating at least one of the horizontal structures.

In an exemplary embodiment, vertical barrier patterns and the vertical structures are formed of same layers.

According to an exemplary embodiment of the inventive concept, there is provided a semiconductor device including a substrate, a plurality of horizontal structures stacked on a top surface of the substrate, a row of vertical structures penetrating the horizontal structures in a first direction substantially perpendicular to the top surface of the substrate, wherein the vertical structures are spaced apart from each other in a second direction substantially parallel to the top surface of the substrate, a separation pattern penetrating at least one of the horizontal structures in the first direction, wherein the separation pattern extends in the second direction, and wherein the separation pattern has a cross section shaped substantially like circles that are spaced apart from each other or partially overlap each other, and a gap-fill insulating pattern penetrating the horizontal structures in the first direction.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EXEMPLARY EMBODIMENTS

Figure 1:
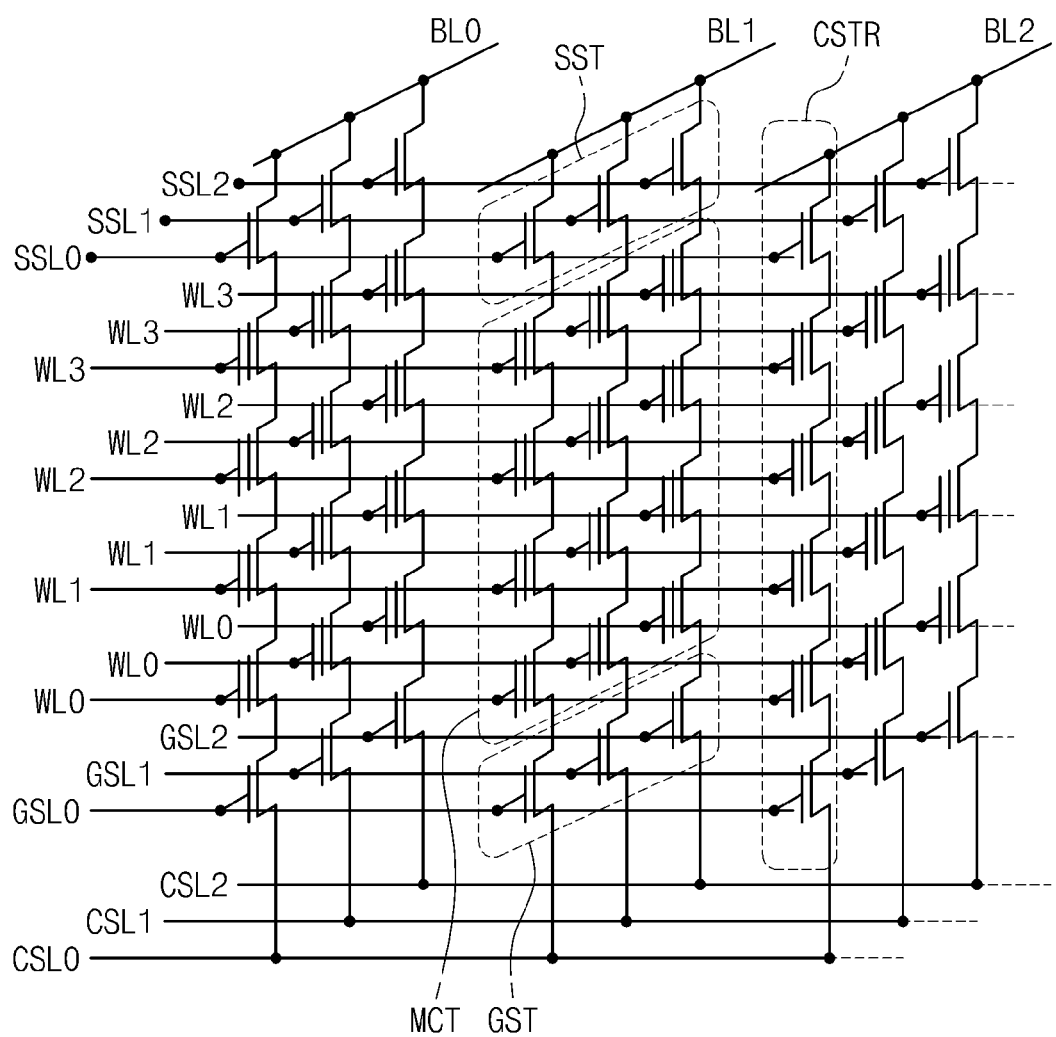
FIG. 1 is a circuit diagram of a three-dimensional semiconductor memory device according to an embodiment of the inventive concept.

Exemplary embodiments of the inventive concept will now be described in more detail with reference to the accompanying drawings, wherein like reference numerals may denote like or similar elements throughout the specification and the drawings. The present invention may, however, be embodied in many different forms and should not be construed as being limited to the embodiments set forth herein.

It will be understood that when an element is referred to as being "on", "connected to" or "coupled to" another element, it can be directly on, connected to or coupled to the other element or intervening elements may be present.

As used herein, the singular forms "a", "an", and "the" are intended to include the plural forms as well, unless the context clearly indicates otherwise.

A three-dimensional semiconductor device according to exemplary embodiments of the inventive concept may include a cell array region, a peripheral circuit region, a sense amp region, a decoding circuit region and a connection region. A plurality of memory cells and bit lines and word lines for electrical connection to the plurality of memory cells may be in the cell array region. Circuits for driving the plurality of memory cells may be in the peripheral circuit region, and circuits for reading information stored in the plurality of memory cells may be in the sense amp region. The connection region may be between the cells array region and the decoding circuit region, and a wiring structure for electrically connecting the word lines with the decoding circuit region may be between the word lines and the decoding region.

FIG. 1 is a circuit diagram of a three-dimensional semiconductor memory device according to an embodiment of the inventive concept.

Referring to FIG. 1, according to an embodiment of the inventive concept, a cell array of the three-dimensional semiconductor memory device may include common source lines CSL0, CSL1, and CSL2, bit lines BL0, BL1, and BL2, and cell strings CSTR interposed between the common source line CSL0, CSL1, and CSL2 and the bit lines BL0 to BL2.

The bit lines BL0 to BL2 may be two-dimensionally arranged and plural ones of the cell strings CSTR may be connected in parallel to each of the bit lines BL. Plural ones of the cell strings CSTR may be connected in common to a corresponding one of the common source lines CSL0 to CSL2. Plural ones of the cell strings CSTR may be disposed between the bit lines BL0 to BL2 and each of the common source lines CSL0 to CSL2. According to an embodiment, the common source lines CSL0 to CSL2 may be connected with one another in an equipotential state. According to an embodiment, the common source lines CSL0 to CSL2 may be separated from one another and may be controlled independently from one another.

Each of the cell strings CSTR may include a ground selection transistor GST coupled to a corresponding one of the common source lines CSL0 to CSL2, a string selection transistor SST coupled to a corresponding one of the bit lines BL0 to BL2, and a plurality of memory cell transistors MCT disposed between the ground selection transistor GST and the string selection transistor SST. The plurality of the memory cell transistors MCT may be connected in series between the ground selection transistor GST and the string selection transistor SST.

Sources of plural ground selection transistors GST may be connected to respective corresponding common source lines of the common source lines CSL0 to CSL2. Ground selection lines GSL0 to GSL2, word lines WL0 to WL3, and string selection lines SSL0-SSL2 may be disposed between the common source lines CSL0 to CSL2 and the bit lines BL0 to BL2, and may be connected to gate electrodes of the ground selection transistors GST, the memory cell transistors MCT, and the string selection transistors SST, respectively. According to an embodiment, each of the memory cell transistors MCT may include a data storage element.

According to an embodiment, each of the cell string CSTR may include a plurality of the memory cell transistors MCT disposed at different distances from the corresponding common source lines CSL0 to CSL2. As a consequence, there may be a multi-layered word line structure including the word lines WL0 to WL3 disposed at different levels from one another between the common source lines CSL0 to CSL2 and the bit lines BL0 to BL2.

The gate electrodes of the memory cell transistors MCT, which are disposed at the same or substantially the same level from the common source lines CSL0 to CSL2, may be connected in common to one of the word lines WL0 to WL3 such that the gate electrodes of the memory cell transistors MCT are subjected to an equipotential state. Alternatively, although the gate electrodes of the memory cell transistors MCT may be disposed at the same or substantially the same level from the common source lines CSL0 to CSL2, some gate electrodes of the memory cell transistors MCT (e.g., gate electrodes disposed in a row or column) may be electrically and spatially separated from other gate electrodes of the memory cell transistors MCT (e.g., gate electrodes disposed in other rows or columns).

Figure 2:
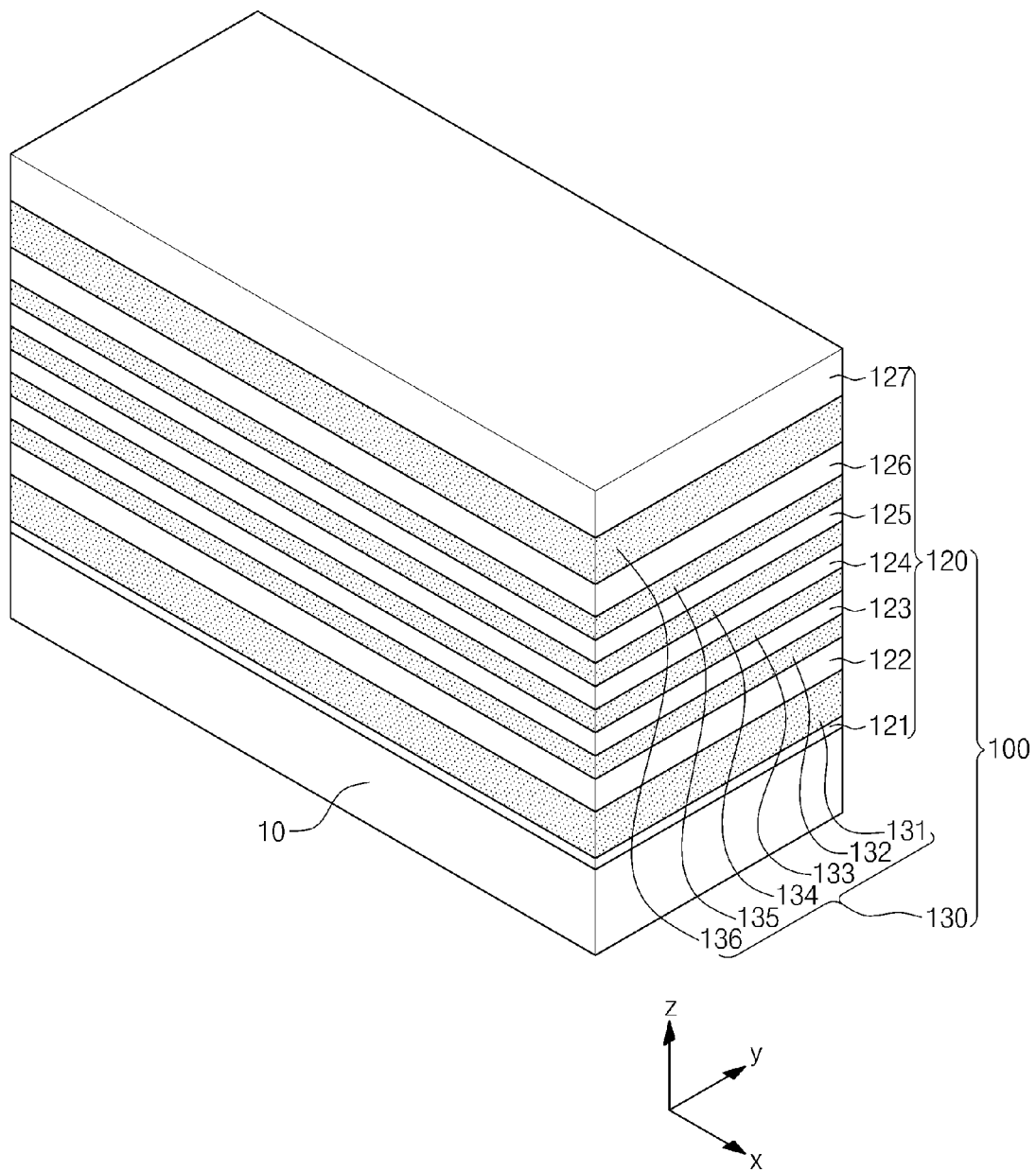
FIGS. 2 through 7, 9A, 10, and 11 are perspective views illustrating a method of fabricating a three-dimensional semiconductor memory device according to an exemplary embodiment of the inventive concept.

FIGS. 2 through 7, 9A, 10, and 11 are perspective views illustrating a method of fabricating a three-dimensional semiconductor memory device according to an exemplary embodiment of the inventive concept. FIG. 8 is a cross-sectional view taken along line I-I' of FIG. 7. FIG. 9B is an enlarged view illustrating part G of FIG. 9A;

Referring to FIG. 2, a mold structure 100 may be formed on a substrate 10. The substrate 10 may be formed of, for example, a semiconductor, an insulating material, and/or a semiconductor or conductor covered with an insulating material. For example, according to an embodiment, the substrate 10 may be a silicon wafer.

The mold structure 100 may include a sacrificial layer group 130 including sacrificial layers 131-136 and an insulating layer group 120 including insulating layers 121-127. The insulating layers 121-127 and the sacrificial layers 131-136 may be alternately and repeatedly stacked as shown in the drawings. Hereinafter, for ease of description, each of the insulating layers 121-127 of the insulating layer group 120 may also be collectively denoted as an "insulating layer 120" in the drawings, and each of the sacrificial layers 132-138 of the sacrificial layer group 130 may also be collectively denoted as a "sacrificial layer 130".

The sacrificial layers 130 and the insulating layers 120 may be formed of materials having an etch selectivity to each other. For instance, the insulating layer 120 may include a material that is etched at a slower rate than a material of the sacrificial layer 130 with respect to a sacrificial material etchant. The etch selectivity may be quantitatively expressed as a ratio of an etch rate of the sacrificial layers 130 to an etch rate of the insulating layers 120. For instance, the sacrificial layers 130 may include a material having an etch selectivity of between 1:10 and 1:200 (more specifically, 1:30 to 1:100) with respect to the insulating layers 120. According to an embodiment, the insulating layer 120 may include at least a layer formed of silicon oxide or silicon nitride, and the sacrificial mold layer 130 may include at least a layer, which may be formed of silicon, silicon oxide, silicon carbide, or silicon nitride and which may be different from a material constituting the insulating layers 120. For easy understanding, exemplary embodiments of the inventive concept in which insulating layers 120 and the sacrificial layers 130 are formed of silicon oxide and silicon nitride, respectively, will be described hereinafter.

According to an embodiment, some or all of the sacrificial layers 130 may have different thicknesses. For instance, according to an embodiment, an uppermost and lowermost sacrificial layers of the sacrificial layers 130 (for example, the sacrificial layers 136 and 131) may be thicker than the other sacrificial layers 130 (for example, the sacrificial layers 132-135) between the uppermost and lowermost sacrificial layers. According to an embodiment, some or all the insulating layers 120 may have different thicknesses. For instance, according to an embodiment, a second uppermost and second lowermost insulating layers of the insulating layers 120 (for example, the insulating layers 126 and 122) may be thicker than the other insulating layers 120 (for example, the insulating layers 123-125) between the second uppermost and second lowermost insulating layers. The lowermost insulating layer 121 may be thinner than the insulating layers 123-125. The uppermost insulating layer 127 may be thicker than the second uppermost and second lowermost insulating layers 126 and 122.

According to embodiments, thicknesses of the insulating layers 120 and the sacrificial layers 130 may be modified by those skilled in the art, and the number of layers included in the mold structure 100 may be modified by those skilled in the art.

Figure 3:
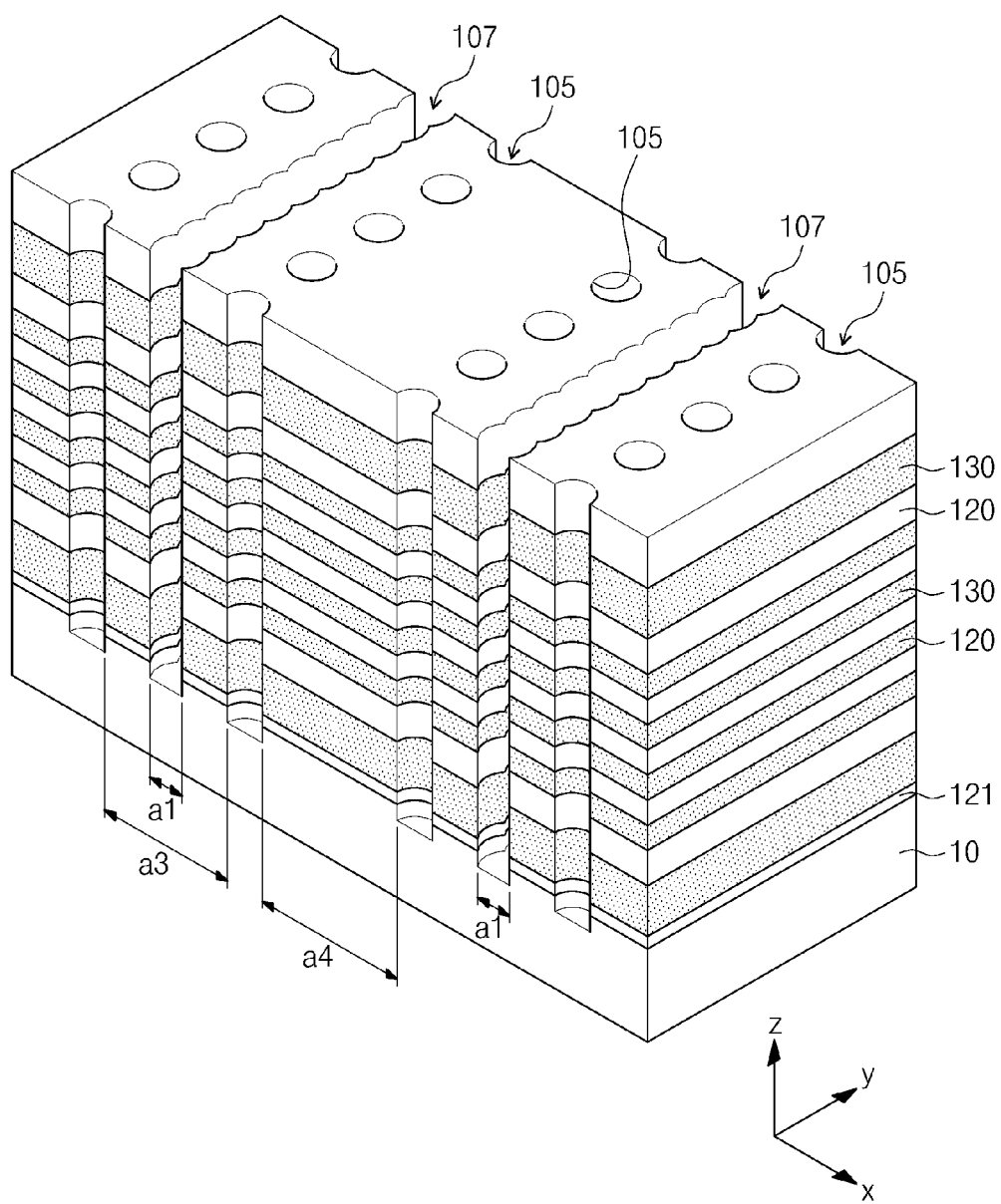

Referring to FIG. 3, channel holes 105 and first trenches 107 may be formed in the mold structure 100. The channel holes 105 may penetrate the mold structure 100. Each of the channel holes 105 may have a circular cross section. Each of the channel holes 105 may have a depth that is at least five times greater than a width of the channel hole. The channel holes 105 may be two-dimensionally arranged on a top surface (for example, an xy-plane) of the substrate 10. For example, according to an embodiment, each of the channel holes 105 may be an isolated region spaced apart from the other channel holes 105 along x and y directions.

The first trenches 107 may have an elongated shape along the y-direction. The first trenches 107 may be formed at a first side of a row of channel holes 105 arranged along the y-direction, and may not be formed at a second side of the row of channel holes 105, which is opposite to the first side with respect to the row of channel holes 105. For instance, according to an embodiment, the channel holes 105 may be arranged in a plurality of rows, and the first trenches 107 may be formed between first and second rows of the channel holes 105, but may not be formed between the second and third rows of the channel holes 105. As viewed from above the first trenches 107, for example, in the direction of −z axis, the first trenches 107 may be shaped substantially like circles partially overlapping each other along the y-direction. An x-directional width a1 of the first trench 107 may be greater than or equal to a diameter of the channel hole 105. Hereinafter, a width a1 of the first trench 107 may correspond to a shortest distance between inner sidewalls of the first trenches 107.

In the x-direction, distances between the channel holes 105 may be different from each other. For example, a distance a3 between a first pair of channel holes 105 formed at two opposite sides of a first trench 107 may be less than a distance a4 between a second pair of channel holes 105 without any intervening first trench 107 between the second pair of channel holes 105.

The channel holes 105 and the first trenches 107 may be formed using the same process. The formation of the channel holes 105 and the first trenches 107 may include forming a mask pattern defining positions of the channel holes 105 and the first trenches 107 on the mold structure 100 and anisotropically etching the mold structure 100 using the mask pattern as an etch mask. Since the mold structure 100 includes layers formed of at least two different materials, sidewalls of the channel holes 105 and the first trenches 107 may not be exactly perpendicular to the top surface of the substrate 10. For instance, according to an embodiment, each of the channel holes 105 and the first trenches 107 may have a downwardly tapered shape.

As shown in FIG. 3, the channel holes 105 and the first trenches 107 may expose the top surface of the substrate 10. During the anisotropic etching of the mold structure 100, the substrate 10 may be recessed to a predetermined depth under the channel holes 105 and the first trenches 107.

Figure 4:
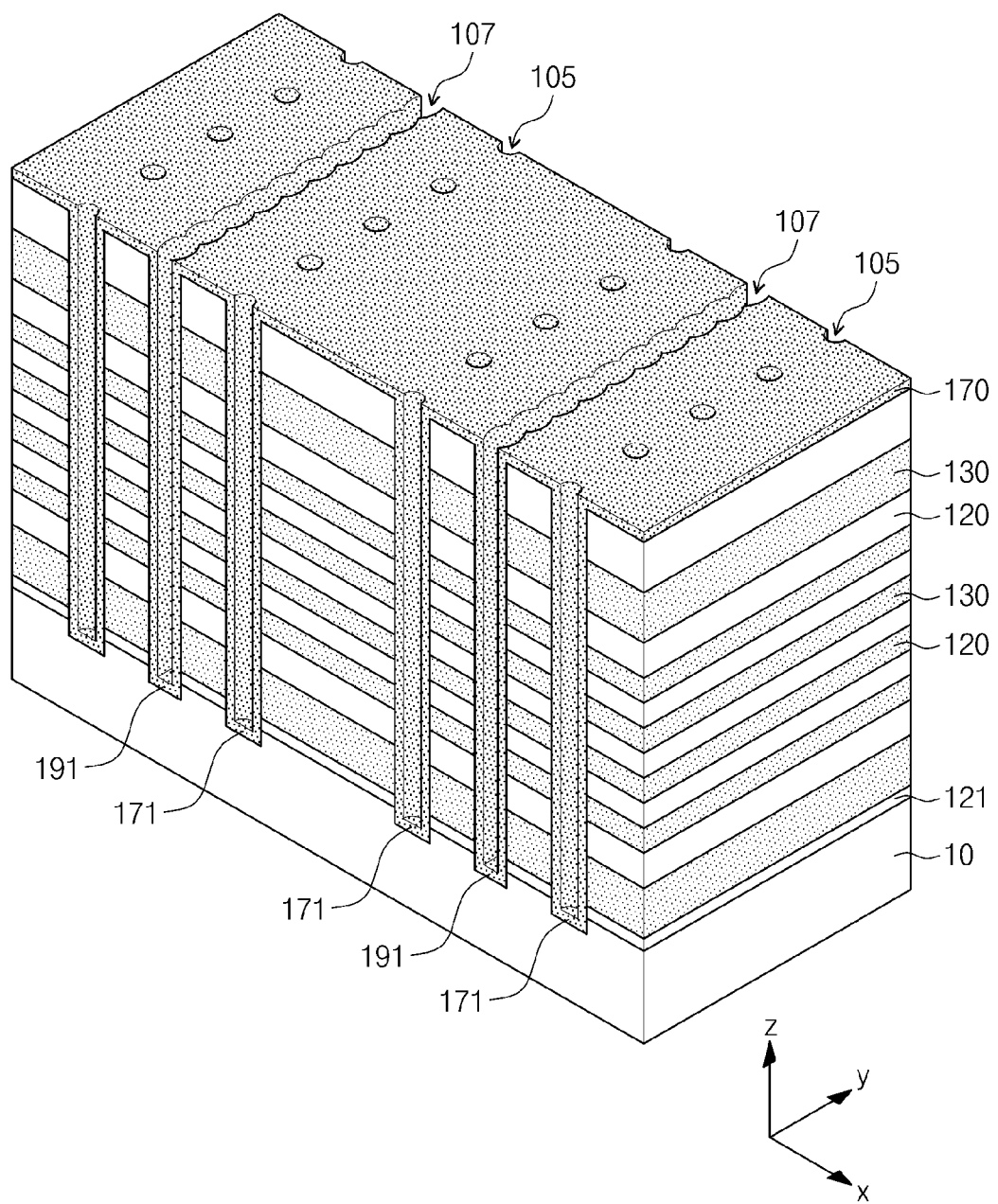

Referring to FIG. 4, a semiconductor layer 170 may cover inner walls of the channel holes 105 and the first trenches 107. Hereinafter, a portion of the semiconductor layer 170 disposed in the first trench 107 will be referred to as a separation semiconductor layer 191, and a portion of the semiconductor layer 170 disposed in the channel hole 105 will be referred to as a vertical semiconductor layer 171. According to an embodiment, the semiconductor layer 170 may be a polysilicon layer, which may be formed using an atomic layer deposition (ALD) or chemical vapor deposition (CVD) process. The semiconductor layer 170 may have a thickness ranging from about 1/50 to 1/5 of a width of the channel hole 105. According to embodiments of the inventive concept, the semiconductor layer 170 may include one of an organic semiconductor layer and a carbon nano structure. According to an embodiment, the semiconductor layer 170 may be conformally formed to have such a thickness as not to completely fill the channel holes 105 and the first trenches 107.

Figure 5:
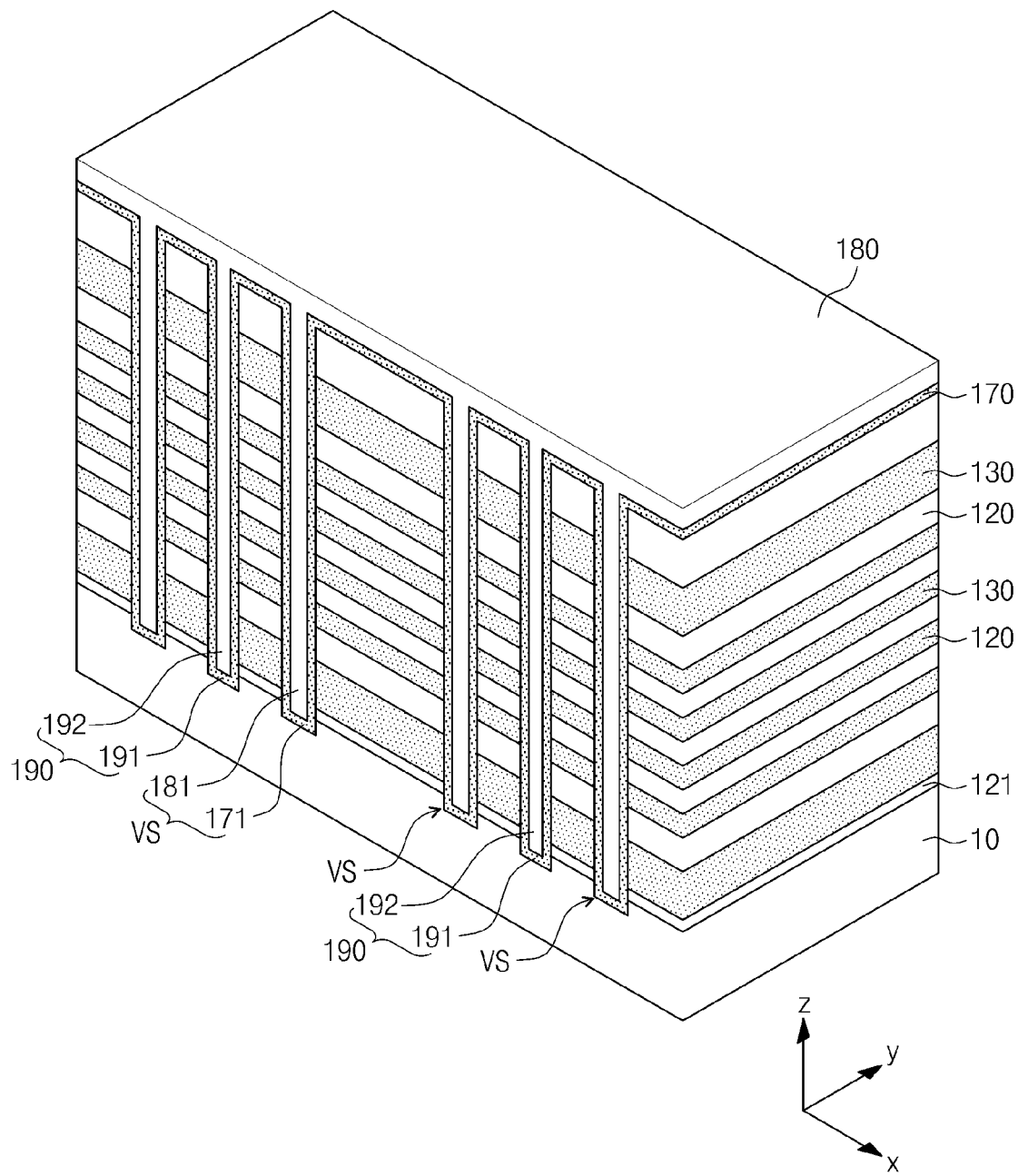

Referring to FIG. 5, a gap-fill layer 180 may be formed on the resultant structure provided with the semiconductor layer 170 to fill the channel holes 105 and the first trenches 107.

Hereinafter, a portion of the gap-fill layer 180 filling the first trench 107 will be referred to as a separation insulating layer 192, and a portion of the gap-fill layer 180 filling the channel hole 105 will be referred to as a vertical gap-fill layer 181. The vertical semiconductor layer 171 and the vertical gap-fill layer 181 may constitute a vertical structure VS, and in the first trenches 107, the separation insulating layer 192 and the separation semiconductor layer 191 may constitute separation patterns 190. The gap-fill layer 180 may be one of an insulating layer, which is formed by a silicon-on-insulator (SOG) method, and a silicon oxide layer. The separation insulating layer 192 and the vertical gap-fill layer 181 may be simultaneously formed, and as a consequence, may be formed of the same material having the same or substantially the same physical properties. Further, the separation semiconductor layer 191 and the vertical semiconductor layer 171 may be simultaneously formed, and as a consequence, may be formed of the same material having the same or substantially the same physical properties. According to an embodiment, before the formation of the gap-fill layer 180, a hydrogen annealing process may be further performed in a gas atmosphere containing hydrogen and deuterium to thermally treat the structure shown in FIG. 4, which has the semiconductor layer 170. The hydrogen annealing process may cure crystal defects that may exist in the semiconductor layer 170.

According to embodiments of the inventive concept, the semiconductor layer 170 may fill the channel holes 105 and the first trenches 107, and the formation of the gap-fill layer 180 may be omitted.

Figure 6:
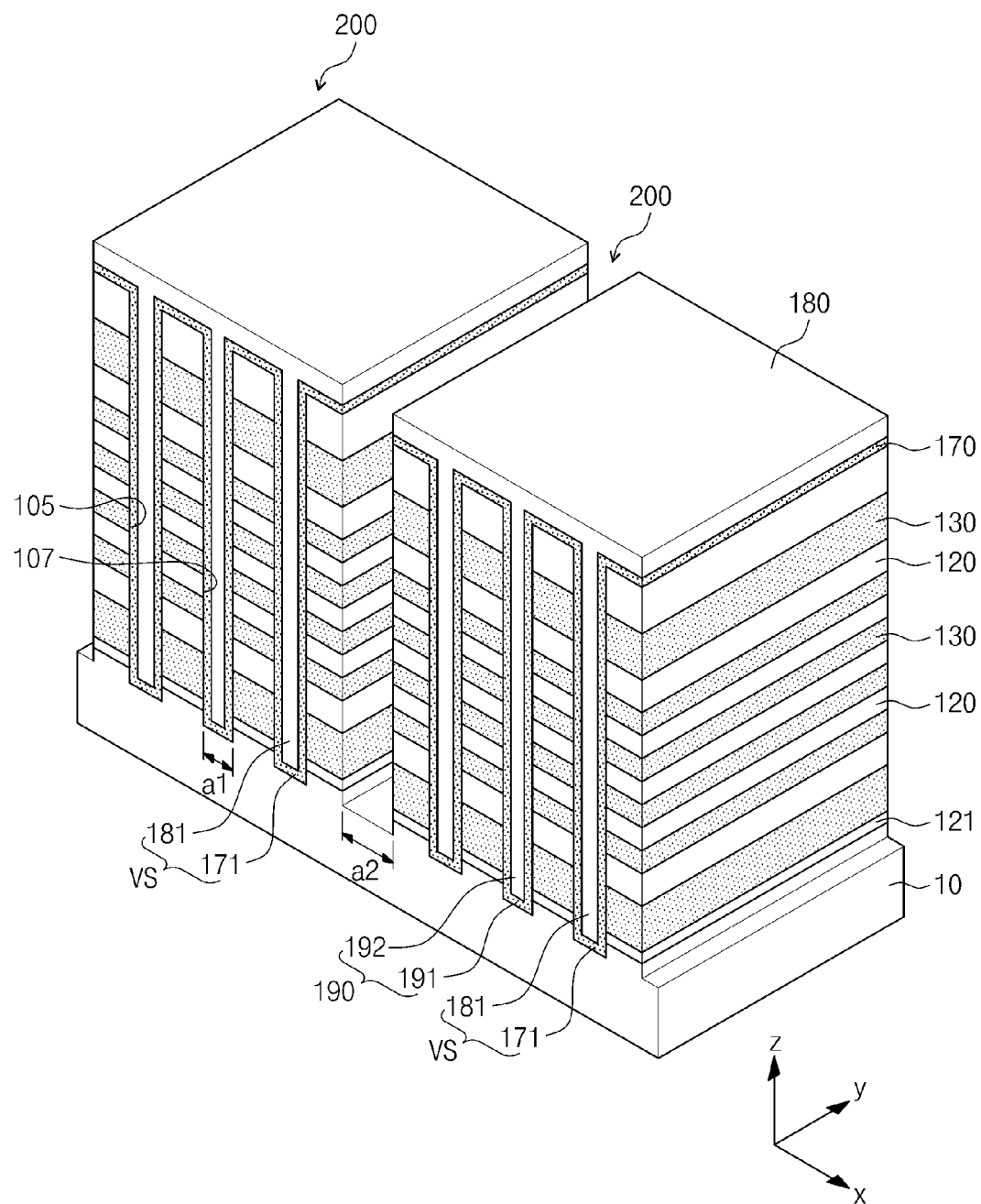

Referring to FIG. 6, second trenches 200 that expose the substrate 10 may be formed by patterning the mold structure 100. The second trench 200 may be formed at a side of a row of channel holes 105 arranged along the y-direction. For example, a row of channel holes 105 may be interposed between a first trench 107 and a second trench 200. For instance, when the channel holes 105 may be arranged in a plurality of rows, the second trenches 200 may be formed between second and third rows, but may not be formed between first and second rows. Thus, in the x-direction, the first trenches 107 and the second trenches 200 may be alternately formed between the rows of the channel holes 105.

The formation of the second trenches 200 may include forming an etch mask on an upper portion of the mold structure 100 or the gap-fill layer 180 and anisotropically etching the layers under the etch mask to expose a top surface of the substrate 10. The top surface of the substrate 10 exposed by the second trenches 200 may be recessed to a predetermined depth, as shown in the FIG. 6, during the anisotropic etching step.

The second trenches 200 may have an x-directional width a2. According to an embodiment, the width a2 may be greater than the width a1 of the first trench 107, and thus, subsequent processes for removing the sacrificial layers 130 and forming gate electrodes may be easily performed. Unlike that shown in the FIG. 6, the second trenches 200 may sometimes have a downwardly tapered shape as a result of the etching process, and thus, the second trenches 200 may be wide enough to facilitate the removal of the sacrificial layers 130 and the formation of the gate electrodes. According to embodiments of the inventive concept, the rows of the channel holes 105 may be disposed between the first and the second trenches 107 and 200 alternately formed. Since the first trenches 107 may have a smaller width (for example, width a1) than the second trench 200 as described above, an x-directional width of the mold structure 100 may be reduced.

Figure 7:
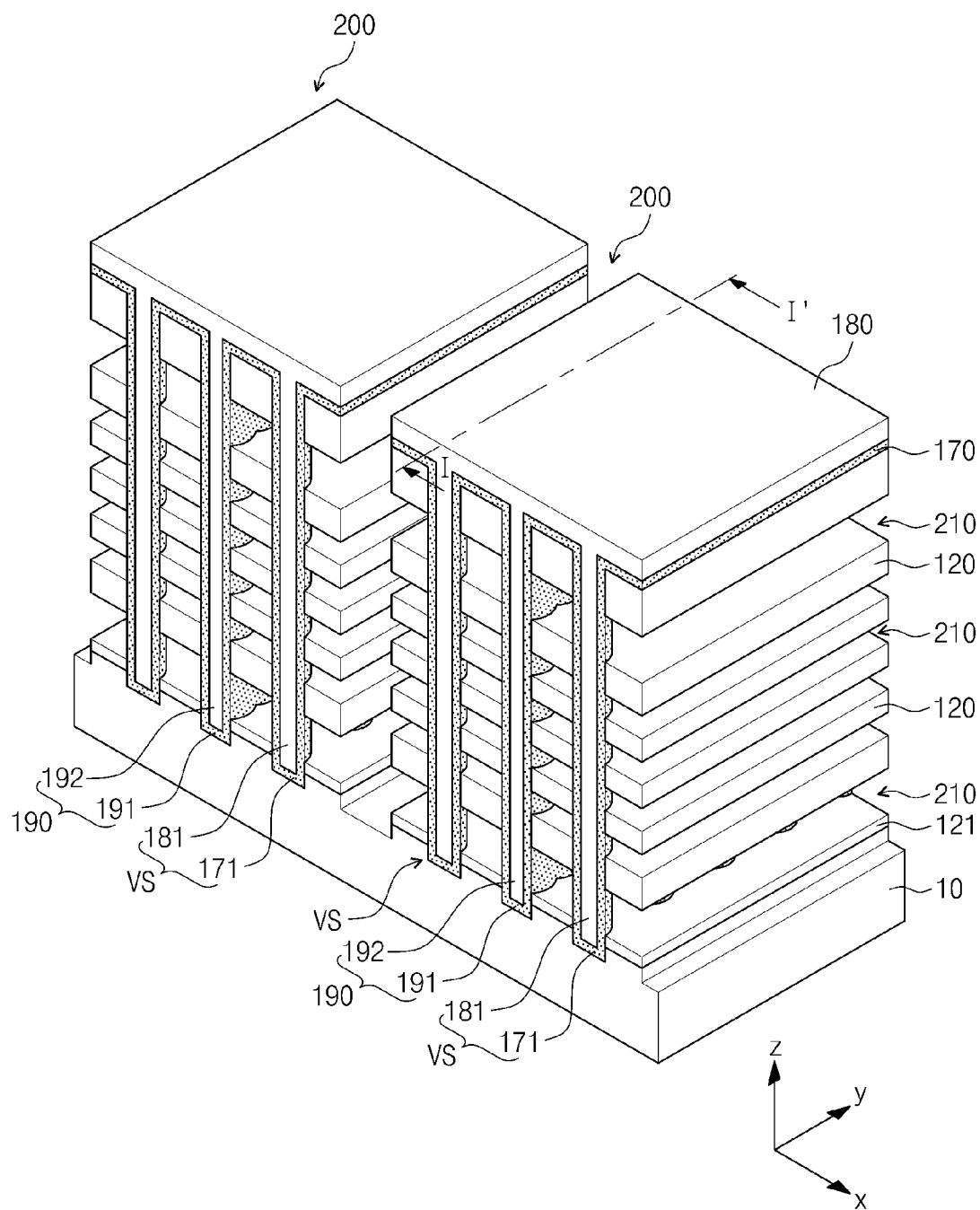
Figure 8:
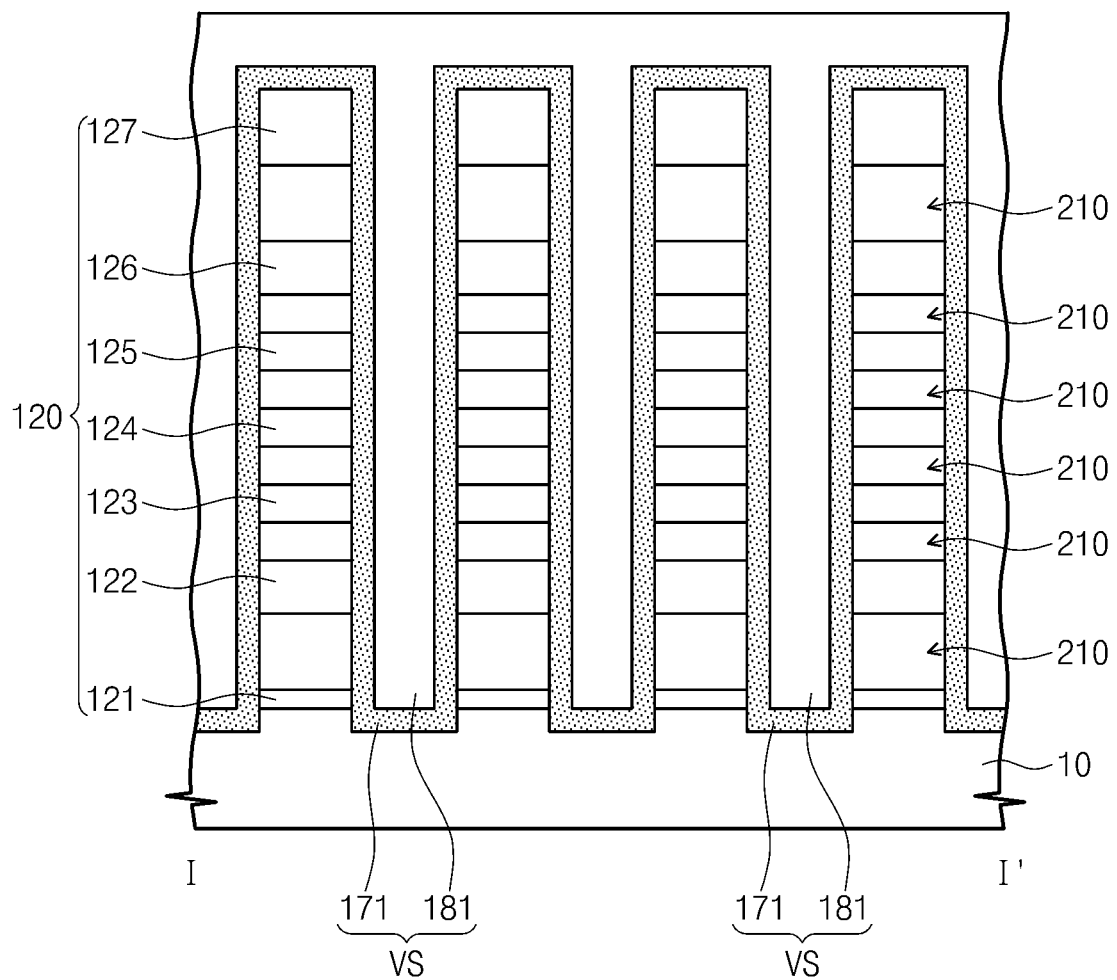
FIG. 8 is a cross-sectional view taken along line I-I' of FIG. 7.

Referring to FIGS. 7 and 8, recess regions 210 may be formed by selectively removing the sacrificial layers 130 exposed by the second trenches 200. FIG. 8 is a sectional view taken along line I-I' of FIG. 7. The recess regions 210 may be gap regions laterally extending from the second trenches 200 and may expose sidewalls of the vertical semiconductor layers 171 and the separation semiconductor layers 191. An outer boundary of the recess region 210 may be defined by the insulating layers 120 and the second trenches 200, and an inner boundary of the recess region 210 may be defined by the vertical semiconductor layer 171 and the separation semiconductor layer 191.

The formation of the recess regions 210 may include horizontally etching the sacrificial layers 130 using an etch recipe or etchant having an etch selectivity to the insulating layers 120 and the semiconductor layer 170. For instance, according to an embodiment, when the sacrificial layers 130 are formed of silicon nitride and the insulating layers 120 are formed of silicon oxide, the horizontal etching of the sacrificial layers 130 may be performed using a wet etchant containing a phosphoric acid.

Portions of the sacrificial layers 130, which are interposed between the vertical structures VS and the separation patterns 190 that are adjacent to each other, can be etched through portions of the recess regions 210 shown in FIG. 8, which are positioned between the vertical structures VS arranged along the y-direction. For example, a wet etchant can be delivered from the second trenches 200 to a sidewall of the separation pattern 190 through spaces between the vertical structures VS spaced apart from each other in the y direction. Thus, the portions of the sacrificial layers 130 interposed between the vertical structures VS and the separation patterns 190 can be removed during the formation of the recess regions 210.

Each of the separation patterns 190 may be connected to the top surface of the substrate 10 and may have an elongated shape along the y-direction. As a consequence, after the removal of the sacrificial layers 130, the separation patterns 190 and the vertical structures VS may structurally support the mold structure 100. For instance, an external force (e.g., a gravitational force) exerted on the mold structure 100 may be dispersed by the vertical structures VS and the separation patterns 190. Thus, the removal of the sacrificial layers 130 and a subsequent process of forming electrodes may be stably performed.

Figure 9A:
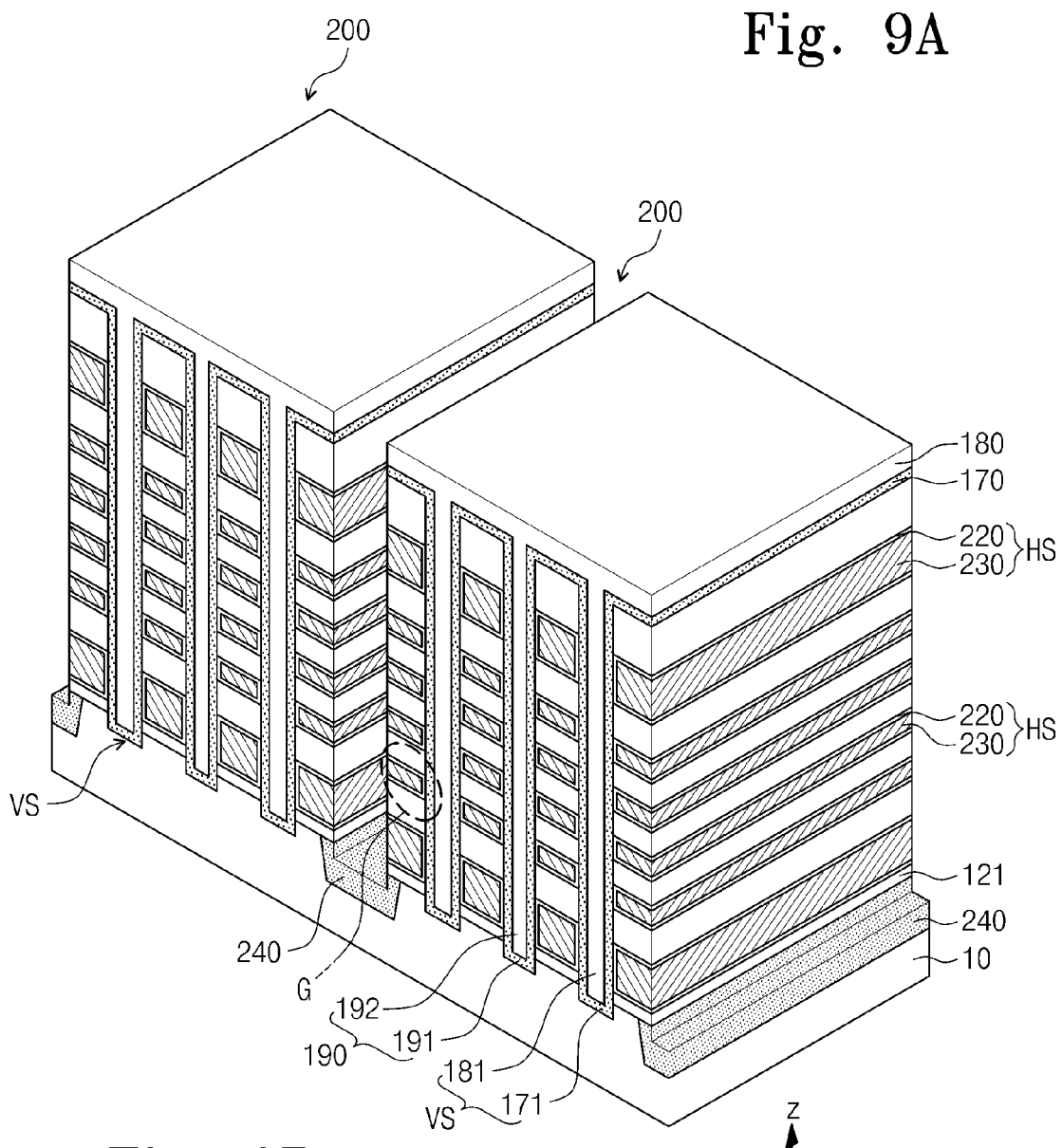
Figure 9B:
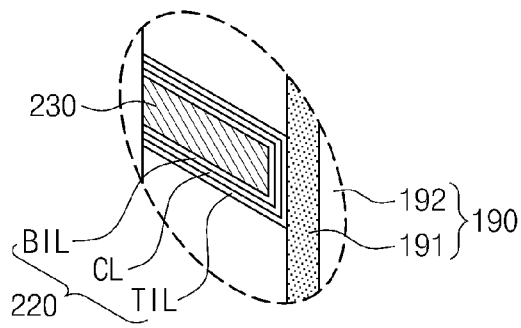
FIG. 9B is an enlarged view illustrating part G of FIG. 9A.

Referring to FIGS. 9A and 9B, horizontal structures HS may fill the recess regions 210. Each of the horizontal structures HS may include a memory layer 220 covering an inner wall of the recess region 210 and a conductive pattern 230 filling the remaining space of the recess region 210.

The formation of the horizontal structures HS may include sequentially forming the memory layer 220 and a conductive layer to fill the recess regions 210 and removing the conductive layer from the second trenches 200 to leave the conductive patterns 230 in the recess regions 210. Even in the spacing regions interposed between the vertical structures VS and the separation patterns 190, the memory layers 220 and the conductive patterns 230 may be formed through the spaces between the vertical structures VS spaced apart from each other in the y direction.

According to an embodiment, the memory layer 220 may include a plurality of insulating layers. For instance, according to an embodiment, the memory layer 220 may include a tunnel insulating layer TIL, a charge storing layer CL, and a blocking insulating layer BIL sequentially formed on inner walls of the recess region 210. The formation of the memory layer 220 may be performed using a deposition method, such as chemical vapor deposition ("CVD") or atomic layer deposition ("ALD"), which has a good step coverage property.

According to an embodiment, the charge storing layer CL may include one or more insulating layers with abundant trap sites and/or one or more insulating layers with nano particles and may be formed, for example, by CVD and/or ALD. For example, according to an embodiment, the charge storing layer CL may include one of a trap insulating layer and/or an insulating layer having a floating gate electrode and/or conductive nano dots. According to an embodiment, the charge storing layer CL may include a silicon nitride layer, a silicon oxynitride layer, a silicon-rich nitride layer, a nano crystalline silicon layer, and/or a laminated trap layer.

The tunnel insulating layer TIL may be formed of a material having a higher band gap than a band gap of the charge storing layer CL, and may be formed by a deposition process, such as CVD and/or ALD. For example, according to an embodiment, the tunnel insulating layer TIL may be a silicon oxide layer. The tunnel insulating layer TIL may undergo a thermal treatment after the deposition process. The thermal treatment process may include, for example, a rapid thermal nitridation (RTN) process and/or an annealing process in an atmosphere including nitrogen and/or oxygen.

The blocking insulating layer BIL may be a single insulating layer. Alternatively, the blocking insulating layer BIL may include first and second blocking insulating layers (not shown). The first and second blocking insulating layers may be formed of different materials, and one of the first and second blocking insulating layers may be formed of a material having a smaller band gap than a band gap of the tunnel insulating layer TIL and a larger band gap than a band gap of the charge storing layer CL. The first and second blocking insulating layers may be formed by, for example, CVD and/or ALD, and at least one of the first and second blocking insulating layers may be formed by wet oxidation. According to an embodiment, the first blocking insulating layer may be formed of a high-k dielectric layer (e.g., an aluminum oxide layer and/or a hafnium oxide layer). The second blocking insulating layer may be formed of, for example, a material having a smaller dielectric constant than a dielectric constant of the first blocking insulating layer. According to an embodiment, the second blocking insulating layer may be a high-k dielectric layer and the first blocking insulating layer may be formed of a material having a smaller dielectric constant than a dielectric constant of the second blocking insulating layer.

The conductive layer may fill the recess regions 210 covered with the memory layer 220. The second trenches 200 may be fully or partially filled with the conductive layer. The conductive layer may include at least a layer formed of doped silicon, metal, metal nitride, and/or metal silicide. For example, according to an embodiment, the conductive layer may include a tantalum nitride layer and/or a tungsten layer. According to an embodiment, the conductive layer may conformally cover the inner walls of the second trench 200 without fully filling the second trenches 200, and the conductive pattern 230 may be formed by removing the conductive layer from the second trench 200 using, for example, an isotropic etching method. According to an embodiment, the conductive layer may fill the second trench 200, and the conductive pattern 230 may be formed by removing the conductive layer from the second trench 200 using, for example, an anisotropic etching method. According to an exemplary embodiment of the inventive concept, when the semiconductor device is a FLASH memory, the conductive patterns 230 may have different functions. For instance, the lowermost conductive pattern of the conductive patterns 230 depicted in FIGS. 9A and 9B may function as a gate electrode of a lower selection transistor, and the uppermost conductive pattern of the conductive patterns 230 may function as a gate electrode of an upper selection transistor. The remaining conductive patterns of the conductive patterns 230 may function as gate electrodes of memory cell transistors.

According to an exemplary embodiment of the inventive concept, when the semiconductor device is a FLASH memory, third doped regions 240 may be formed in the substrate 10 after the forming of the conductive patterns 230. The third doped regions 240 may be formed using an ion implantation process in the substrate 10 exposed by the second trenches 200. According to an embodiment, the third doped regions 240 may have a different conductivity type than a conductivity type of the substrate 10.

According to an embodiment, the third doped regions 240 may be connected to each other and may be in an equipotential state. According to an embodiment, the third doped regions 240 may be electrically separated from each other and have different electric potentials from each other. According to an embodiment, the third doped regions 240 may form a plurality of source groups, each of which includes a plurality of spatially separated third doped regions. The source groups may be electrically separated from each other and may have different electric potentials.

Figure 10:
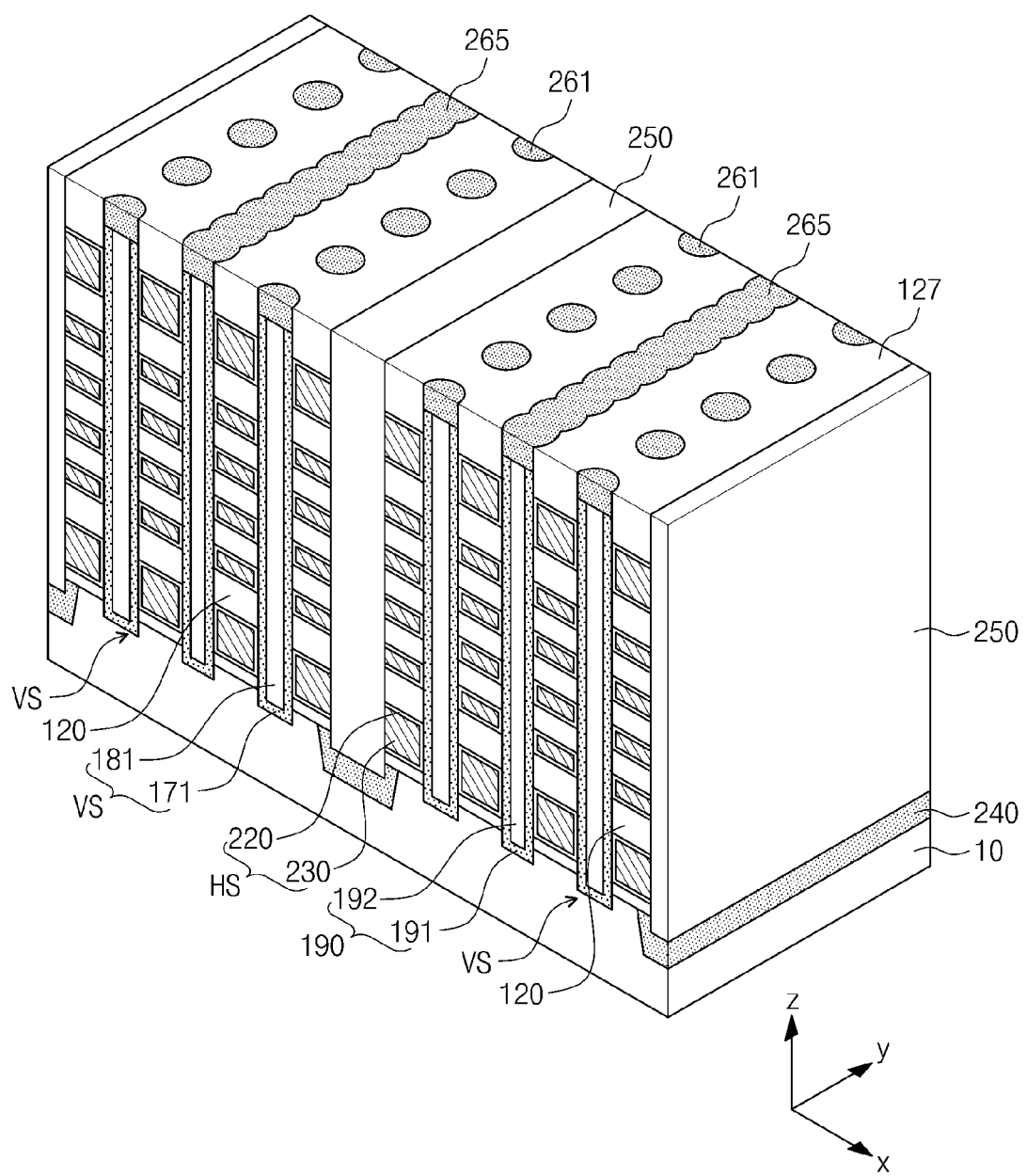

Referring to FIG. 10, gap-fill insulating patterns 250 may fill the second trenches 200. The formation of the gap-fill insulating pattern 250 may include forming a gap-fill insulating layer on the resultant structure provided with the third doped regions 240, for example, the structure shown in FIGS. 9A and 9B, and etching the gap-fill insulating layer to expose a top surface of the uppermost insulating layer 127. The gap-fill insulating layer may be formed of, for example, at least one of a silicon oxide layer, a silicon nitride layer, and a silicon oxynitride layer. The etching of the gap-fill insulating layer may be performed using a planarization technique, for example, a chemical-mechanical polishing technique and/or an etch-back technique. Thus of the etching of the gap-fill insulating layer, the vertical structures VS and the separation patterns 190 may be separated from each other. According to an embodiment, fourth doped regions 261 and first doped regions 265 may be formed on the vertical structures VS and the separation patterns 190, respectively. The formation of the fourth and first doped regions 261 and 265 may include partially etching top surfaces of the vertical structures VS and the separation patterns 190 exposed by the planarization of the gap-fill insulating layer, and then filling spaces formed by the partial etching process with a semiconductor layer. According to an embodiment, the fourth and first doped regions 261 and 265 may have the same conductivity type. For instance, according to an embodiment, the fourth and first doped regions 261 and 265 may have a different conductivity type from a conductivity type of the substrate 10. According to an embodiment, the fourth and first doped regions 261 and 265 may have different conductivity types from each other. For instance, according to an embodiment, the fourth doped regions 261 may have a different conductivity type from a conductivity type of the substrate 10, and the first doped regions 265 may have the same or substantially the same conductivity type as the conductivity type of the substrate 10. According to an exemplary embodiment of the inventive concept, the fourth and first doped regions 261 and 265 may have the same or substantially the same sectional shapes as the vertical structure VS and the separation pattern 190, respectively.

Figure 11:
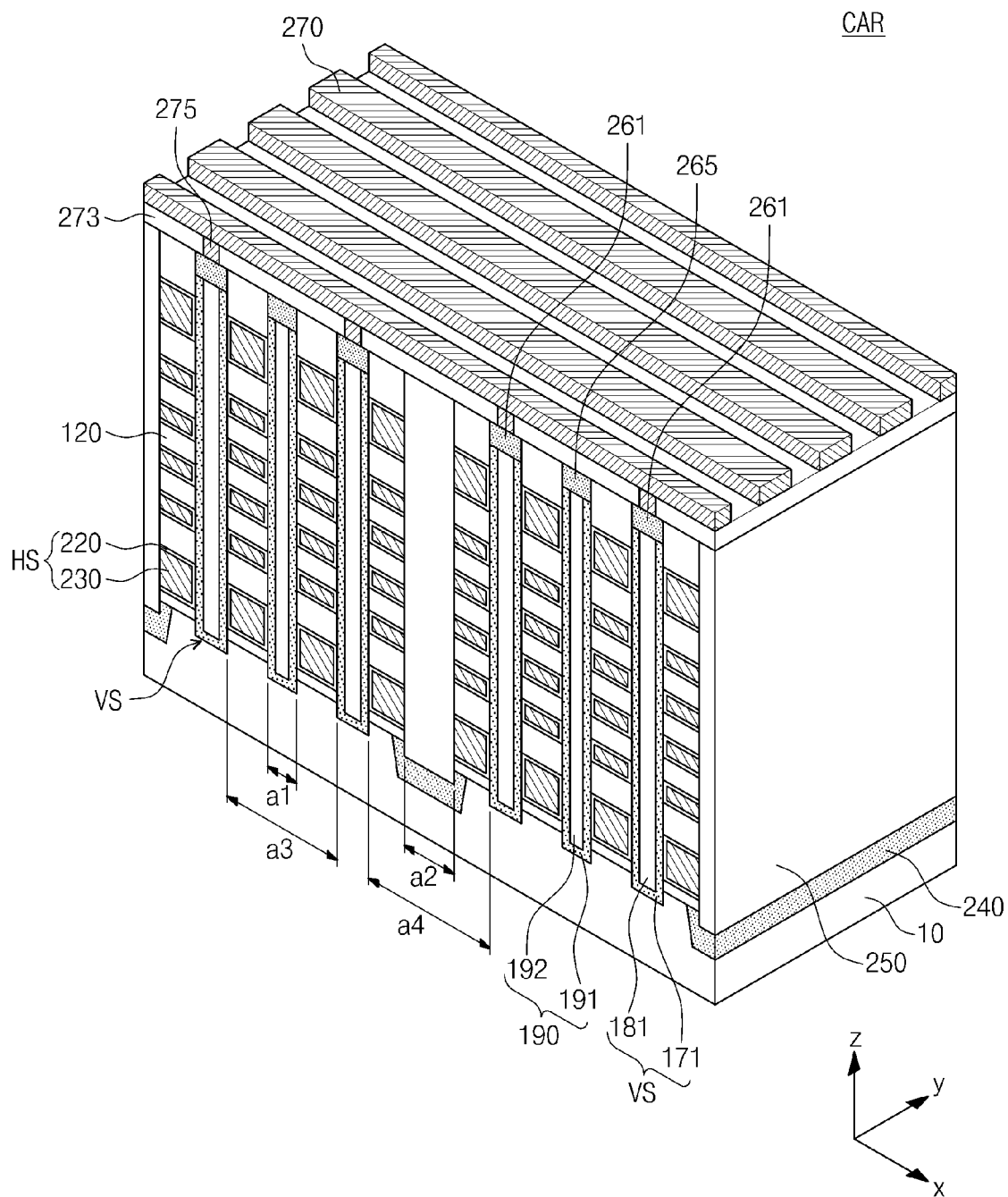

Referring to FIG. 11, upper plugs 275 may be formed on the vertical structures VS, respectively, and upper lines 270 may be formed on the upper plugs 275 to connect the upper plugs 275 with each other. The formation of the upper plugs 275 may include forming an interlayer dielectric layer 273 on the resultant structure having the fourth and first doped regions 261 and 265, for example, the structure shown in FIG. 10, and forming a conductive layer. The interlayer dielectric layer 273 may have openings exposing the fourth and first doped regions 261 and 265, and the conductive layer may fill the openings of the interlayer dielectric layer 273. According to an embodiment, the upper plugs 275 may be formed of a doped silicon layer or a metallic layer. Each of the upper lines 270 may be electrically connected to the vertical semiconductor layer 171 via the upper plug 275 and may cross the horizontal structures HS. According to an exemplary embodiment, when the semiconductor device is a NAND FLASH memory, the upper lines 270 may be electrically coupled to a plurality of cell strings and may function as bit lines.

Referring to FIGS. 10 and 11, as described above, the cell array region of the three-dimensional semiconductor device may include the gap-fill insulating patterns 250 extending from the substrate 10. The three-dimensional semiconductor devices may further include electrode structures that include the conductive patterns 230 and the insulating layers 120 alternately stacked on the substrate 10. The electrode structures may be defined by sidewalls of the gap-fill insulating patterns 250.

The vertical structures VS may be provided to penetrate the electrode structures. The vertical structures VS each may include the vertical semiconductor layer 171 and the vertical gap-fill layer 181 surrounded by the vertical semiconductor layer 171. The vertical structures VS may include first and second rows of vertical structures, each of which may include a plurality of the vertical structures VS arranged along the y-direction, between two adjacent gap-fill insulating patterns of the gap-fill insulating patterns 250. The first and second rows of vertical structures may be spaced apart from each other in the x-direction. The memory layers 220 may be provided between the vertical structures VS and the conductive patterns 230.

A separation pattern 190 may be provided between the first and second rows of vertical structures. The separation pattern 190 may include the separation semiconductor layer 191 and the separation insulating layer 192 surrounded by the separation semiconductor layer 191, and may extend in the y-direction along the first and second rows of vertical structures. The vertical semiconductor layer 171 and the separation semiconductor layer 191 may be formed using the same process as described above. Thus, the vertical semiconductor layer 171 and the separation semiconductor layer 191 may be formed of the same semiconductor material having the same or substantially the same impurity concentration and/or the same or substantially the same physical properties. As viewed from above, for example, as viewed in a direction opposite to the z direction, the separation pattern 190 may be shaped substantially like circles partially overlapping each other along the y-direction, but the exemplary embodiments are not limited thereto.

The gap-fill insulating pattern 250 may have a width a2, which may be selected in consideration of the formation of the conductive patterns 230. As described with reference to FIGS. 7 through 9, the width a2 of the second trench 200 or the gap-fill insulating pattern 250 filling the second trench 200 may be adapted to be sufficient to facilitate the removal of the sacrificial layers 130 and the formation of the conductive patterns 230. According to an exemplary embodiment of the inventive concept, the gap-fill insulating patterns 250 may be formed at a first side of a y-directional row of the vertical structures, but not at a second side opposite to the first side. At the second side of the y-directional row of the vertical structures, the separation pattern 190 having the width a1 may be provided, where the width a1 may be less than the width a2 of the gap-fill insulating pattern 250. For example, the gap-fill insulating patterns 250 and the separation patterns 190 may be alternately arranged in the x-direction, with a row of vertical structures VS between a gap-fill insulating pattern 250 and a separation pattern 190. Thus, the three-dimensional semiconductor device can have a reduced x-directional width, thus resulting in an increase in integration density. The conductive patterns 230 may be electrically separated from the separation patterns 190 by the memory layer 220.

According to an embodiment, some of distances in the x direction between the vertical structures VS may be different from each other. For instance, according to an embodiment, a distance a3 between a pair of the vertical structures VS provided at two opposite sides of the separation pattern 190 may be smaller than a distance a4 between a pair of the vertical structures VS provided at two opposite sides of the gap-fill insulating pattern 250. For example, x-directional distances between the vertical structures VS may include the distances a3 and a4 that alternately occur since the width a1 of the separation pattern 190 is smaller than the width a2 of the gap-fill insulating pattern 250. Thus, the three-dimensional semiconductor device can be fabricated to have a reduced x-directional width, and consequently, to have an increased integration density. Furthermore, since the separation patterns 190 may structurally support the mold structure 100, the removal of the sacrificial layers 130 and the formation of the conductive patterns 230 may be stably performed, compared with the absence of the separation pattern 190.

FIGS. 12 through 20 are perspective views illustrating a method of fabricating a cell array region of a three-dimensional semiconductor device according to an embodiment of the inventive concept.

Figure 12:
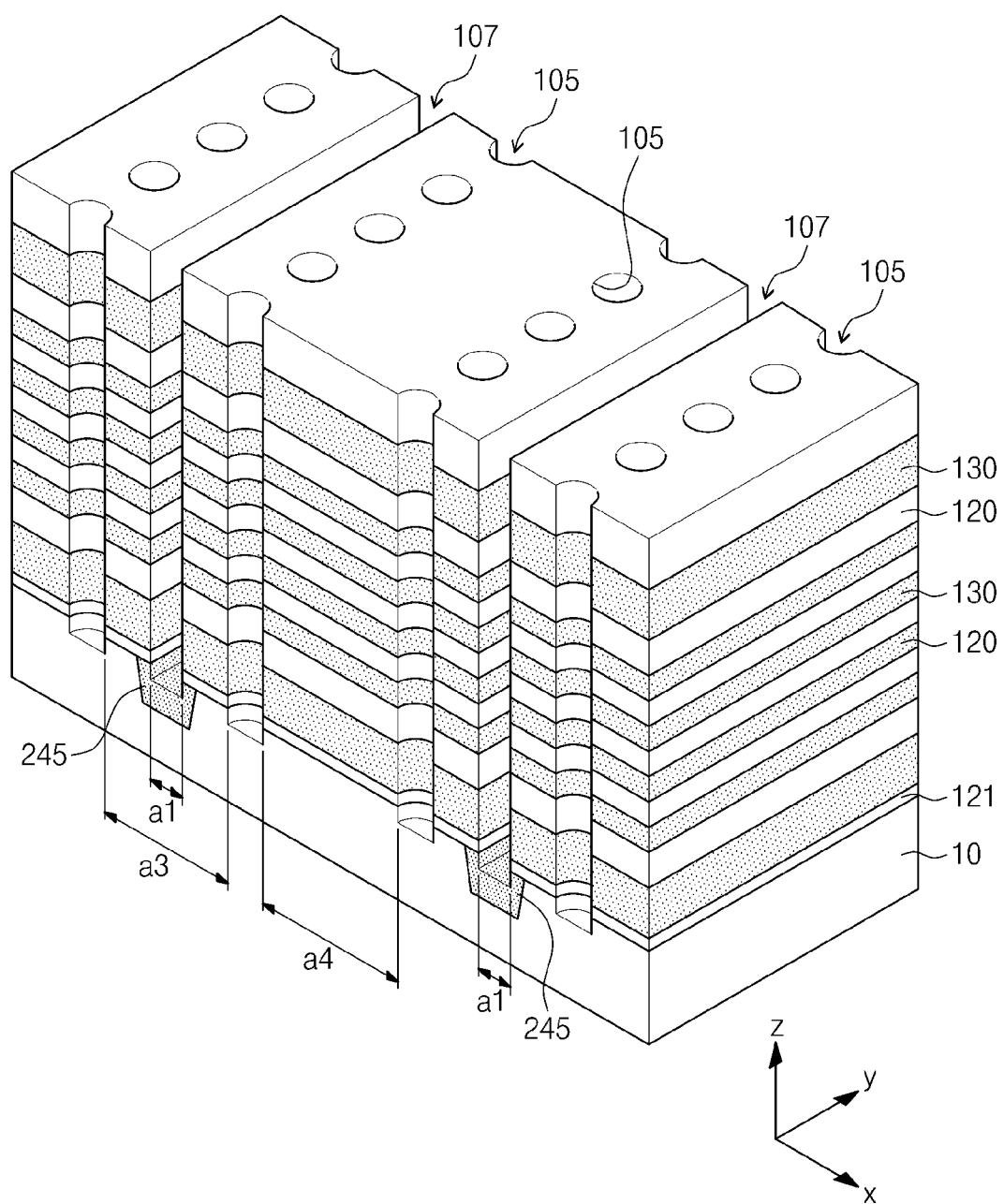
FIGS. 12 through 20 are perspective views illustrating a method of fabricating a three-dimensional semiconductor memory device according to an embodiment of the inventive concept.

Referring to FIG. 12, channel holes 105 and first trenches 107 may be formed in the mold structure 100 described with reference to FIG. 2. The channel holes 105 may penetrate the mold structure 100. The first trenches 107 may extend along the y-direction. The first trenches 107 may be formed at a first side of a row of the channel holes 105 arranged along the y-direction, and may not be formed at a second side of the row of channel holes 105, which is opposite to the first side with respect to the row of channel holes 105. For example, according to an embodiment, when the channel holes 105 may be arranged in a plurality of rows including first, second, and third rows, the first trench 107 may be formed between the first and second rows, but not between the second and third rows. As viewed from above the first trenches 107, each of the first trenches 107 may have an elongated stripe shape along the y-direction. An x-directional width a1 of the first trench 107 may be greater than or equal to a diameter of the channel hole 105.

X-directional distances between the channel holes 105 may be different from each other. For example, according to an embodiment, a distance a3 between a first pair of the channel holes 105 formed at two opposite sides of the first trench 107 may be less than a distance a4 between a second pair of the channel holes 105 without any intervening first trench 107 between the second pair of the channel holes 105. According to an embodiment, the channel holes 105 and the first trenches 107 may be formed using the same process. For example, according to an embodiment, the channel holes 105 and the first trenches 107 may be formed simultaneously.

Second doped regions 245 may be formed in portions of the substrate 10 exposed by the first trenches 107. The formation of the second doped regions 245 may include forming a mask layer that fills the channel holes 105 and exposes the first trenches 107 and then performing an ion implantation process. Alternatively, when the second doped regions 245 may have substantially the same conductivity type as the substrate 10, the second doped regions 245 may be also formed in portions of the substrate 10 exposed by the channel holes 105. Features of the second doped region 245, such as conductivity type and function, will be described in further detail below, in conjunction with a first doped region.

Figure 13:
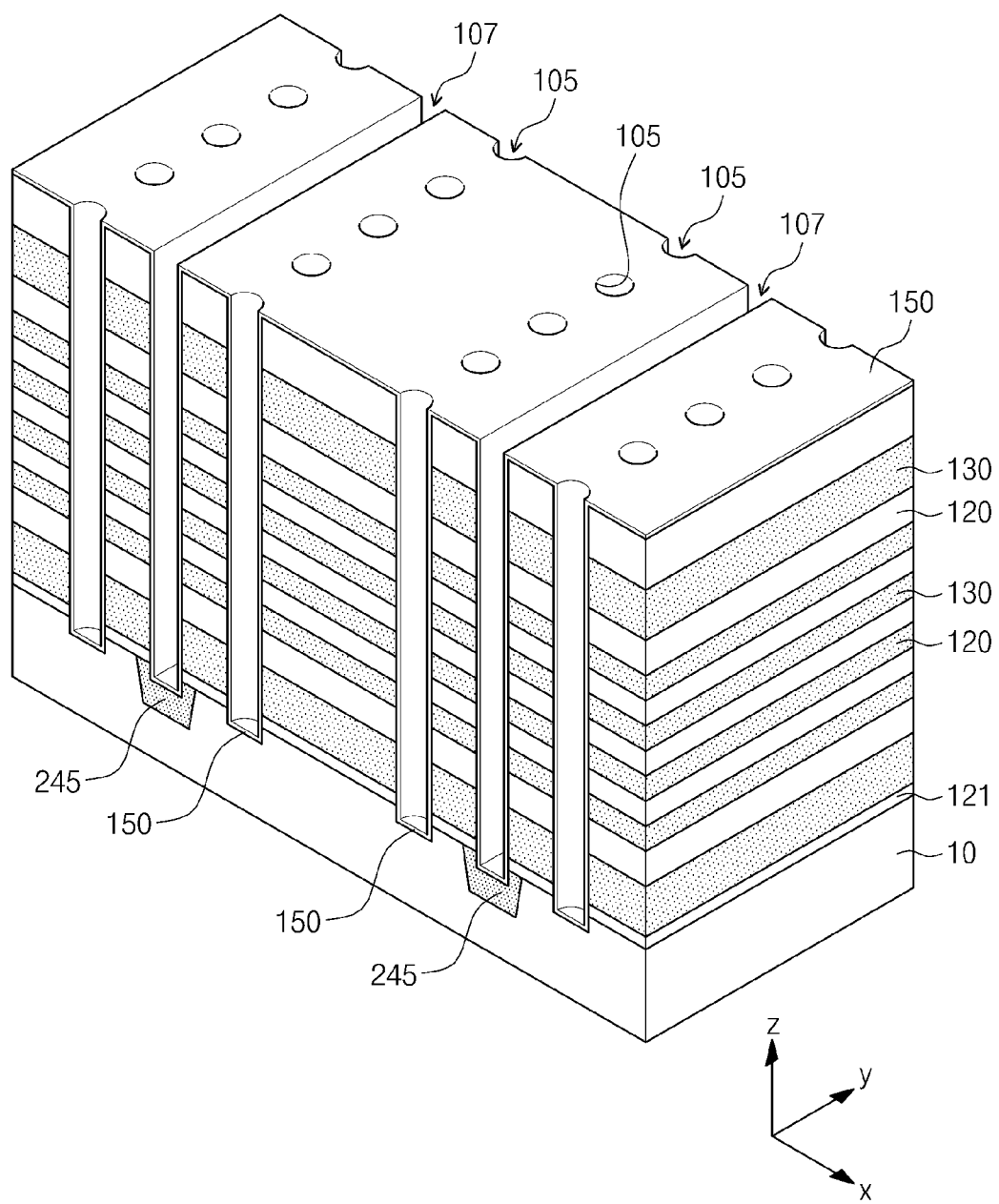

Referring to FIG. 13, a vertical layer 150 may be formed on the resultant structure provided with the first trenches 107, for example, the structure shown in FIGS. 9A and 9B. The vertical layer 150 may be formed on sidewalls and bottom surfaces of the channel holes 105 and the first trenches 107. According to an embodiment, the vertical layer 150 may include one or more layers. For example, according to an embodiment, the vertical layer 150 may include at least one layer used as a memory element of a charge-trap-type nonvolatile memory transistor. Exemplary embodiments of the inventive concept may be diversely classified according to the type of the vertical layer 150. These classified embodiments will be described in further detail with reference to FIGS. 21 through 28.

Figure 14:
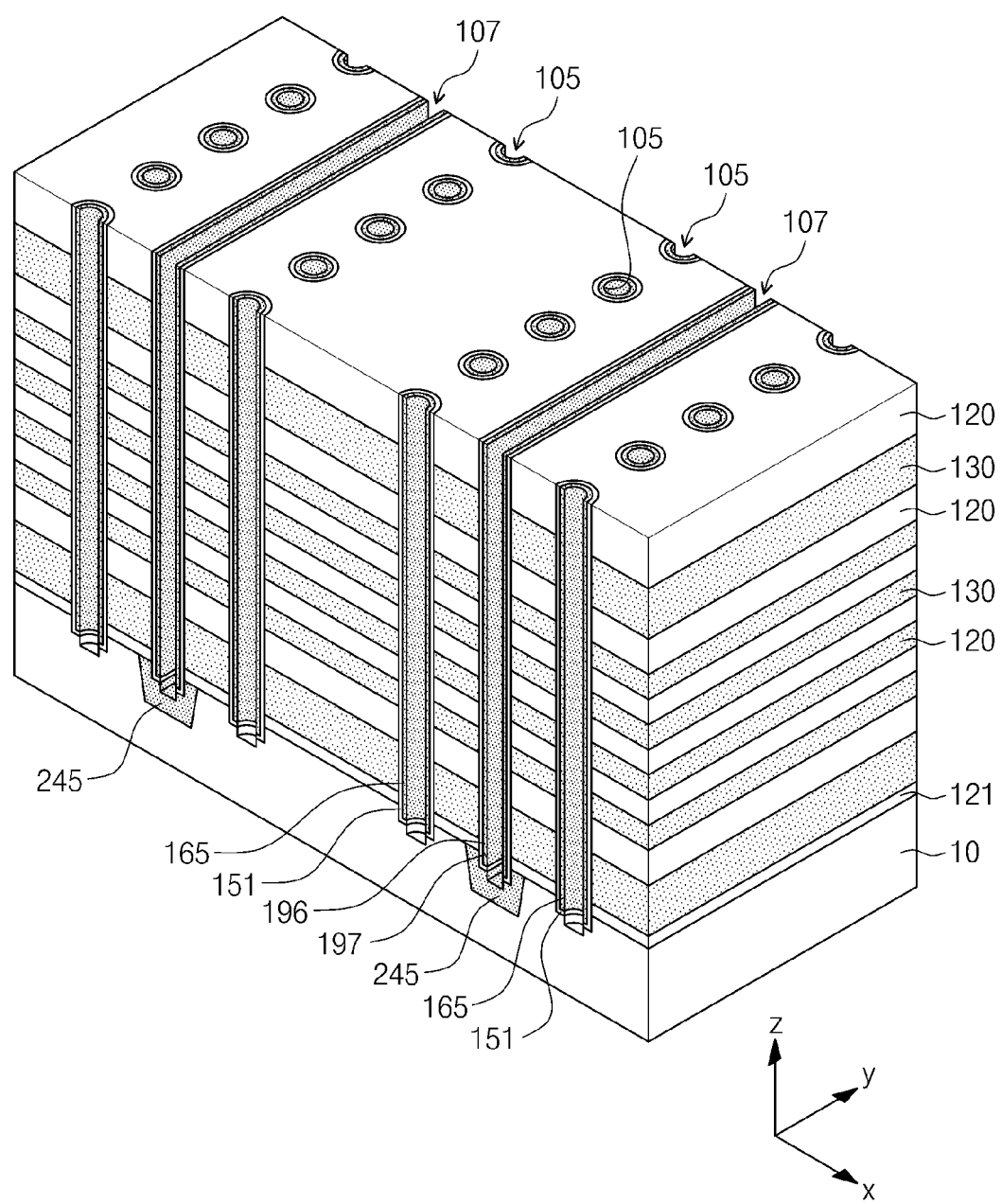

Referring to FIG. 14, a vertical pattern 151 and a spacer 165 may be formed on each of inner walls of the channel holes 105, and a vertical separation pattern 196 and a spacer separation pattern 197 may be formed on each of inner walls of the first trenches 107. The process of forming the vertical pattern 151, the spacer 165, the vertical separation pattern 196, and the spacer separation pattern 197 may include forming a first semiconductor layer to conformally cover the structure shown in FIG. 13 and anisotropically etching the first semiconductor layer and the vertical layer 150 to expose the top surface of the substrate 10 at the bottoms of the channel holes 105 and the first trenches 107. Thus, the vertical pattern 151 and the spacer 165 may be formed in each of the channel holes 105, and the vertical separation pattern 196 and the spacer separation pattern 197 may be formed in each of the first trenches 107. The top surface of the substrate 10 exposed in the channel holes 105 and the first trenches 107 may be recessed by over-etching during the anisotropic etching of the first semiconductor layer and the vertical layer 150.

A top surface of the mold structure 100 may be exposed by the anisotropic etching of the first semiconductor layer and the vertical layer 150. Thus, each of the vertical patterns 151 and each of the spacers 165 may be localized in the channel hole 105, and each of the vertical separation patterns 196 and each of the spacer separation patterns 197 may be localized in the first trench 107.

Figure 15:
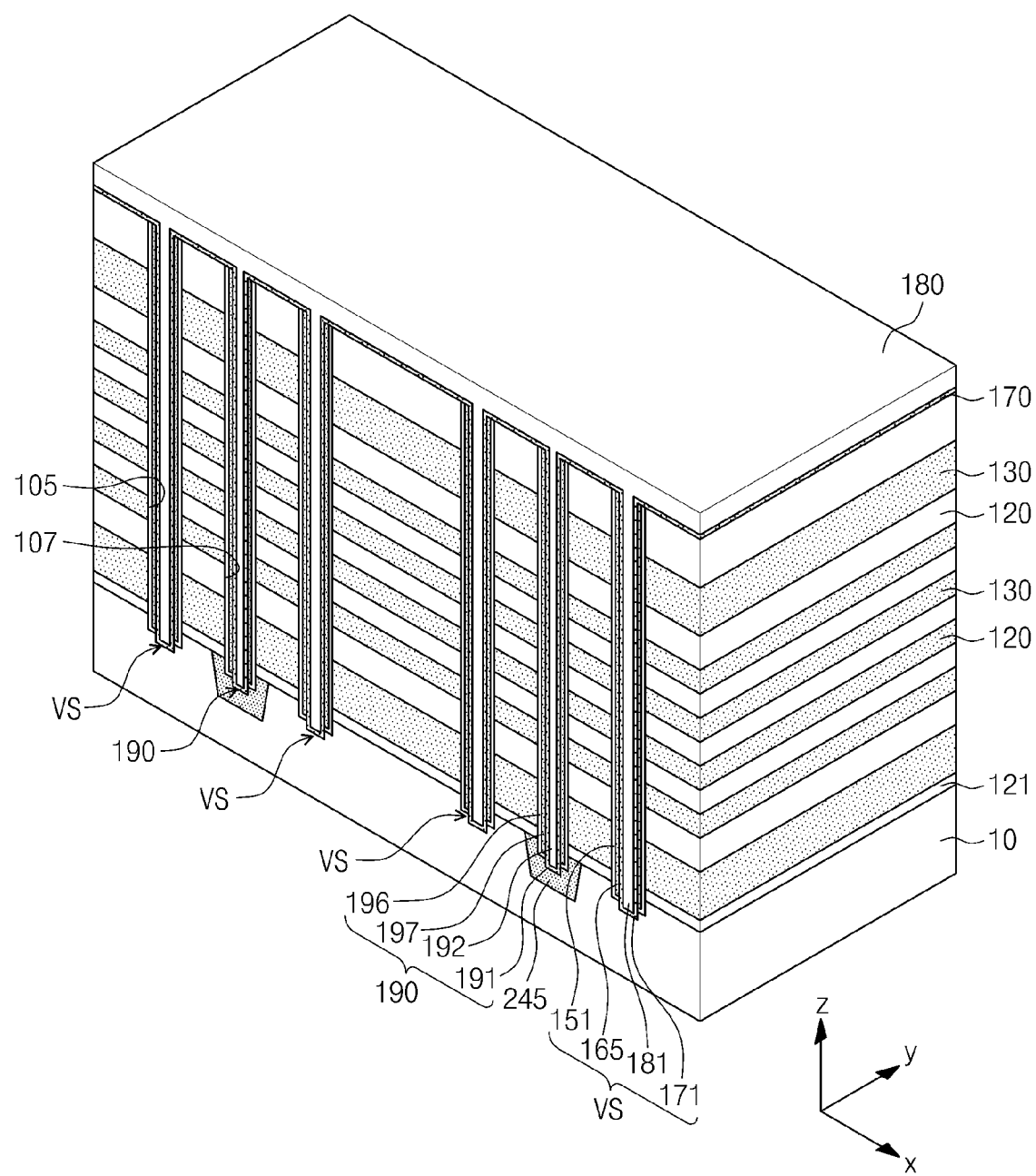

Referring to FIG. 15, a semiconductor layer 170 and a gap-fill layer 180 may be sequentially formed on the resultant structure described with reference to FIG. 14. The semiconductor layer 170 may include a separation semiconductor layer 191 formed in the first trench 107 and a vertical semiconductor layer 171 formed in the channel hole 105. The semiconductor layer 170 may be a polysilicon layer, which may be formed using ALD or CVD. According to an embodiment, the semiconductor layer 170 may be conformally formed to have such a thickness as not to completely fill the channel holes 105 and the first trenches 107. The gap-fill layer 180 may completely fill the remaining spaces of the channel holes 105 and the first trenches 107. The gap-fill layer 180 may include a separation insulating layer 192 filling the first trench 107 and a vertical gap-fill layer 181 filling the channel hole 105. The vertical pattern 151, the spacer 165, the vertical semiconductor layer 171, and the vertical gap-fill layer 181 may constitute a vertical structure VS. The vertical separation pattern 196, the spacer separation pattern 197, the separation semiconductor layer 191, and the separation insulating layer 192 may constitute a separation pattern 190 in the first trench 107.

Figure 16:
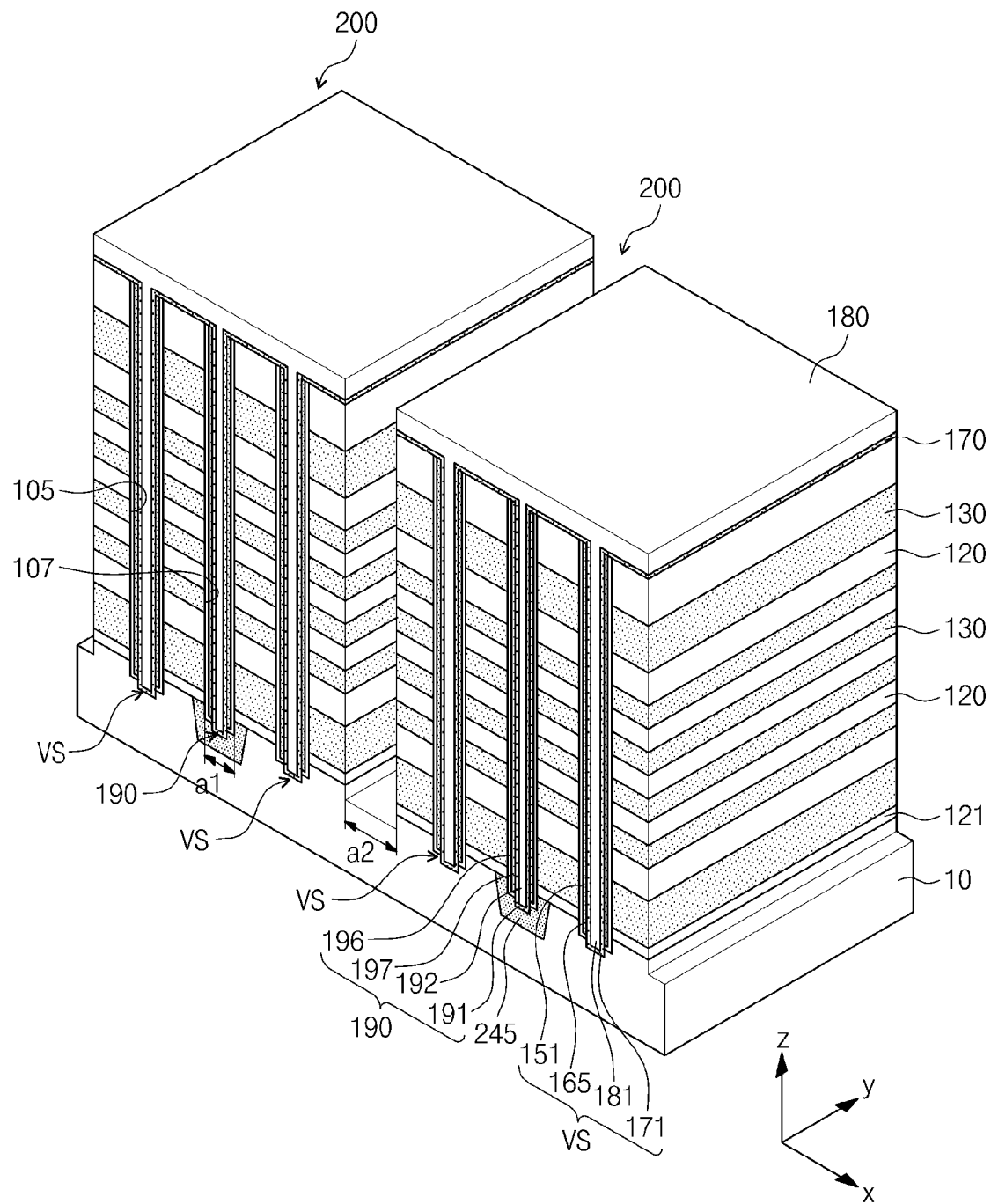

Referring to FIG. 16, second trenches 200 that expose the substrate 10 may be formed by patterning the mold structure 100. The second trench 200 may be formed at a side of a row of channel holes 105 arranged along the y-direction. For example, a row of channel holes 105 may be interposed between a first trench 107 and a second trench 200. For instance, when the channel holes 105 may be arranged in a plurality of rows including first, second, and third rows, the second trench 200 may be formed between the second and third rows, but may not be formed between the first and second rows. Thus, in the x-direction, the first trenches 107 and the second trenches 200 may be alternately formed with a row of the channel holes 105 between neighboring first trench 107 and second trench 200.

An x-directional width a2 of the second trench 200 may be greater than the x-directional width a1 of the first trench 107. According to an embodiment of the inventive concept, each of the rows of the channel holes 105 may be disposed between the first and second trenches 107 and 200 that are adjacent to each other. Since the first trench 107 may have a smaller width (for example, a1) than a width of the second trench 200 (for example, a2) as described above, the mold structure 100 may have a reduced x-directional width.

Figure 17:
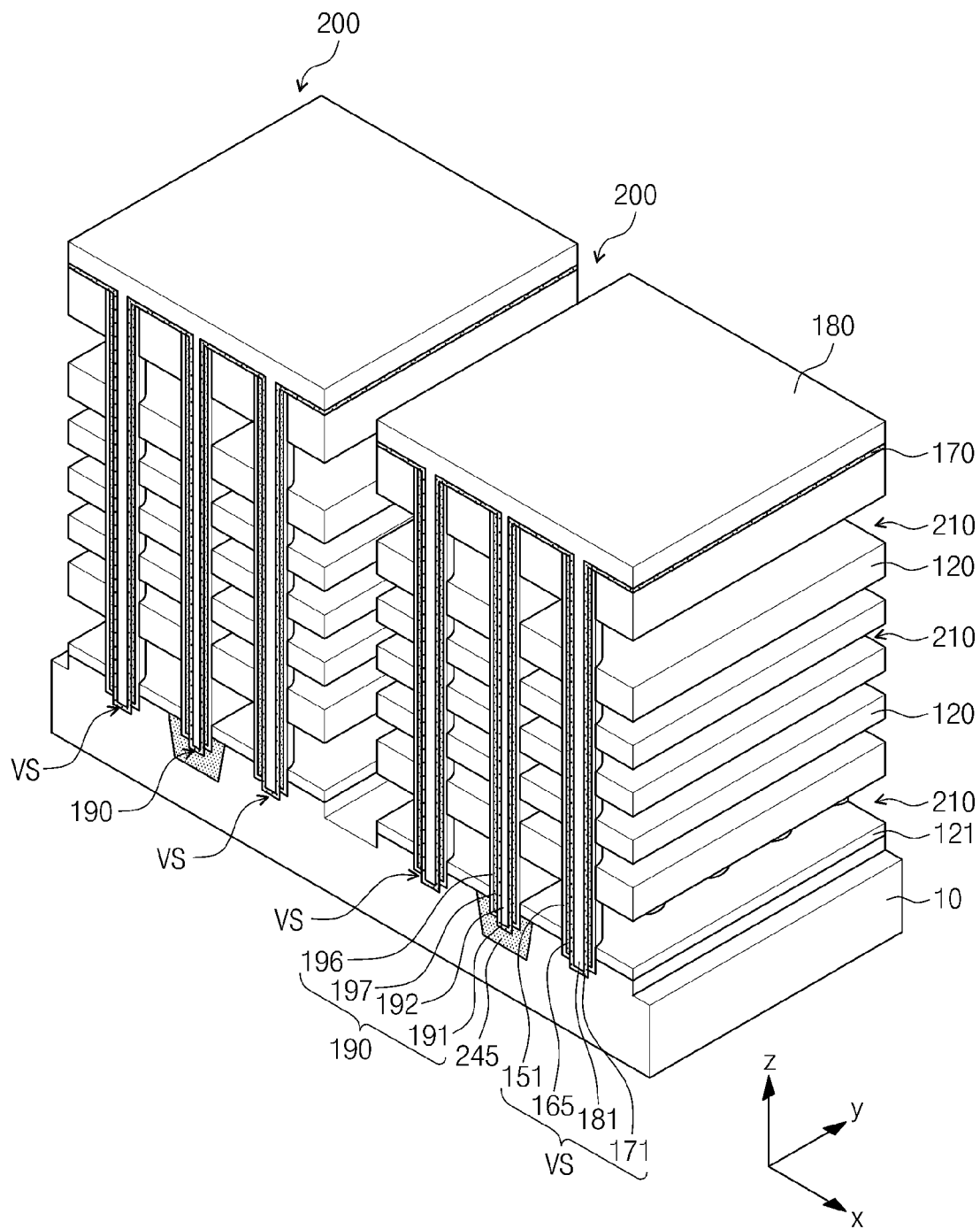

Referring to FIG. 17, recess regions 210 may be formed by selectively removing the sacrificial layers 130 exposed by the second trenches 200. The recess regions 210 may be a gap region laterally extending from the second trenches 200, and expose sidewalls of the vertical pattern 151 and the vertical separation pattern 196. Portions of the sacrificial layers 130, which are interposed between the vertical structure VS and the separation pattern 190 that are adjacent to each other can be etched out through portions of the recess region 210, which are positioned between the vertical structures VS arranged along the y-direction. For example, a wet etchant can be delivered from the second trench 200 to a sidewall of the separation pattern 190 through spaces between the y-directionally separated vertical structures VS. Thus, the portions of the sacrificial layer 130 interposed between the vertical structure VS and the separation pattern 190 can be fully removed during the formation of the recess regions 210.

The separation patterns 190 may be connected to the top surface of the substrate 10 and may extend along the y-direction, and thus, after the removal of the sacrificial layers 130, the separation patterns 190 and the vertical structures VS may structurally support the mold structure 100. For instance, an external force (e.g., a gravitational force) exerted on the mold structure 100 may be dispersed by the vertical structures VS and the separation patterns 190. Thus, the removal of the sacrificial layers 130 and a subsequent process of forming electrodes may be stably performed.

Figure 18:
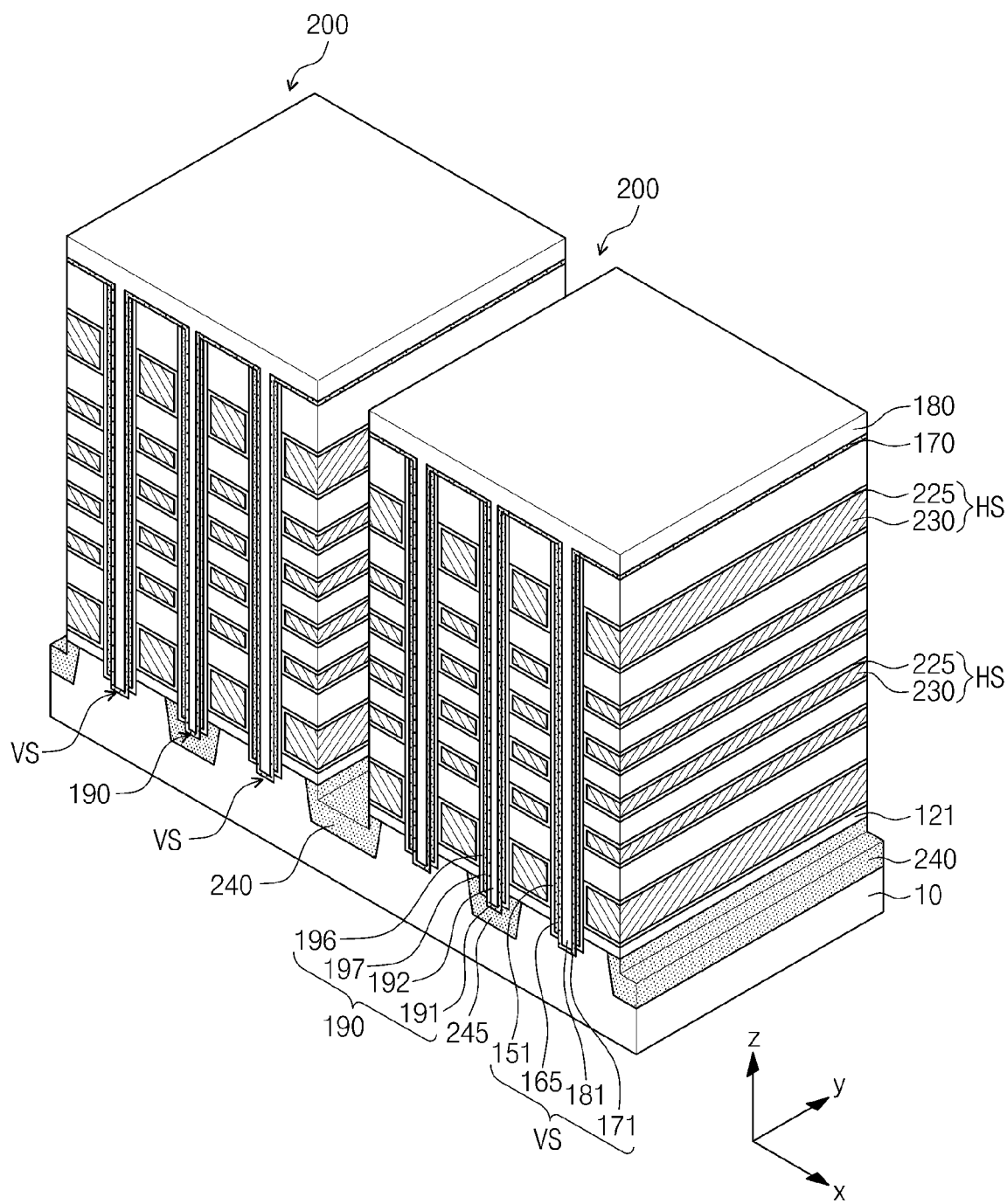

Referring to FIG. 18, horizontal structures HS may fill the recess regions 210. The horizontal structure HS may include a horizontal pattern 225 covering an inner wall of the recess region 210 and a conductive pattern 230 filling the remaining space of the recess region 210. The formation of the horizontal structures HS may include sequentially forming a horizontal layer and a conductive layer to fill the recess regions 210 and removing the conductive layer from the second trenches 200 to leave the conductive patterns 230 in the recess regions 210. The horizontal pattern 225 and the vertical pattern 151 may constitute memory layers. According to an embodiment, the horizontal layer or the horizontal pattern 225 may include one or more layers, similar to the vertical layer 150. According to an embodiment, the horizontal pattern 225 may include a blocking insulating layer of a charge trap type nonvolatile memory transistor. As mentioned above, the exemplary embodiments of the inventive concept may be diversely classified according to the layers included in the vertical pattern 151 and the horizontal pattern 225, some of which will be described in further detail with reference to FIGS. 21 through 28.

According to an exemplary embodiment of the inventive concept, when the semiconductor device is a FLASH memory, third doped regions 240 may be formed in the substrate 10 after the forming of the conductive patterns 230. The third doped regions 240 may be formed by an ion implantation process in the substrate 10 exposed by the second trenches 200. According to an embodiment, the third doped regions 240 may have a different conductivity type than the substrate 10.

Figure 19:
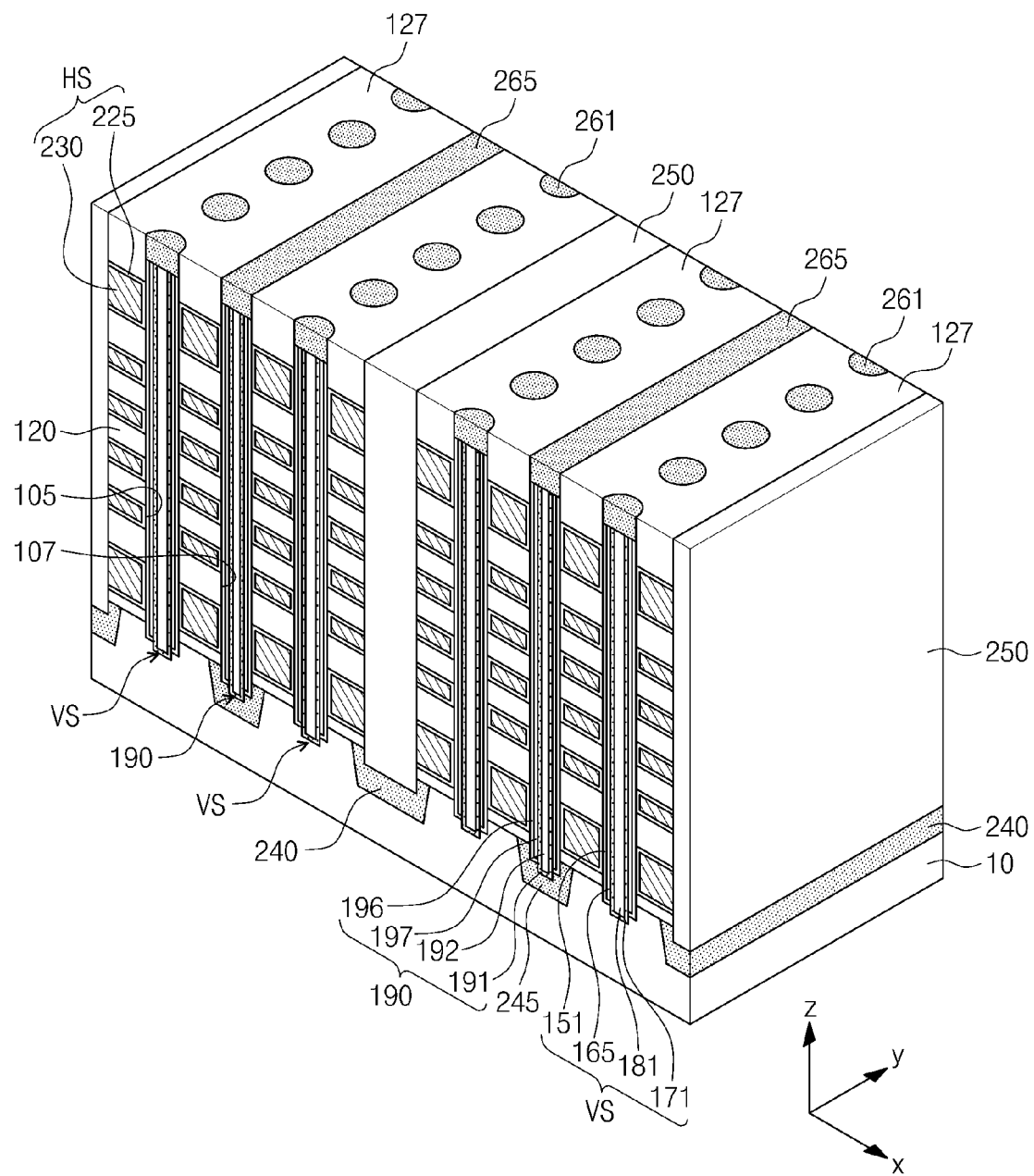

Referring to FIG. 19, gap-fill insulating patterns 250 may fill the second trenches 200. The formation of the gap-fill insulating pattern 250 may include forming a gap-fill insulating layer on the resultant structure provided with the third doped regions 240, for example, the structure shown in FIG. 18, and etching the gap-fill insulating layer to expose a top surface of the uppermost insulating layer 127. The etching of the gap-fill insulating layer may be performed using a planarization technique. Fourth doped regions 261 and first doped regions 265 may be formed on the vertical structures VS and the separation patterns 190, respectively. The formation of the fourth and first doped regions 261 and 265 may include partially etching top surfaces of the vertical structures VS and the separation patterns 190 exposed by the planarization of the gap-fill insulating layer and filling spaces formed by the partial etching process with a semiconductor layer.

Figure 20:
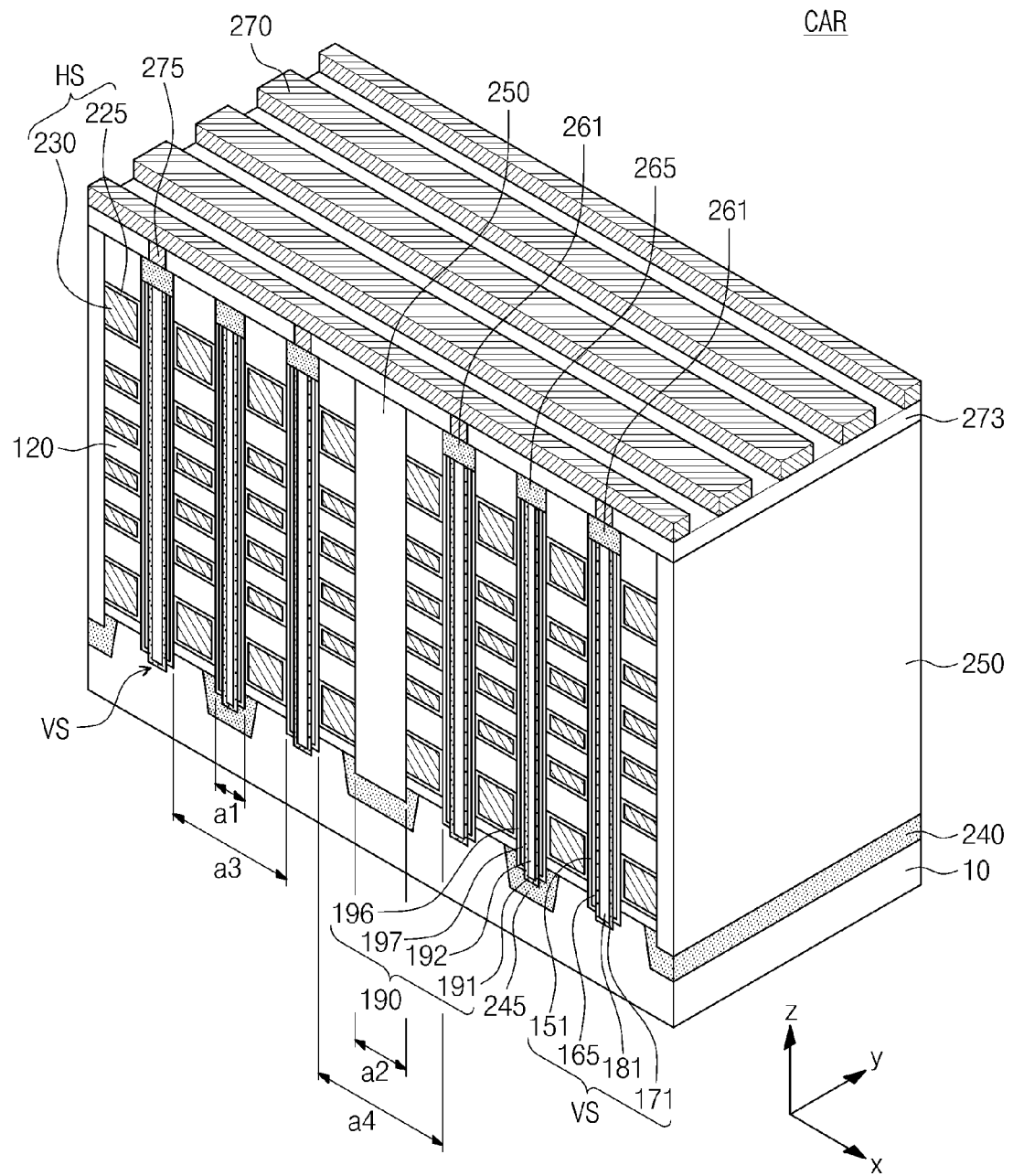

Referring to FIG. 20, upper plugs 275 penetrating an interlayer dielectric 273 may be formed on the vertical structures VS, respectively, and upper lines 270 may be formed on the upper plugs 275 to connect the upper plugs 275 with each other.

Referring to FIGS. 19 and 20, as described above, the cell array region of the three-dimensional semiconductor device may include the gap-fill insulating patterns 250 extending from the substrate 10. The three-dimensional semiconductor device may further include electrode structures including the conductive patterns 230 and the insulating layers 120 alternately stacked on the substrate 10, and the electrode structures may be defined by sidewalls of the gap-fill insulating patterns 250.

The vertical structures VS may be provided to penetrate the electrode structures. The vertical structure VS may include the vertical pattern 151, the spacer 165, the vertical semiconductor layer 171, and the vertical gap-fill layer 181, which are sequentially stacked in the channel hole 105. The vertical structures VS may include first and second rows of vertical structures, each of which may include a plurality of the vertical structures VS arranged along the y-direction, between adjacent two gap-fill insulating patterns 250. The first and second rows of vertical structures may be spaced apart from each other in the x-direction.

A separation pattern 190 may be provided between the first and second rows of vertical structures VS. The separation pattern 190 may include a vertical separation pattern 196, a spacer separation pattern 197, a separation semiconductor layer 191, and a separation insulating layer 192, which are sequentially stacked in the first trench 107, and may extend along the y-direction as the first and second rows of vertical structures. As viewed from above the separation pattern 190, the separation pattern 190 may have a stripe shape elongated along the y-direction.

The gap-fill insulating pattern 250 may have a width a2, which may be selected in consideration of the formation of the conductive patterns 230. According to an exemplary embodiment of the inventive concept, the gap-fill insulating patterns 250 may be formed at a first side of a y-directional row of the vertical structures, but not at a second side of the y-directional row of the vertical structure. The second side is opposite to the first side. At the second side of the y-directional row of the vertical structures, the separation pattern 190 having the width a1 may be provided. The width a1 may be less than the width a2 of the gap-fill insulating pattern 250. For example, in the x-direction, the gap-fill insulating patterns 250 and the separation patterns 190 may be alternately arranged between the vertical structures VS and a row of vertical structures VS is arranged between a gap-fill insulating pattern 250 and a separation pattern 190 that are adjacent to each other. Thus, the three-dimensional semiconductor device can be fabricated to have a reduced x-directional width, and consequently, to have an increased integration density. The conductive patterns 230 may be electrically separated from the separation patterns 190 by the memory layers 225.

According to an embodiment, some of distances in the x direction between the vertical structures VS may be different from each other. For instance, according to an embodiment, a distance a3 between a pair of the vertical structures VS provided at two opposite sides of the separation pattern 190 may be smaller than a distance a4 between a pair of the vertical structures VS provided at two opposite sides of the gap-fill insulating pattern 250. For example, as shown in FIG. 20, x-directional distances between the vertical structures VS may include the distances a3 and a4 that alternately occur since the width a1 of the separation pattern 190 is smaller than the width a2 of the gap-fill insulating pattern 250. Thus, the three-dimensional semiconductor device can be fabricated to have a reduced x-directional width, and consequently, to have an increased integration density.

According to an embodiment, the fourth doped regions 261 provided on the vertical structures VS may have the same or substantially the same conductivity type as the third doped regions 240 formed in the substrate 10 under the gap-fill insulating patterns 250. For instance, according to an embodiment, the third and fourth doped regions 240 and 261 may have a different conductivity type from the substrate 10. According to an embodiment, the first doped regions 265 provided on the separation patterns 190 may have the same or substantially the same conductivity type as the second doped regions 245 provided under the separation patterns 190. For instance, according to an embodiment, the first and second doped regions 265 and 245 may have the same or substantially the same conductivity type as the substrate 10 and may have greater impurity concentrations than the substrate 10. When the first and second doped regions 265 and 245 may have the same or substantially the same conductivity type as the substrate 10 as described above, the first and second doped regions 265 and 245 and the separation patterns 190 can be ohmically connected to the substrate 10, and therefore, can be used as portions of conductive lines that deliver a bulk voltage to the substrate. For example, according to an exemplary embodiment, when the semiconductor device is a NAND FLASH memory, an erase voltage can be delivered to the substrate 10 during an erase step via the first and second doped regions 265 and 245 and the separation patterns 190.

According to an embodiment, the first and second doped regions 265 and 245 may be of a different conductivity type from the substrate 10. For instance, according to an embodiment, the first and second doped regions 265 and 245 may exhibit the same or substantially the same conductivity type as the third and fourth doped regions 240 and 261. According to an embodiment, the separation semiconductor layer 191 may be formed of an intrinsic semiconductor and the first and second doped regions 265 and 245 may be electrically used as a portion of a common source line. The conductivity types and functions of the doped regions described herein may also be applicable to the three-dimensional semiconductor device described with reference to FIGS. 2 through 11.

According to the embodiments described with reference to FIGS. 12 through 20, the separation patterns 190 may be a part of the conductive line configured to deliver a predetermined voltage to the substrate 10 or a part of the common source line.

The vertical pattern 151 and the horizontal pattern 225 according to an exemplary embodiment of the inventive concept will be described in further detail with reference to FIGS. 21 through 28. The horizontal pattern 225 and the vertical pattern 151 may be part of a memory element of a memory cell transistor. The memory element may include a plurality of layers, and the number and types of layers constituting each of the horizontal and vertical patterns 225 and 151 may vary, and various exemplary embodiments of the inventive concept may be provided based on the number and types of layers. For example, exemplary embodiments of the inventive concept may include various types of memory layer (which is also referred to as an "information storage layers") as in the following Table 1.

TABLE 1

| Information storage layer | | | | | | | Corresponding |
|---|---|---|---|---|---|---|---|
| VS | | | | HS | | | FIG. |
| SP | TIL | CL | CPL | BIL1 | | 230 | 21[1] |
| SP | TIL | CL | | BIL1 | | 230 | 22 |
| SP | TIL | | CL | BIL1 | | 230 | 23 |
| SP | TIL | CL | | BIL1 | BIL2 | 230 | 24 |
| SP | TIL | | CL | BIL1 | BIL2 | 230 | 25 |
| SP | TIL | CL | CPL | BIL1 | | 230 | 26[2] |
| SP | TIL | CL | CPL | BIL1 | | 230 | 27[3] |
| SP | TIL | CL | CPL | BIL1 | BIL2 | 230 | 28 |

TIL: Tunnel Insulating layer
CL: Charge storing Layer
SP: Semiconductor Pattern
BIL: Blocking Insulating Layer
CPL: Capping Layer
[1]CPL with uniform thickness
[2]CPL with recessed sidewall
[3]CPL separated vertically According to an exemplary embodiment, when the semiconductor device is a FLASH memory, the memory layer may include a tunnel insulating layer TIL, a charge storing layer CL, and a first blocking insulating layer BIL1 (e.g., as shown in Table 1 and illustrated in FIGS. 21-28). According to a modified embodiment, the memory layer may include a second blocking insulating layer BIL2 between the first blocking insulating layer BIL1 and the conductive pattern 230. According to an embodiment, the memory layer may include a capping layer CPL interposed between the charge storing layer CL and the first blocking insulating layer BIL1. According to an embodiment, the memory layer may be formed using a deposition technique that provides, for example, excellent and/or improved stepped application (e.g., a CVD and/or ALD technique).

Figure 23:
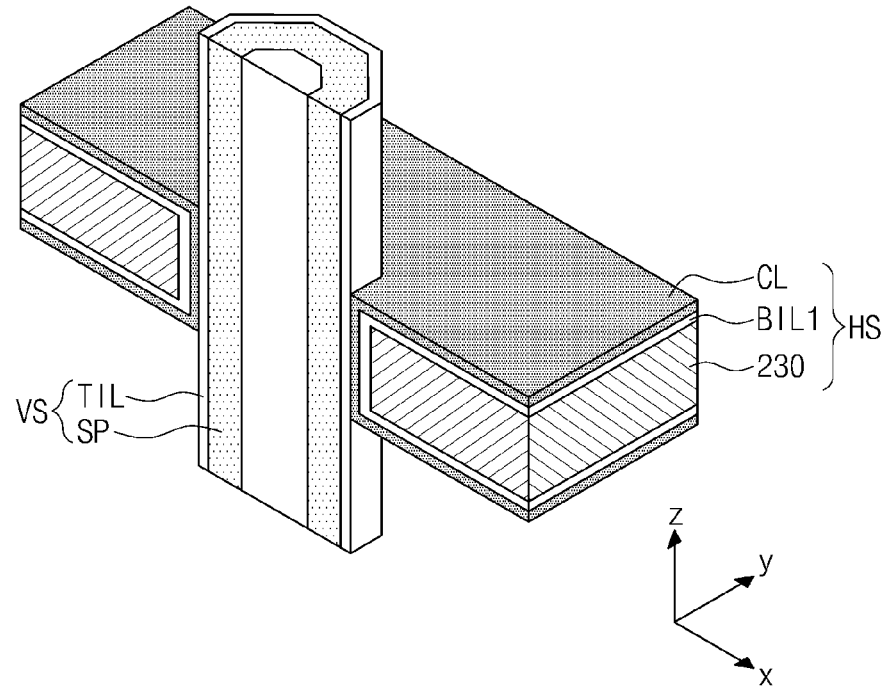
Figure 24:
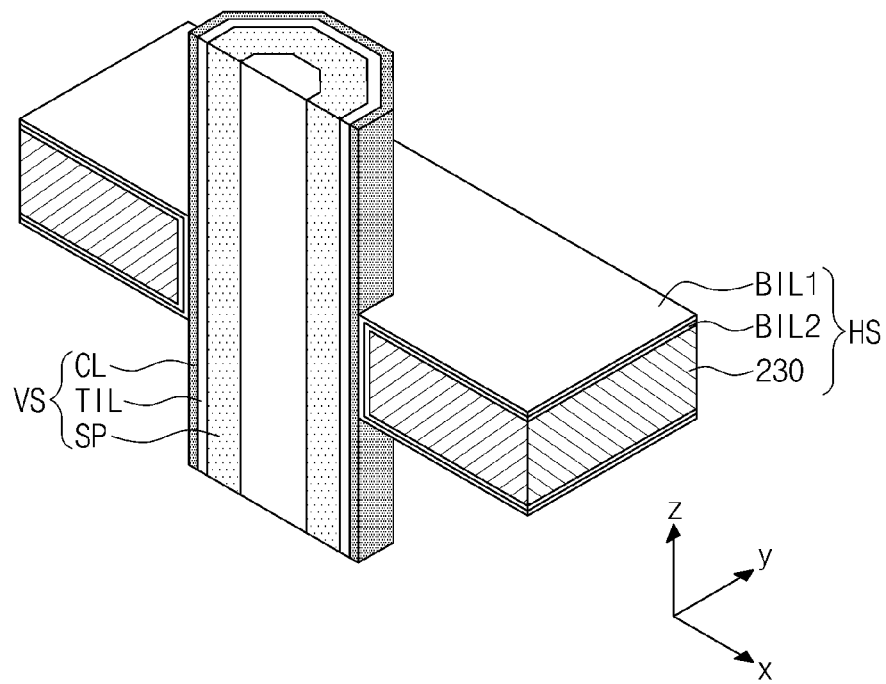
Figure 25:
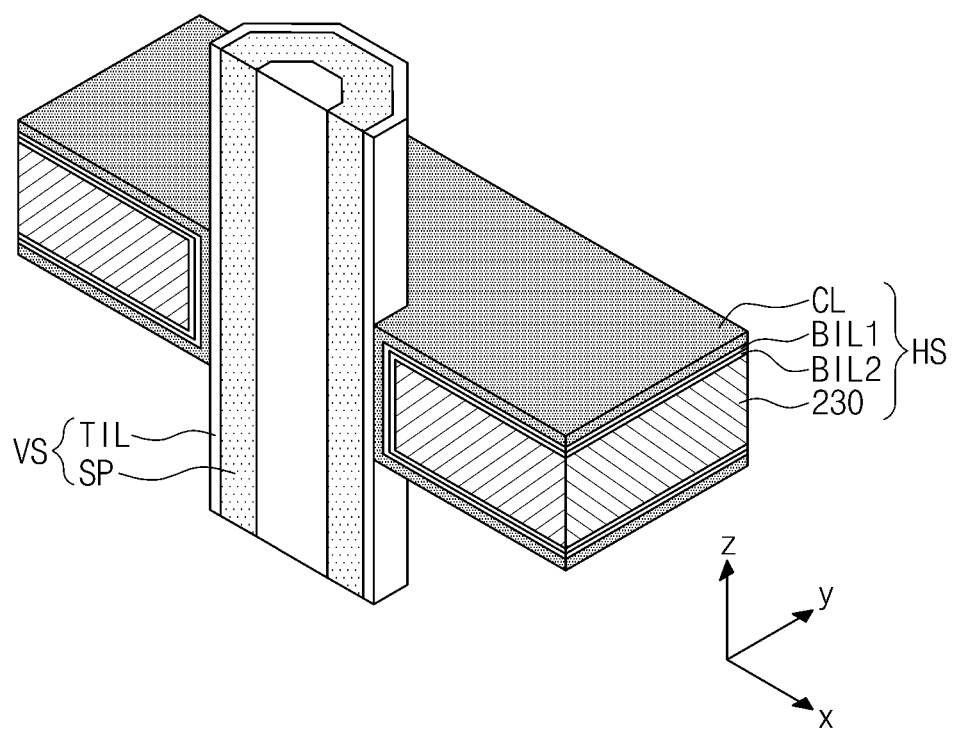

As shown in Table 1 and illustrated in FIGS. 21 to 28, the vertical structure VS may include at least the tunnel insulating layer TIL, and the horizontal structure HS may include at least one of the first and second blocking insulating layers BIL1 and BIL2. According to an exemplary embodiment (e.g., as illustrated in FIGS. 21, 22, 24, 26A, 26B, 27, and 28), the vertical structure VS may include the charge storing layer CL. According to an exemplary embodiment (e.g., as illustrated in FIGS. 23 and 25), the horizontal structure HS may include the charge storing layer CL.

According to an embodiment, if the vertical structure VS includes the charge storing layer CL, the vertical structure VS may further include the capping layer CPL, as illustrated in FIGS. 21, 26A, 26B, 27, and 28. According to an embodiment, the vertical structure VS and the horizontal structure HS may directly contact each other without the capping layer CPL as illustrated in FIGS. 22-25.

Figure 21:
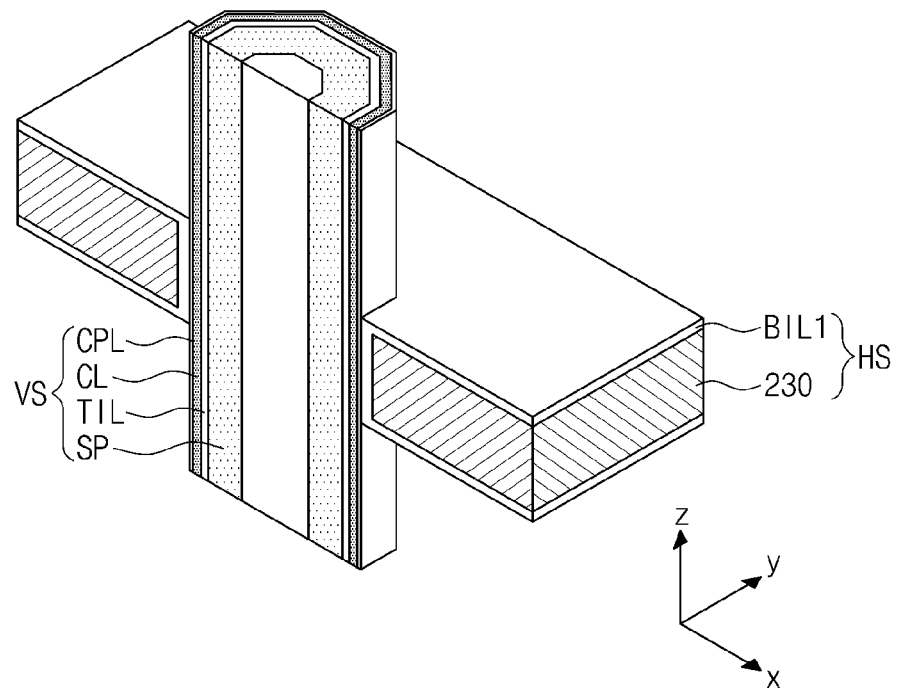
FIGS. 21 through 25, 26A, 27, and 28 are perspective views illustrating structures of a memory layer according to an embodiment of the inventive concept.
Figure 22:
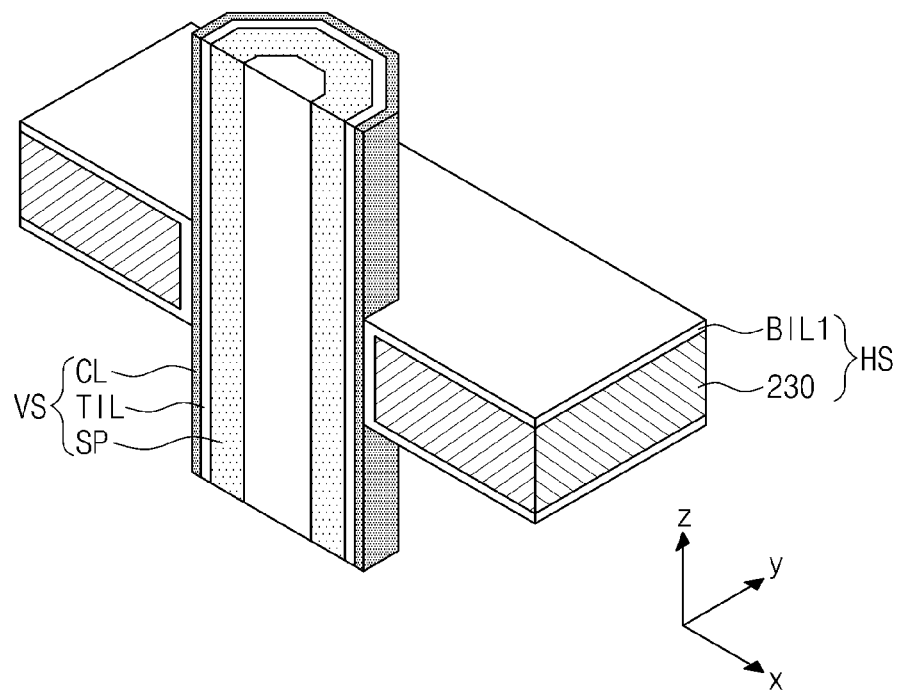
Figure 26A:
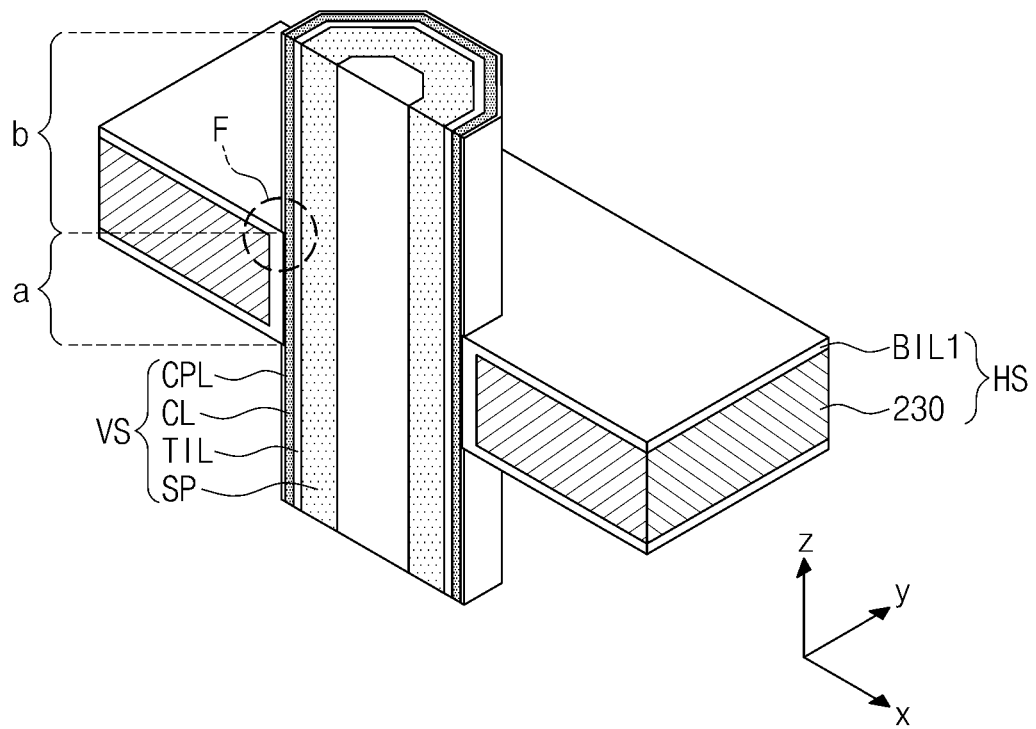
Figure 26B:
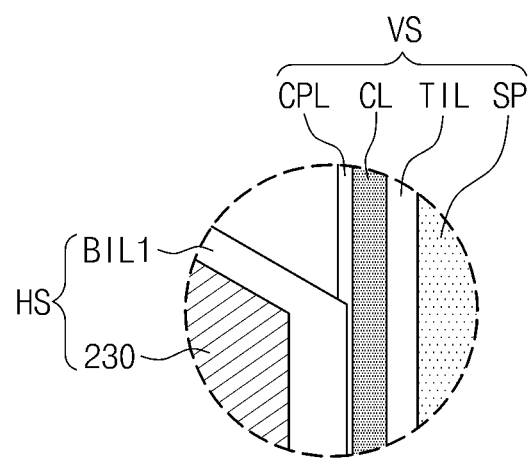
FIG. 26B is an enlarged view illustrating part F of FIG. 26A.
Figure 27:
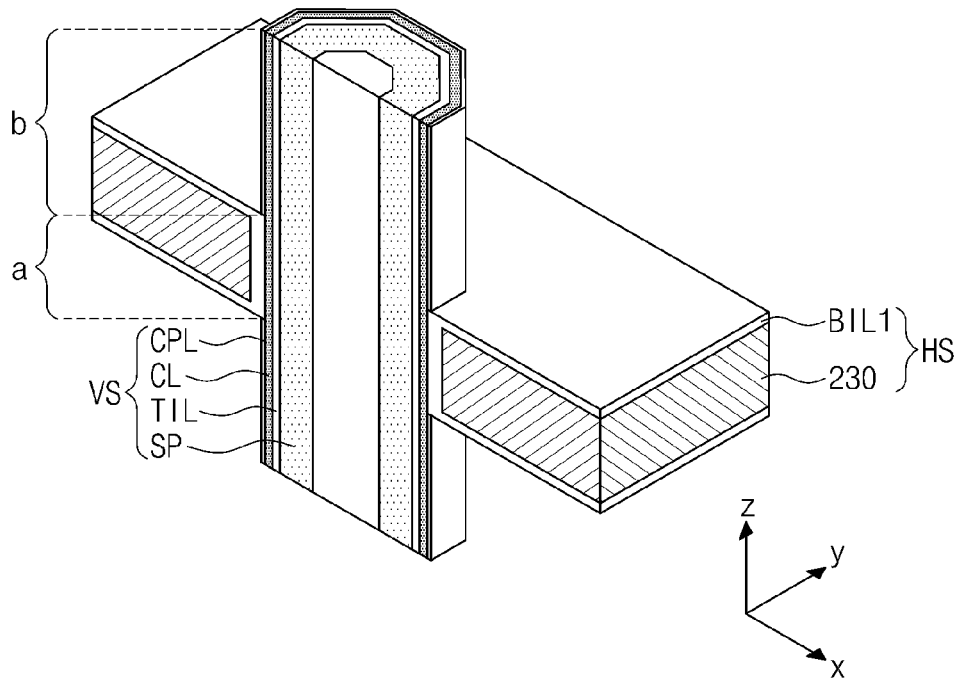

According to an embodiment, a sidewall thickness of the capping layer CPL may be non-uniform. For example, according to an embodiment, during the forming of the recess regions 210, portions of the sidewall of the capping layer CPL adjacent to the horizontal structures HS may be horizontally recessed. According to an embodiment, the capping layer CPL may be thicker at a region "b" (or a vertical adjacent region) between the horizontal structures HS than at a region "a" (or a channel region) adjacent to the horizontal structure HS as illustrated in FIGS. 26A and 26B. The vertical adjacent region b may be a region located between two adjacent channel regions a. Alternatively, the capping layer CPL may locally remain at the vertical adjacent region "b", and the horizontal structure HS may directly contact the sidewall of the charge storing layer CL at the channel region "a" as illustrated in FIG. 27. According to an embodiment, the sidewall thickness of the capping layer CPL may be substantially uniform as illustrated in FIG. 21.

Figure 28:
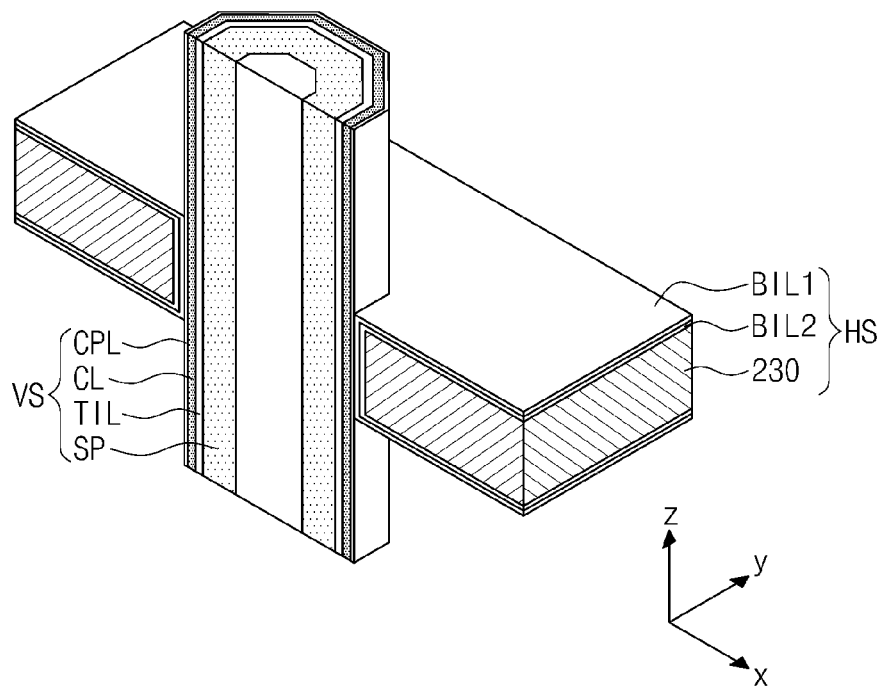

According to an exemplary embodiment, the horizontal structure HS may include both of the first and second blocking insulating layers BIL1 and BIL2 as illustrated in FIGS. 24, 25 and 28.

According to an embodiment, the charge storing layer CL may include one or more insulating layers with abundant trap sites and/or may include one or more insulating layers with nano particles. According to an embodiment, the charge storing layer CL may be formed, for example, by CVD and/or ALD. For example, according to an embodiment, the charge storing layer CL may include one of a trap insulating layer and/or an insulating layer with a floating gate electrode and/or conductive nano dots. According to an embodiment, the charge storing layer CL may include a silicon nitride layer, a silicon oxynitride layer, a silicon-rich nitride layer, a nano crystalline silicon layer, and/or a laminated trap layer.

The tunnel insulating layer TIL may be formed of a material with a higher band gap than a band gap of the charge storing layer CL by, for example, CVD and/or ALD. For example, according to an embodiment, the tunnel insulating layer TIL may include a silicon oxide layer. According to an embodiment, the tunnel insulating layer TIL may undergo a thermal treatment after a deposition process. According to an embodiment, the thermal treatment process may include, for example, a rapid thermal nitridation (RTN) process and/or an annealing process in an atmosphere including nitrogen and/or oxygen.

According to an embodiment, the first and second blocking insulating layers BIL1 and BIL2 may include different materials, and one of the first and second blocking insulating layers BIL1 and BIL2 may be formed of a material having a smaller band gap than a band gap of the tunnel insulating layer TIL and a larger band gap than a band gap of the charge storing layer CL. According to an embodiment, the first and second blocking insulating layers BIL1 and BIL2 may be formed by, for example, CVD and/or ALD. According to an embodiment, at least one of BIL1 and BIL2 may be formed by wet oxidation. According to an exemplary embodiment, the first blocking insulating layer BIL1 may include a high-k dielectric layer (e.g., an aluminum oxide layer and/or a hafnium oxide layer). The second blocking insulating layer BIL2 may be formed of, for example, a material with a smaller dielectric constant than the first blocking insulating layer BIL1. According to an exemplary embodiment, the second blocking insulating layer BIL2 may include a high-k dielectric layer, and the first blocking insulating layer BIL1 may be formed of a material with a smaller dielectric constant than the second blocking insulating layer BIL2. According to an exemplary embodiment, a third blocking insulating layer may be included between the charge storing layer CL and the conductive pattern 230.

According to an embodiment, the capping layer CPL may include a material having an etch selectivity with respect to the charge storing layer CL and/or the sacrificial layer 130. For example, when the sacrificial layer 130 is a silicon nitride layer, the capping layer CPL may be a silicon oxide layer. During a process for removing the sacrificial layers 130 to form the recess regions 210, the capping layer CPL may function as an etch stop layer to prevent and/or reduce etch damage to the charge storing layer CL. According to an embodiment, when the capping layer CPL may remain between the conductive pattern 230 and the charge storing layer CL as shown in FIGS. 21, 26A, 26B, and 28, the capping layer CPL may be formed of a material that contributes to preventing leakage (e.g., back-tunneling) of charge stored in the charge storing layer CL. For example, according to an embodiment, the capping layer CPL may include one of a silicon oxide layer and a high-k dielectric layer.

Figure 29:
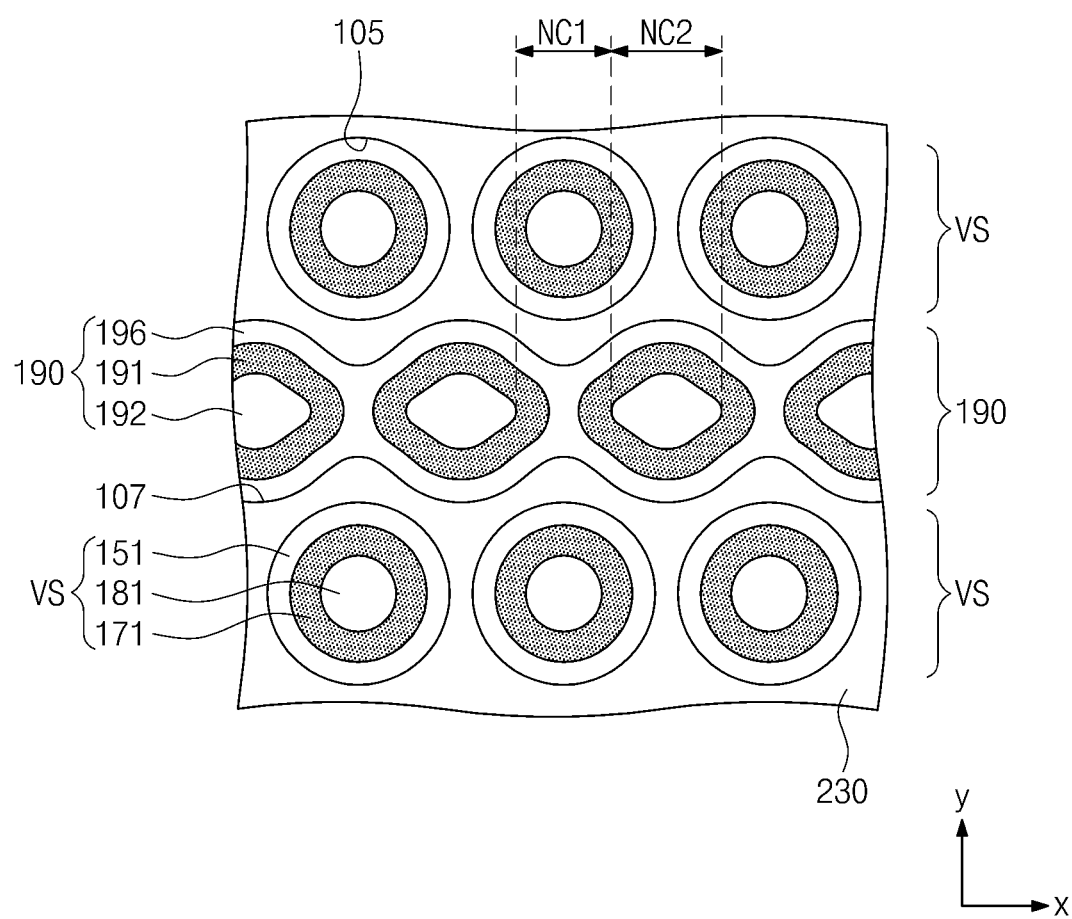
FIGS. 29 and 30 are plan views illustrating separation patterns according to embodiments of the inventive concept.
Figure 30:
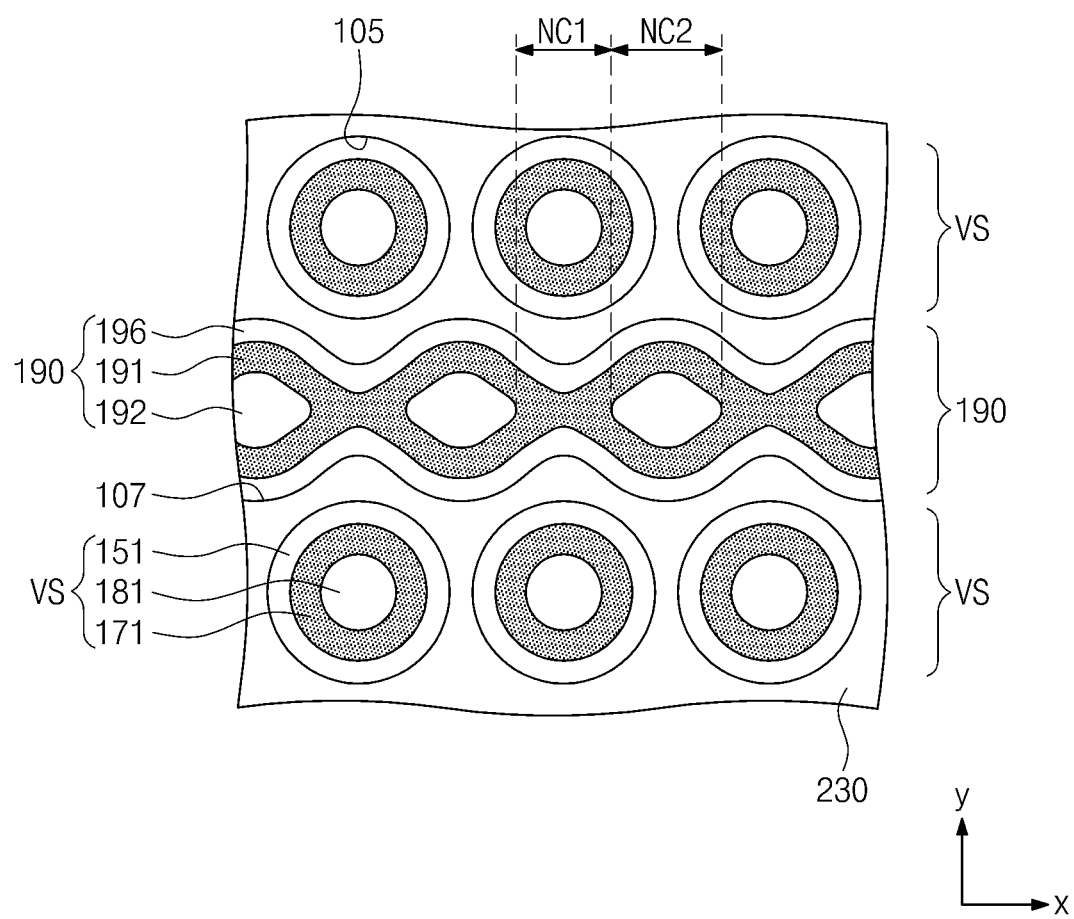

FIGS. 29 and 30 are plan views illustrating separation patterns according to embodiments of the inventive concept.

In an embodiment, the separation patterns may include layers that have the same or substantially the same technical features as those of the vertical structure VS described with reference to FIGS. 21 through 28.

Referring to FIGS. 29 and 30, the separation pattern 190 and the vertical structure VS may be provided through conductive patterns 230. In an embodiment, the vertical structure VS provided in the channel hole 105 may include at least one layer formed of the same or substantially the same material as the separation pattern 190 provided in the trench 107. For example, the vertical structure VS may include the vertical pattern 151, the vertical semiconductor layer 171, and the vertical gap-filling layer 181 sequentially formed in the channel hole 105, and the separation pattern 190 may include the vertical separation pattern 196, the separation semiconductor layer 191, and the separation insulating layer 192 sequentially formed in the trench 107. The vertical gap-filling layer 181 and the separation insulating layer 192 may be formed of the same or substantially the same material at the same time, the vertical semiconductor layer 171 and the separation semiconductor layer 191 may be formed of the same or substantially the same material at the same time, and the vertical pattern 151 and the vertical separation pattern 196 may be formed of the same or substantially the same material at the same time.

As shown in FIG. 29, when a horizontal section of the trench 107 is shaped substantially like circles partially overlapping each other, the trench 107 may include first regions NC1 and second regions NC2. The second regions NC2 are greater in widths in the y direction than the first regions NC1. The separation semiconductor layer 191 may include cylindrical portions separated from each other at the first regions NC1 by the vertical separation pattern 196. For example, insulating layers provided on inner side surfaces of the trench 107 may be connected to each other at the first regions NC1 and delimit gap regions in the trench 107. The separation semiconductor layer 191 may be provided in the gap regions delimited by the insulating layers.

As shown in FIG. 30, the vertical separation pattern 196 may be formed not to separate the separation semiconductor layer 191 at the first regions NC1. For example, the separation semiconductor layer 191 may include cylindrical portions with sidewalls connected to each other at the first regions NC1. The exemplary embodiments of the inventive concept are not limited to the shapes of the separation semiconductor layer 191 shown in FIGS. 29 and 30. For example, the shapes of the separation semiconductor layer 191 may be modified depending on process conditions of etching and deposition processes.

FIGS. 31 through 36 are perspective views illustrating a method of fabricating a cell array region of a three-dimensional semiconductor device according to an embodiment of the inventive concept.

Figure 31:
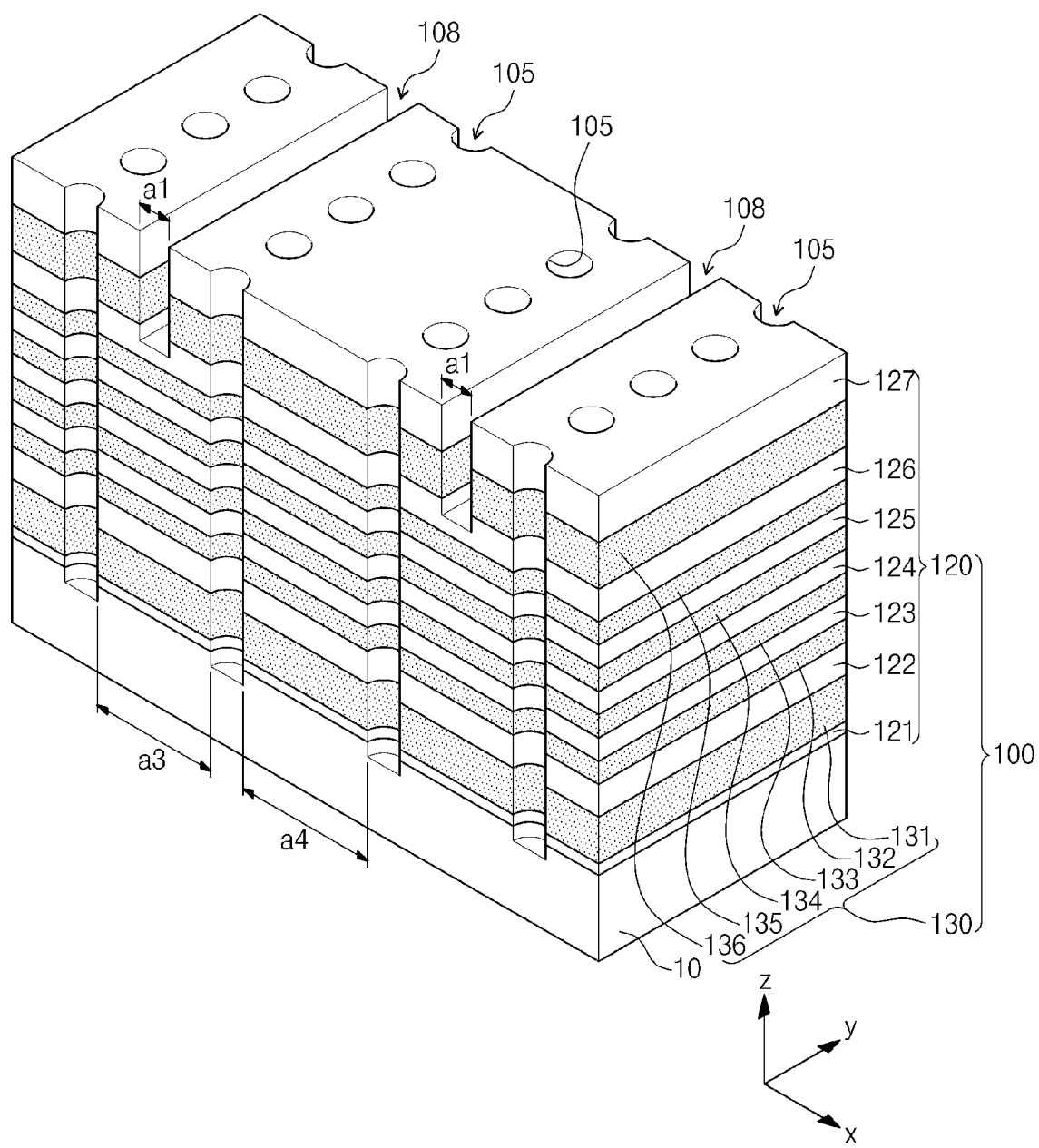
FIGS. 31 through 36 are perspective views illustrating a methods of fabricating a three-dimensional semiconductor memory device according to an embodiment of the inventive concept.

Referring to FIG. 31, channel holes 105 and first trenches 108 may be formed in the mold structure 100 described with reference to FIG. 2. The channel holes 105 and the first trenches 108 may be formed using different patterning processes from each other. The first trenches 108 may be formed by patterning at least one of the sacrificial layers 130. In comparison with the embodiments described with reference to FIGS. 2 through 20, the first trenches 108 may penetrate only some of the layers constituting the mold structure 100. For instance, according to an embodiment, during the formation of the first trenches 108, the uppermost sacrificial layer 136 of the sacrificial layers 130 may be patterned to define sidewalls of the first trenches 108, but the underlying sacrificial layers 131-135 may not be patterned. According to an embodiment, the uppermost two sacrificial layers 135 and 136 of the sacrificial layers 130 may be patterned, but the underlying sacrificial layers 131-134 are not patterned. Methods of patterning the sacrificial layers 130 may be varied depending on functions of conductive layers, which will be substituted for the sacrificial layers 130. For instance, according to an embodiment, when the uppermost sacrificial layer 136 is replaced by a gate electrode of a string selection transistor, the uppermost sacrificial layer 136 of the sacrificial layers 131-136 may be patterned. According to an embodiment, when the uppermost two sacrificial layers 135 and 136 are replaced by gate electrodes of the string selection transistors, the uppermost two sacrificial layers 135 and 136 may be patterned.

Figure 32:
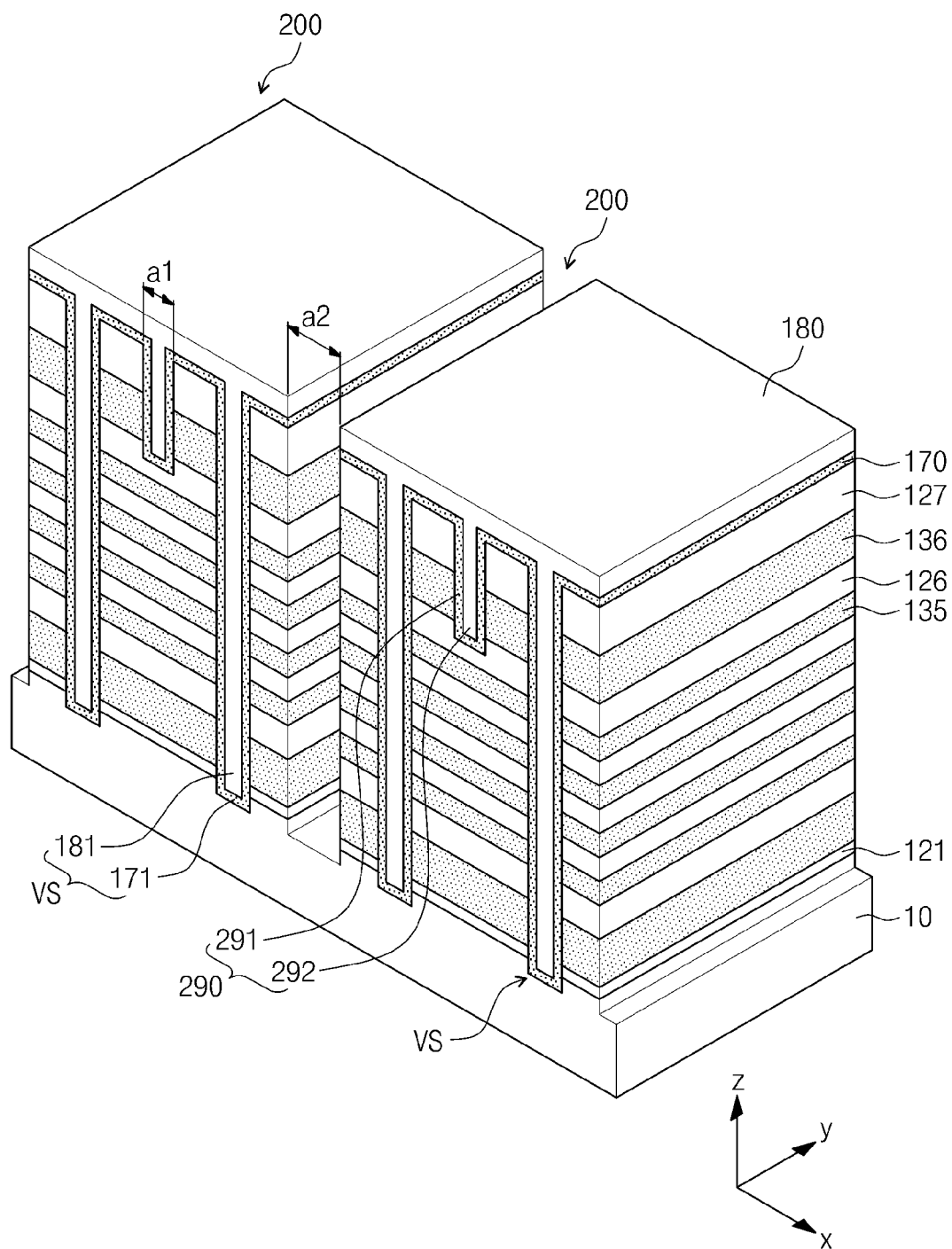

Referring to FIG. 32, the processes described with reference to FIGS. 4 through 6 may be performed to the mold structure 100 provided with the first trenches 108. Thus, a vertical semiconductor layer 171 and a vertical gap-fill layer 181 constituting a vertical pattern VS may be sequentially formed in the channel hole 105, and a separation semiconductor layer 291 and a separation insulating layer 292 constituting a separation pattern 290 may be sequentially formed in the first trench 108. A bottom surface of the separation pattern 290 may be spaced apart from the substrate 10 by some layers of the mold structure 100. As shown in FIG. 32, the mold structure 100 may be patterned to define second trenches 200 that expose the substrate 10.

Figure 33:
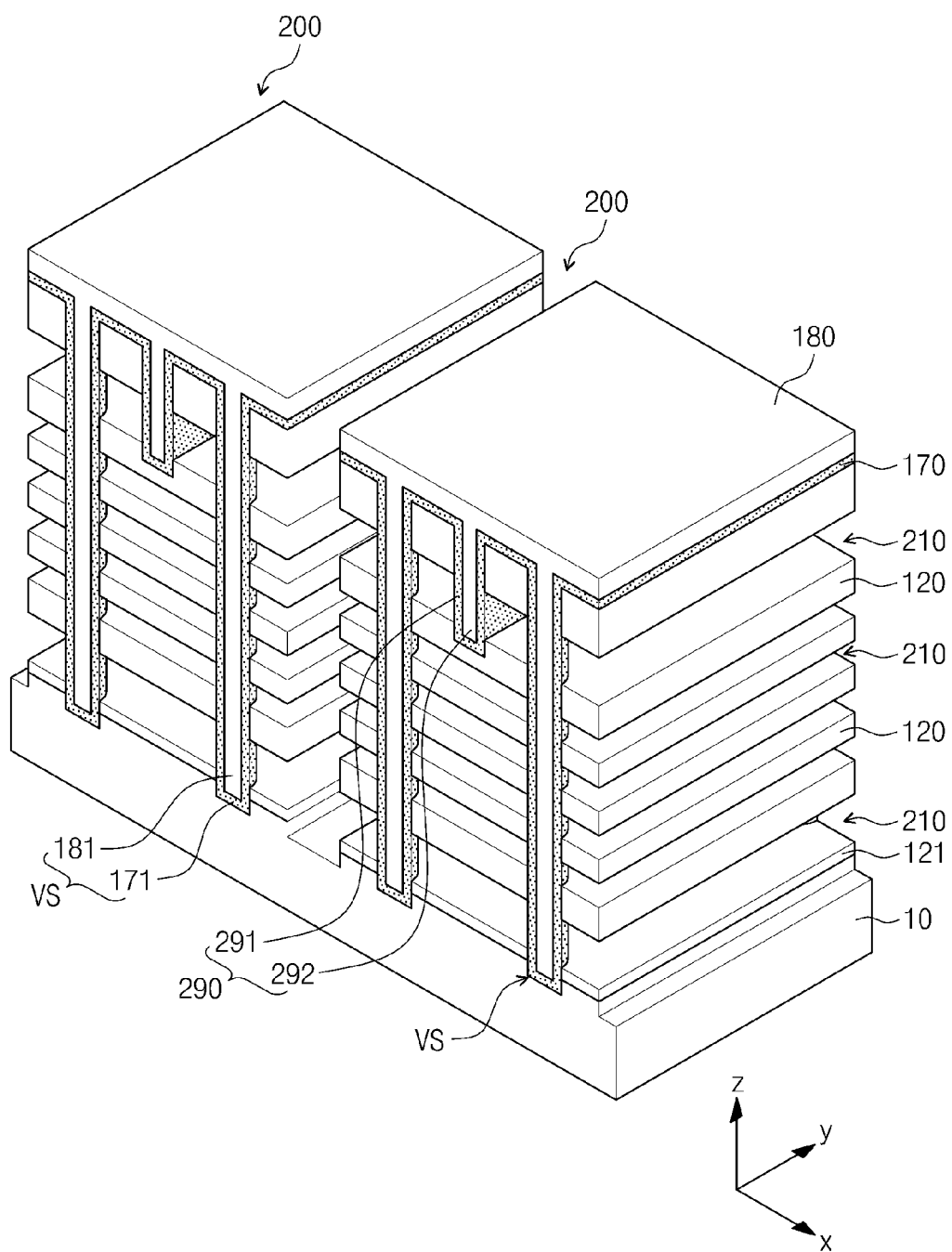

Referring to FIG. 33, the sacrificial layers 130 exposed by the second trenches 200 may be selectively removed to form recess regions 210. Portions of the sacrificial layers 130, which are interposed between the vertical structures VS and the separation pattern 290, can be etched out through portions of the recess region 210, which are positioned between the vertical structures VS arranged along the y-direction. For example, a wet etchant can be delivered from the second trench 200 to a sidewall of the separation pattern 290 through spaces between the y-directionally separated vertical structures VS. Thus, the portions of the sacrificial layer 130 interposed between the vertical structure VS and the separation pattern 290 can be fully removed during the formation of the recess regions 210. Further, the sacrificial layers 131-135 disposed below the separation patterns 290 can be removed by the wet etchant supplied through spaces between the y-directionally separated vertical structures VS. Thus, the recess regions 210 formed below the separation patterns 290 may connect two adjacent second trenches 200 to each other.

Figure 34:
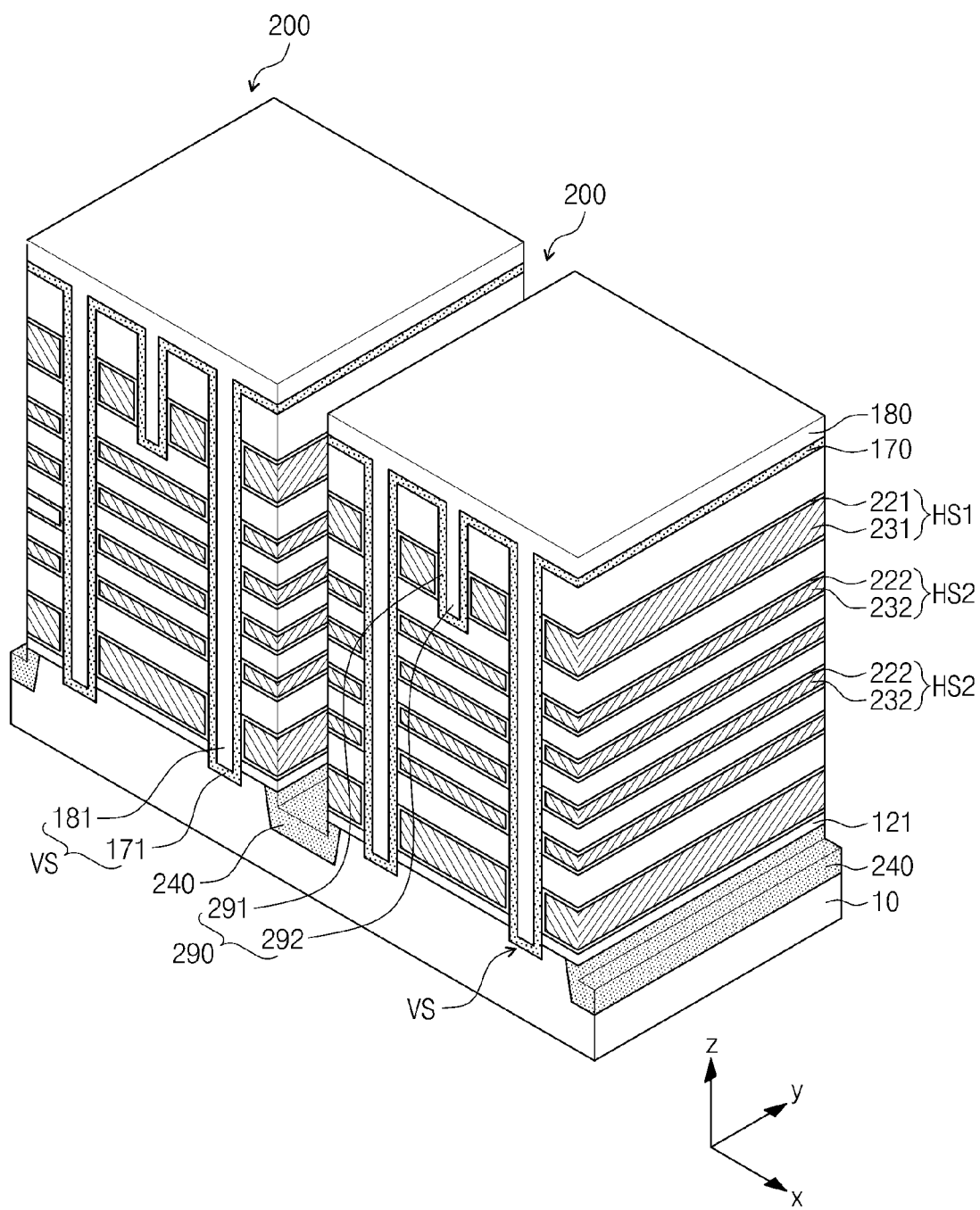

Referring to FIG. 34, horizontal structures HS may fill the recess regions 210. The horizontal structures HS may include first horizontal structures HS1 divided by the separation patterns 290 and second horizontal structures HS2 undivided by the separation patterns 290. According to an exemplary embodiment of the inventive concept, when the semiconductor device is a FLASH memory, the first horizontal structures HS1 may include string selection lines, which may be completely divided from one another along the y-direction. For instance, according to an embodiment, bottom surfaces of the separation patterns 290 may be formed at a lower level than a bottom surface of the string selection line as shown in FIG. 34. This structure may also be applicable to the three-dimensional semiconductor devices described with reference to FIGS. 2 through 20. The first horizontal structure HS1 may include a first memory layer 221 covering an inner wall of the recess region 210 and a first conductive pattern 231 filling the remaining space of the recess region 210. The second horizontal structure HS2 may include a second memory layer 222 covering an inner wall of the recess region 210 and a second conductive pattern 232 filling the remaining space of the recess region 210. The second horizontal structures HS2 may be formed below the separation patterns 290, and thus the two adjacent vertical structures VS may be directly connected with each other by the second horizontal structure HS2. According to an exemplary embodiment of the inventive concept, when the semiconductor is a FLASH memory, third doped regions 240 may be further formed after the formation of the first and second horizontal structures HS1 and HS2.

Figure 35:
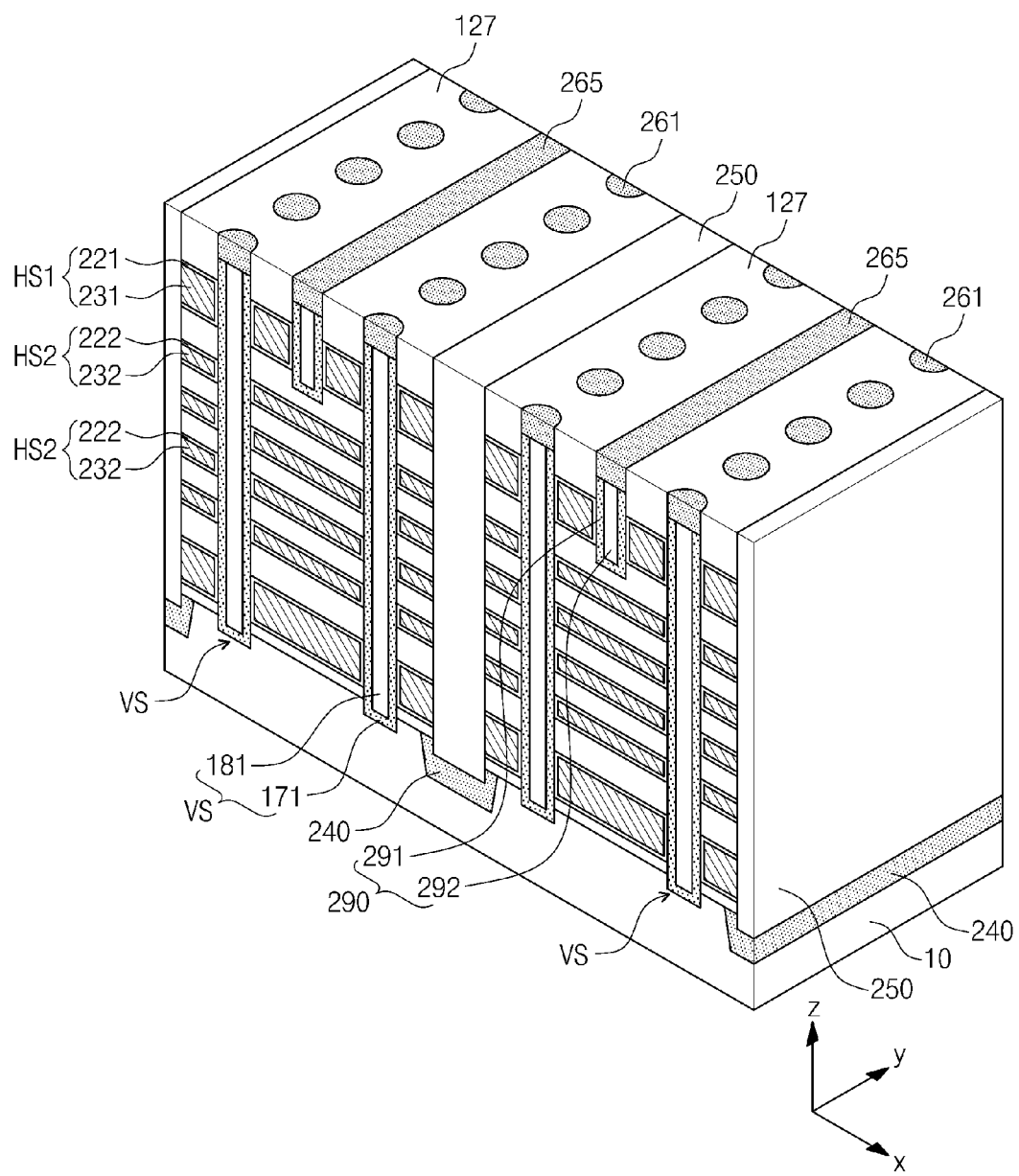

Referring to FIG. 35, gap-fill insulating patterns 250 may fill the second trenches 200. Fourth doped regions 261 and first doped regions 265 may be formed on the vertical structures VS and the separation patterns 290, respectively. According to an embodiment, the fourth and first doped regions 261 and 265 may have a different conductivity type from the substrate 10.

Figure 36:
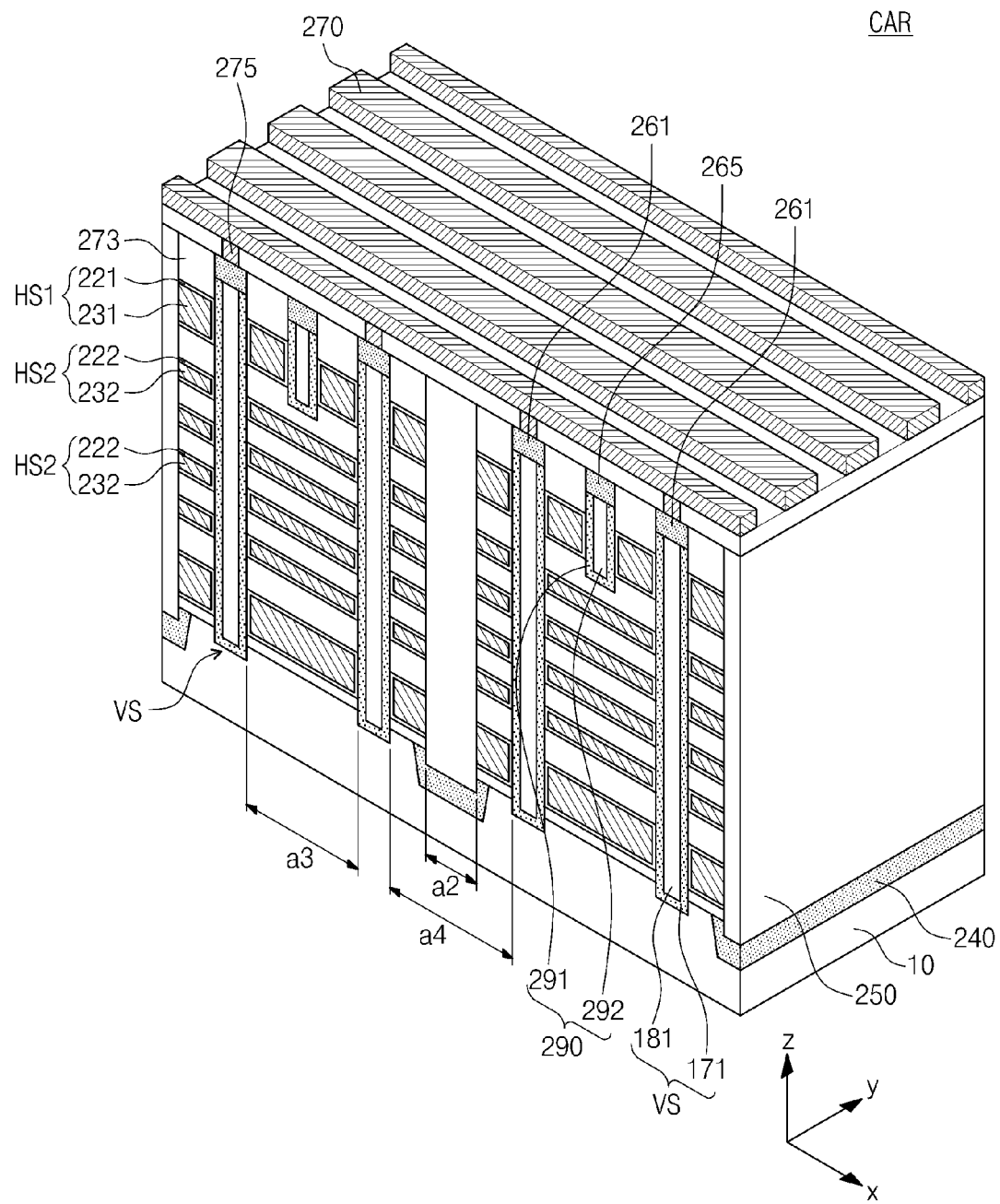

Referring to FIG. 36, upper plugs 275 may be formed through an interlayer dielectric 273 on the vertical structures VS, respectively, and upper lines 270 may be formed on the upper plugs 275 to connect the upper plugs 275 with each other.

Figure 37:
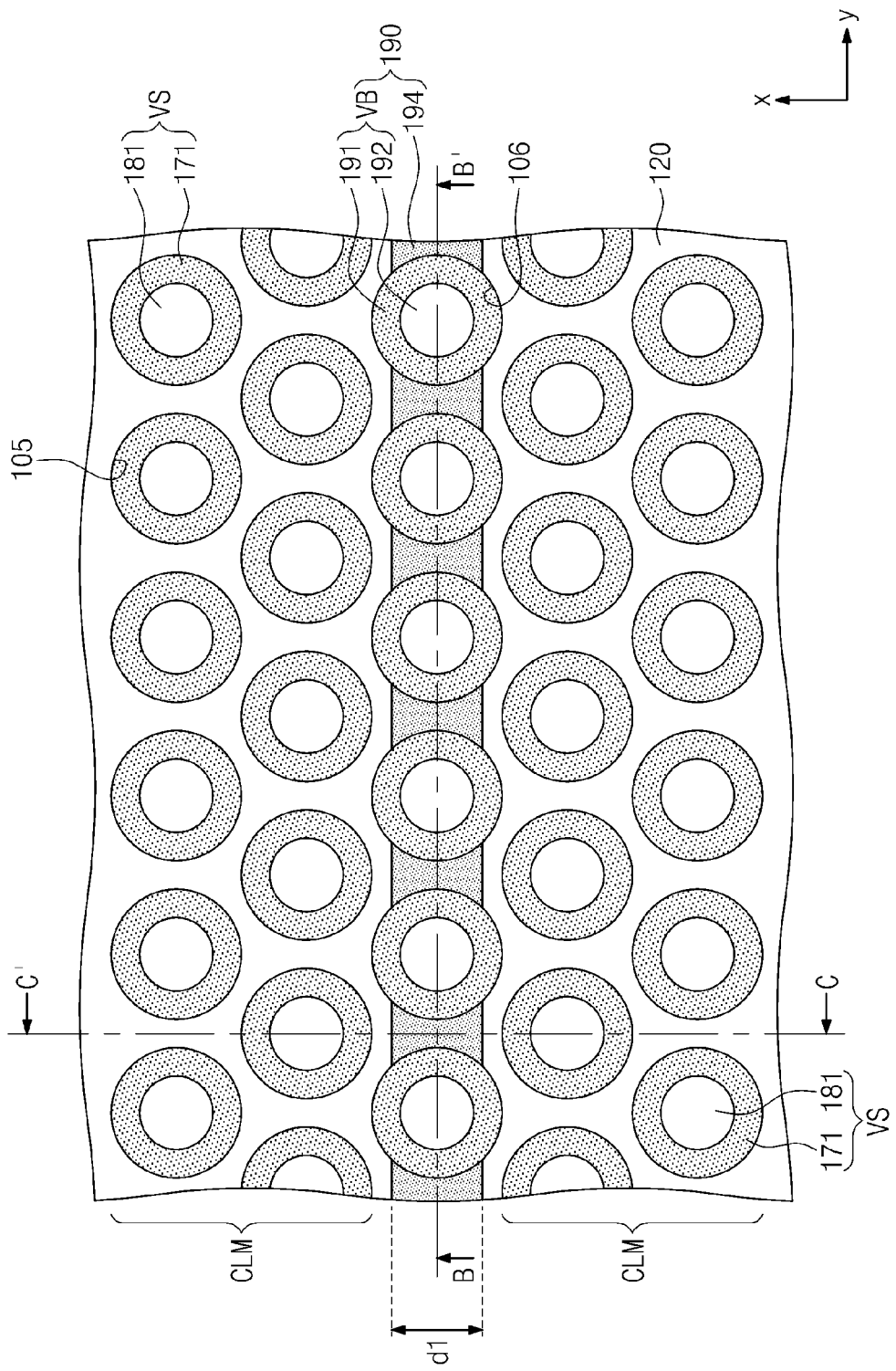
FIG. 37 is a plan view illustrating a cell array region of a three-dimensional semiconductor memory device according to an exemplary embodiment of the inventive concept.
Figure 38:
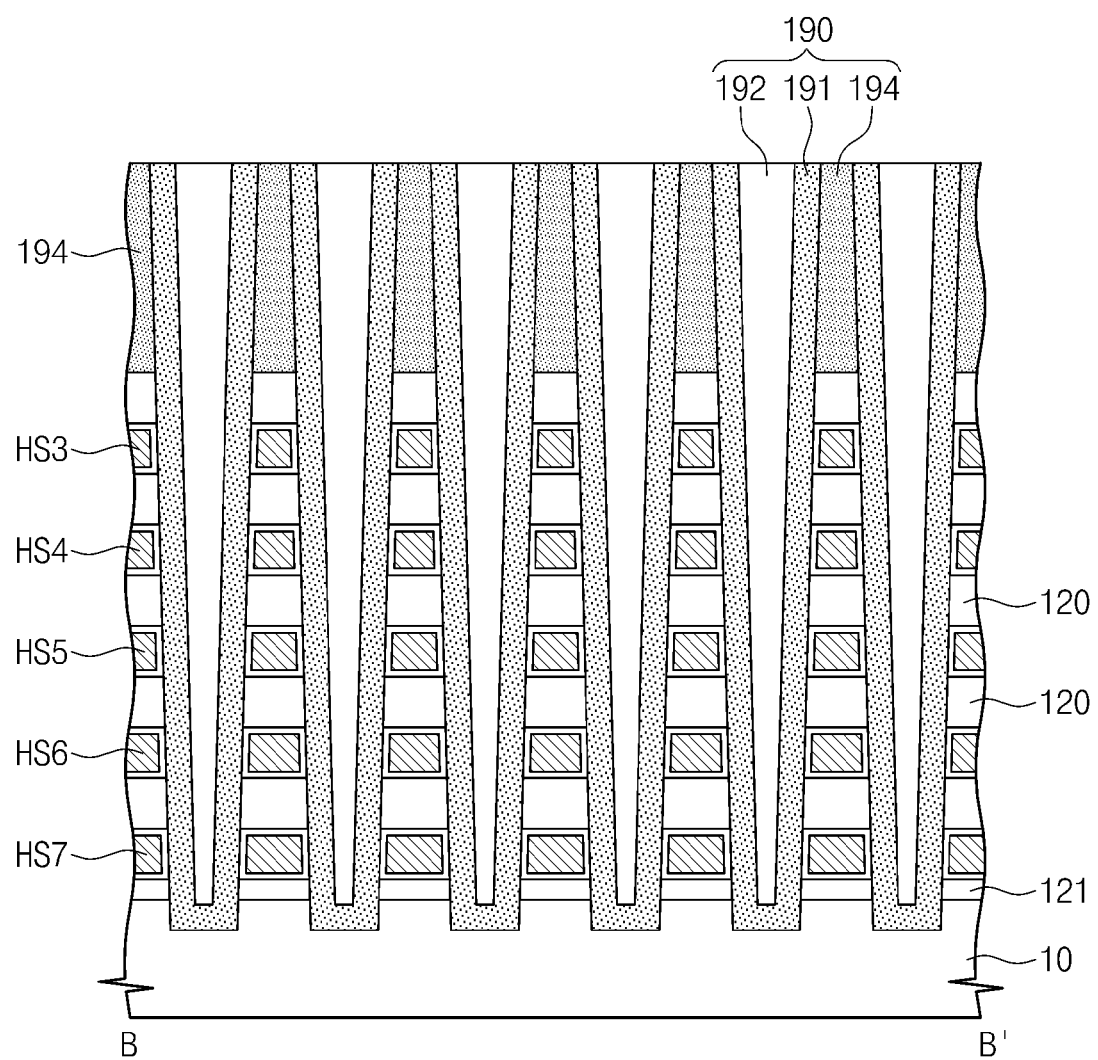
FIGS. 38 and 39 are cross-sectional views illustrating a cell array region of a three-dimensional semiconductor memory device according to an exemplary embodiment of the inventive concept.
Figure 39:
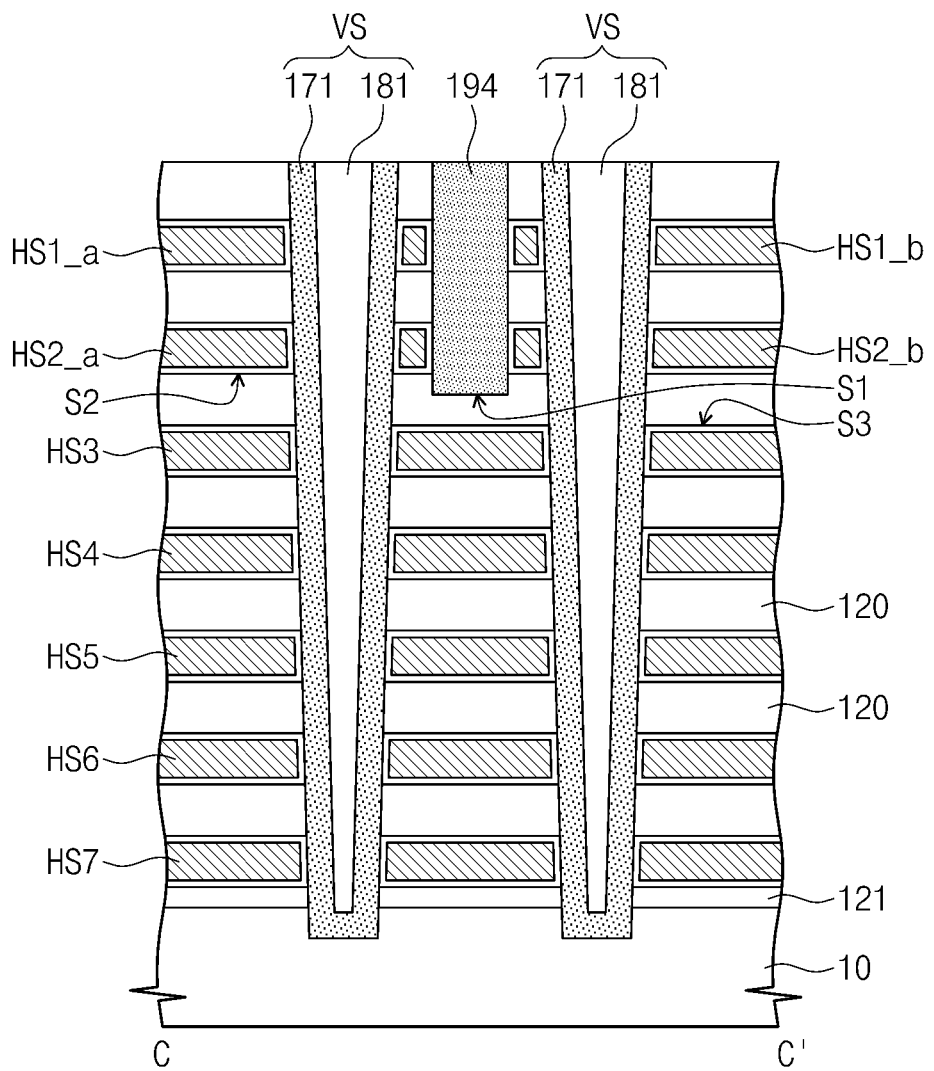

FIG. 37 is a plan view illustrating a cell array region of a three-dimensional semiconductor memory device according to an exemplary embodiment of the inventive concept. FIGS. 38 and 39, respectively, are sectional views taken along lines B-B' and C-C' of FIG. 37.

Referring to FIGS. 37 through 39, the vertical structures VS may be provided through the electrode structure. The vertical structures VS each may include a vertical semiconductor layer 171 and a vertical gap-filling layer 181 surrounded by the vertical semiconductor layer 171. The vertical structures VS may be provided in the channel holes 105 exposing the substrate 10. The vertical structures VS may be grouped into a plurality of column groups (CLM). Each of the plurality of column groups (CLM) includes a plurality of the vertical structures VS arranged along the y direction. For example, in each column group CLM, odd-numbered ones of the vertical structures VS may be spaced apart in the x direction from even-numbered ones of the vertical structures. Accordingly, the vertical structures VS of the column group CLM may be arranged in a zigzag manner along the y direction.

The separation pattern 190 may include vertical barrier patterns VB and connection insulating layers 194 interposed between the vertical barrier patterns VB. Each of the vertical barrier patterns VB may include a separation semiconductor layer 191 and an insulating separation layer 192. The vertical barrier patterns VB may be provided in vertical holes 106 exposing the substrate 10. The vertical barrier patterns VB may have substantially the same structural feature as the vertical structure VS. For example, the separation semiconductor layer 191 may have substantially the same shape as the vertical semiconductor layer 171 of the vertical structure VS, and the separation insulating layer 192 may have substantially the same shape as the vertical gap-filling layer 181 of the vertical structures VS. In an exemplary embodiment, the separation semiconductor layer 191 and the vertical semiconductor layer 171 may be formed using the same or substantially the same process, and the separation insulating layer 192 and the vertical gap-filling layer 181 may be formed using the same or substantially the same process. The areas of sections of the vertical barrier patterns VB and the vertical structures VS may decrease as the distance from the substrate 10 to the sections decreases, according to process conditions of the etching process performed to form the vertical holes.

The vertical barrier patterns VB may be spaced apart from each other in the y direction, and the connection insulating layers 194 may be provided between the vertical barrier patterns VB. In an exemplary embodiment, an x directional width d1 of the connection insulating layers 194 may be smaller than a diameter of each vertical barrier pattern VB. Alternatively, the width d1 of the connection insulating layers 194 may be greater than the diameter of each vertical barrier pattern VB.

At least one of the horizontal structures may function as a string selection line SSL. For example, the uppermost two layers of the horizontal structures may function as first string selection lines HS1_a and HS1_b and second string selection lines HS2_a and HS2_b, respectively, constituting the string selection line SSL. At least some of the horizontal structures HS3-HS7, located below the second string selection lines HS2_a and HS2_b, may function as word lines. Two lowermost layers HS7 and HS6 of the horizontal structures, located adjacent to the substrate, may function as ground selection lines. The remaining layers HS3-HS5 of the horizontal structures, except for the layers functioning as the string and ground selection lines, may function as the word lines. Hereinafter, for purposes of description, the horizontal structures HS3-HS7 may be word lines.

Bottom surfaces S1 of the connection insulating layers 194 may be lower than a bottom surface S2 of the lowermost layer (e.g., the second string selection lines HS2_a and HS2_b) of the string selection lines, in terms of a vertical level measured from the top surface of the substrate 10. Accordingly, the second string selection lines may be divided into two portions HS2_a and HS2_b by the connection insulating layers 194 and the vertical barrier patterns VB. The two portions HS2_a and HS2_b may be electrically separated from each other, and thus, can be independently operated. The first string selection lines may also be divided into two portions HS1_a and HS1_b.

The bottom surfaces S1 of the connection insulating layers 194 may be located at a level higher than a top surface S3 of the uppermost one (e.g., HS3) of the word line. Accordingly, the word lines HS3-HS7 are not divided by the connection insulating layers 194. In an embodiment, the connection insulating layers 194 may be inserted into or penetrate at least one of the word lines HS3-HS7.

Figure 40:
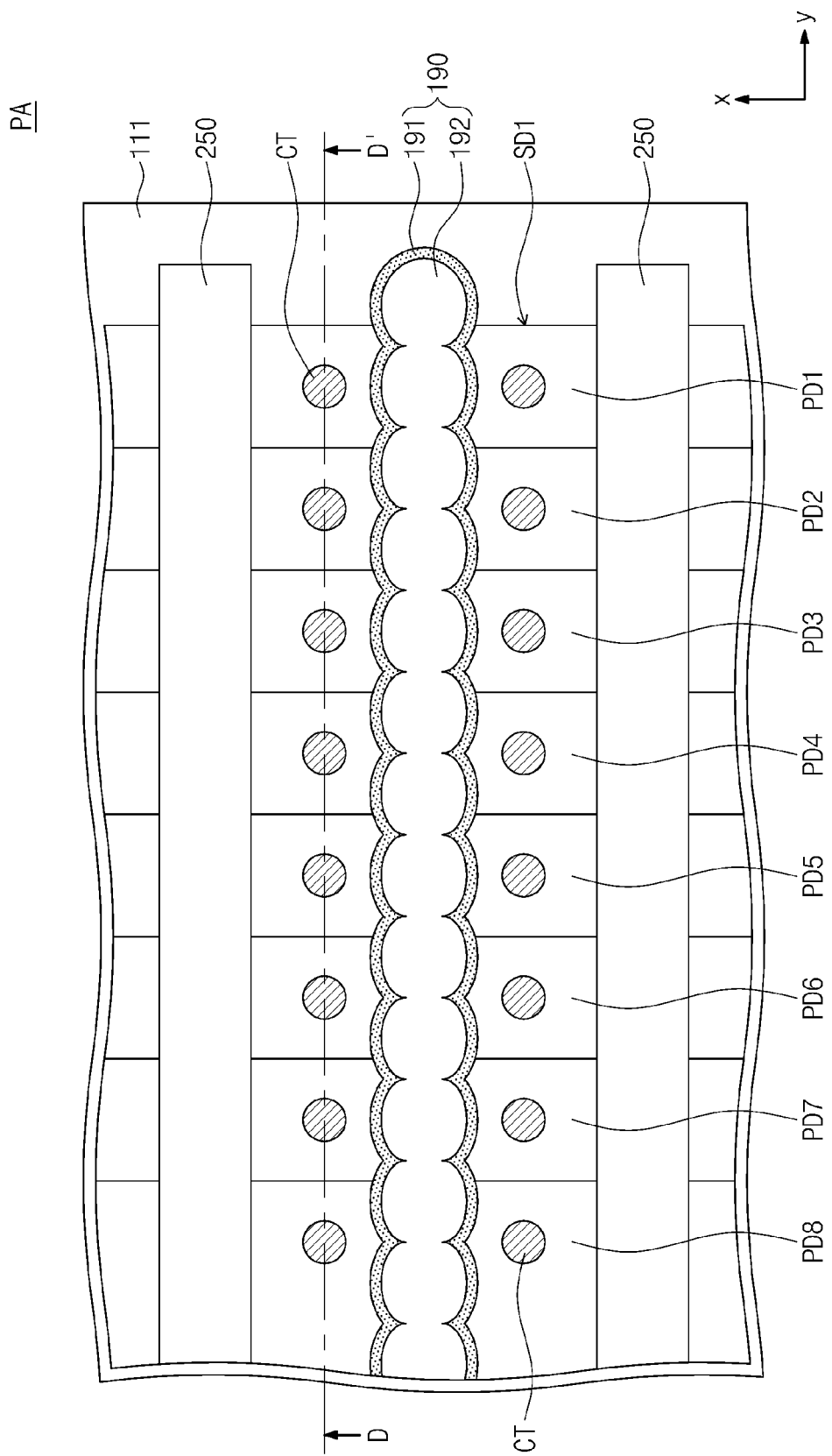
FIGS. 40 and 41, respectively, are a plan view and a cross-sectional view illustrating a pad region of a three-dimensional semiconductor memory device according to an exemplary embodiment of the inventive concept.
Figure 41:
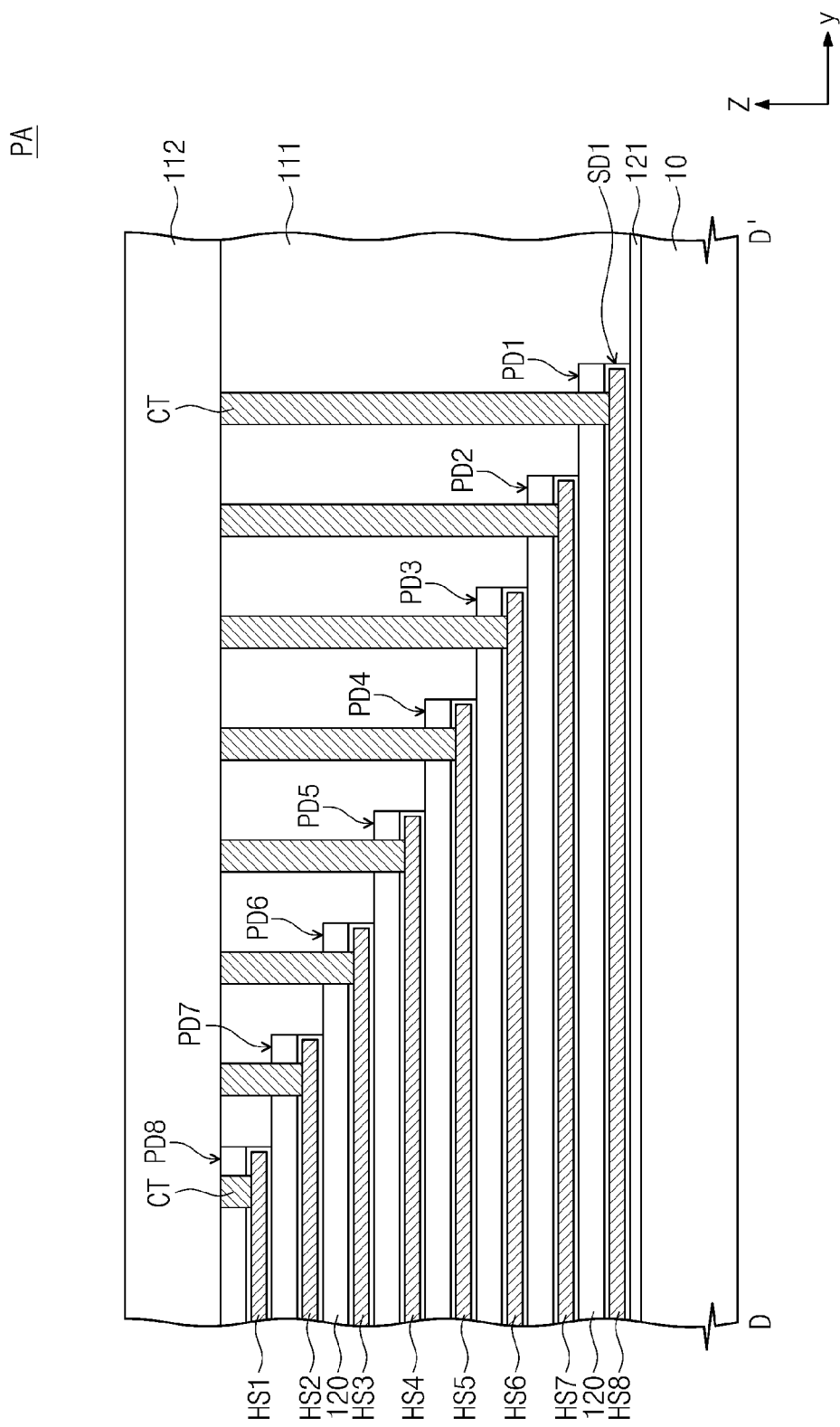

FIG. 40 is a plan view illustrating a pad region of a three-dimensional semiconductor memory device according to an exemplary embodiment of the inventive concept. FIG. 41 is a sectional view taken along a line D-D' of FIG. 40.

Referring to FIGS. 40 and 41, a pad region PA may be provided. Contact plugs electrically connected to the horizontal structures may be provided on the pad region PA. The pad region PA may be provided at one side or two opposite sides of the cell array region. In an exemplary embodiment, the pad region PA may be formed at one side or two opposite sides of the cell array region CAR of the semiconductor memory device described with reference to FIG. 11. In the pad region PA, the horizontal structures HS1-HS8 may have edge portions extending from the cell array region CAR to thereby form a stepwise structure. For example, the pad region PA may include first to eighth pad portions PD1-PD8 sequentially stacked on the substrate 10 to thereby form the stepwise structure along y direction. The pad portions PD1-PD8 may be covered with interlayered insulating layers 111 and 112. For example, the interlayered insulating layers 111 and 112 may include a silicon oxide layer, a silicon nitride layer, or a silicon oxynitride layer.

Each of the pad portions PD1-PD8 may include an end portion of a corresponding one of the horizontal structures HS1-HS8 and an insulating layer 120 provided on the corresponding horizontal structure. A patterning process may be performed in such a way that end portions of the horizontal structures HS1-HS8 are exposed at different positions, and the pad portions PD1-PD8 may be formed as a result of the patterning process. The pad portions PD1-PD8 may be electrically connected to global word lines via contact plugs CT penetrating at least a portion of the interlayered insulating layers 111 and 112.

The gap-fill insulating layers 250 may be provided to cross at least one of the pad portions PD1-PD8. For example, as shown in FIG. 40, the gap-fill insulating layers 250 may cross all of the first to eighth pad portions PD1-PD8 and protrude outward from an outermost sidewall SD1 of the first pad portion PD1. Alternatively, the gap-fill insulating layers 250 do not protrude outward from the sidewall SD1 of the first pad portion PD1. The gap-fill insulating layers 250 may include a silicon oxide layer, a silicon nitride layer, or a silicon oxynitride layer.

The separation pattern 190 may be provided between the gap-fill insulating layers 250. In plan view, the separation pattern 190 may be shaped substantially like circles partially overlapping each other along the y-direction. The separation pattern 190 may include the separation semiconductor layer 191 and the separation insulating layer 192. The separation pattern 190 may extend from the cell array region CAR described with reference to FIG. 11 toward the pad region PA. The separation pattern 190 may cross at least one of the pad portions PD1-PD8. For example, as shown in FIG. 40, the separation pattern 190 may cross all of the first to eighth pad portions PD1-PD8, thereby protruding outward from the outer sidewall SD1 of the first pad portion PD1. In an exemplary embodiment, the separation pattern 190 may extend between the contact plugs CT. In an embodiment, the separation pattern 190 does not cross the pad portions PD1-PD8. When two uppermost layers of the horizontal structures (e.g., HS1 and HS2) function as the string selection lines, the separation pattern 190 may penetrate the two uppermost layers HS1 and HS2, but not to penetrate others of the horizontal structures (e.g., HS3-HS8).

Figure 42:
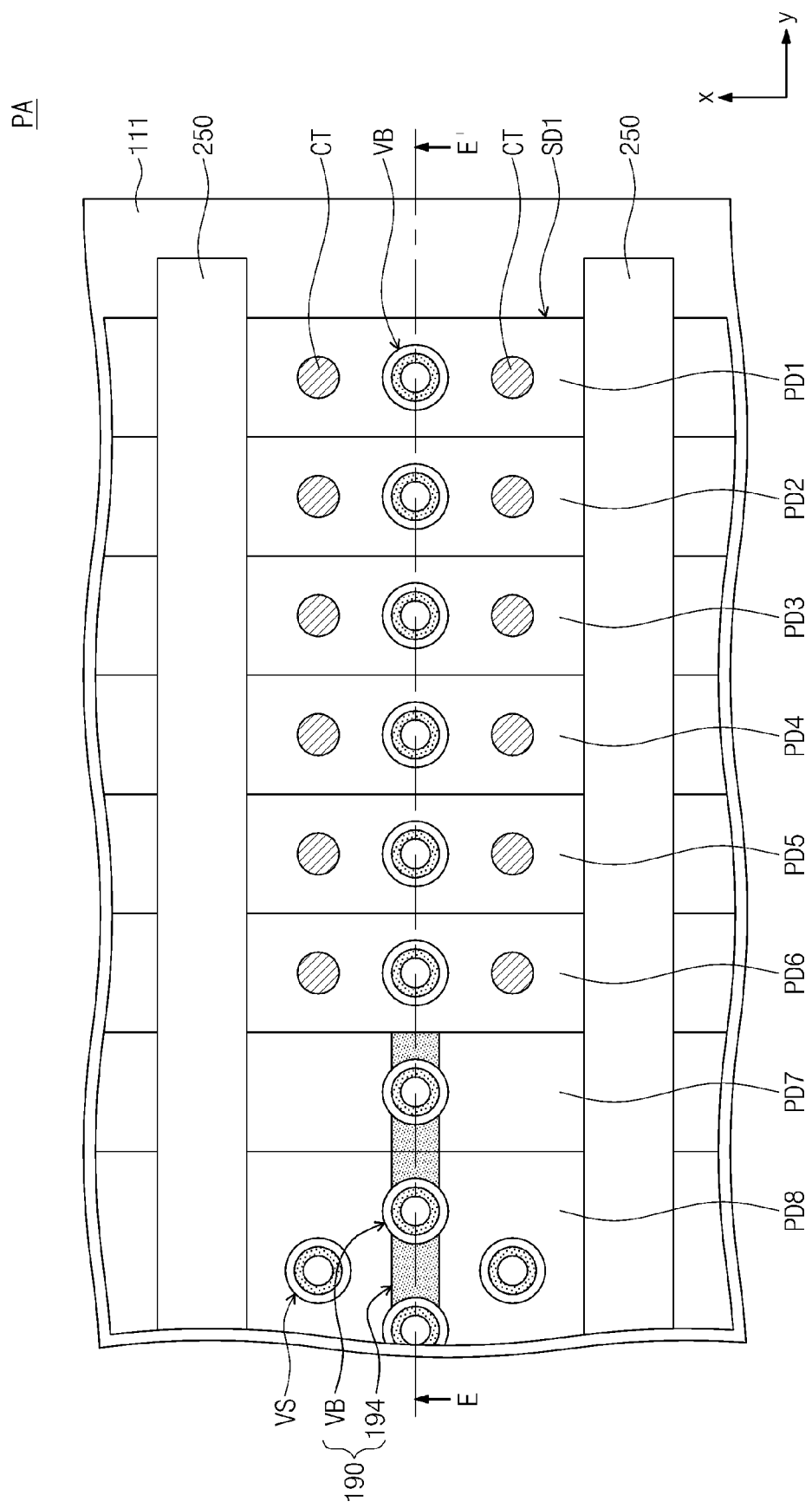
FIGS. 42 and 43, respectively, are a plan view and a cross-sectional view illustrating a pad region of a three-dimensional semiconductor memory device according to an exemplary embodiment of the inventive concept.
Figure 43:
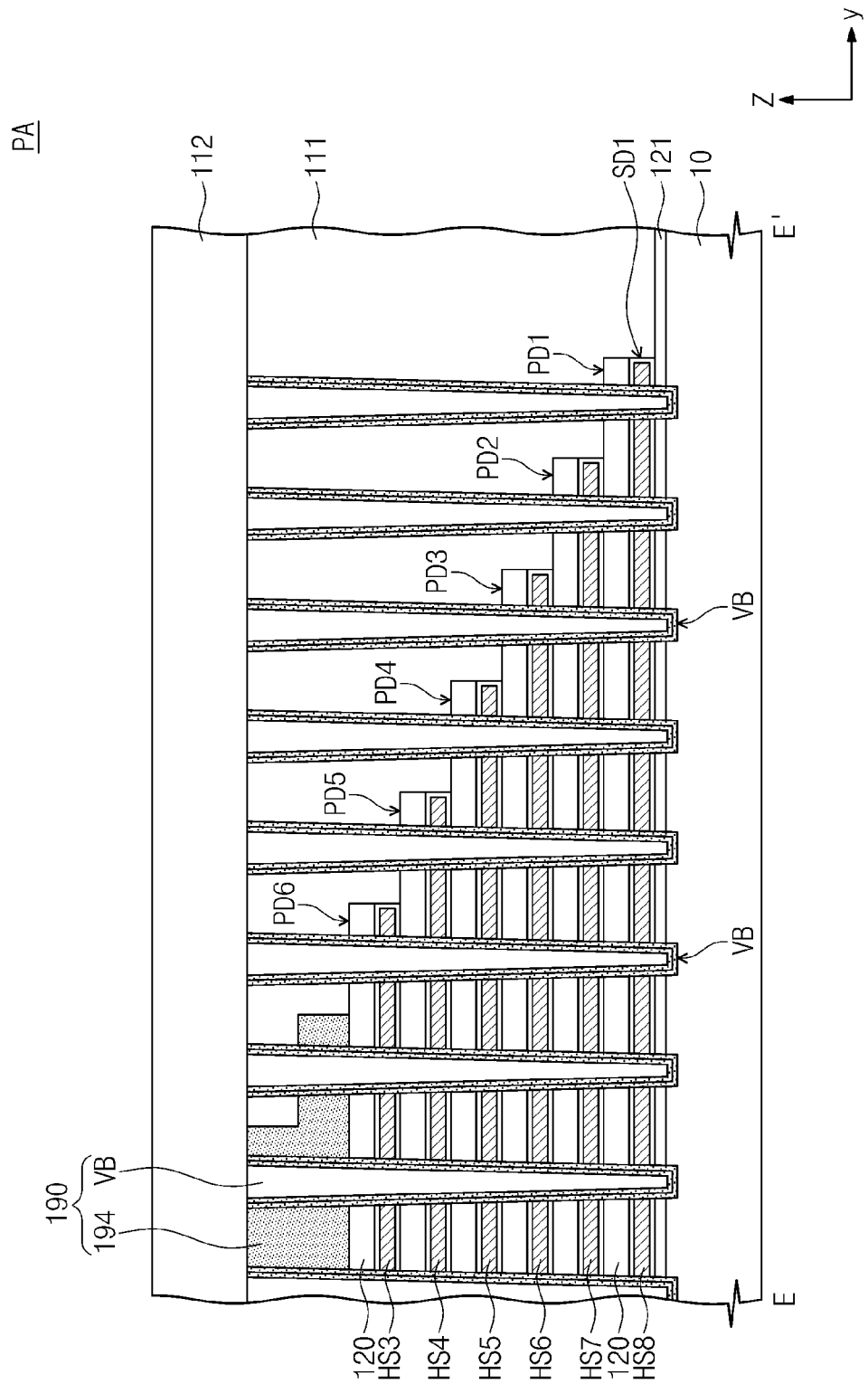

FIG. 42 is a plan view illustrating a pad region of a three-dimensional semiconductor memory device according to an exemplary embodiment of the inventive concept. FIG. 43 is a sectional view taken along a line E-E' of FIG. 42.

Referring to FIGS. 42 and 43, vertical barrier patterns VB may be provided in the pad region PA. to the vertical barrier patterns VB have substantially the same structural features as the vertical structures VS. For example, in the case of the embodiments described in connection with FIGS. 37 through 39, the connection insulating layers 194 in the separation pattern 190 may be used to constitute seventh and eighth pad portions PD7 and PD8, and others of the pad portions PD1-PD6 may be penetrated by the vertical barrier patterns VB. The connection insulating layers 194 are not provided between the vertical barrier patterns VB penetrating the first to sixth pad portions PD1-PD6. The connection insulating layers 194 may be spaced apart from each other.

Figure 44:
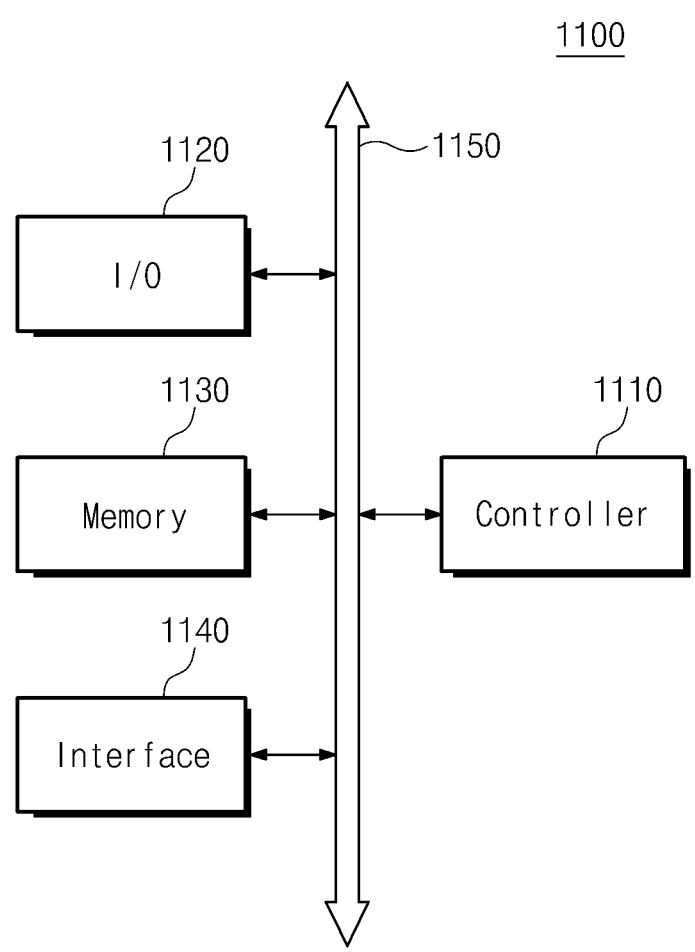
FIG. 44 is a schematic block diagram illustrating an example of a memory system including a three-dimensional semiconductor memory device according to an embodiment of the inventive concept.

FIG. 44 is a schematic block diagram illustrating an example of a memory system including a semiconductor memory device according to an embodiment of the inventive concept.

According to an embodiment, a memory system 1100 can be applied to a personal digital assistant (PDA), a portable computer, a web tablet, a wireless phone, a mobile phone, a digital music player, a memory card and/or all the devices capable of transmitting and/or receiving data in a wireless communication environment.

Referring to FIG. 44, the memory system 1100 includes a controller 1110, an input/output (I/O) device 1120, such as a keypad and a display device, a memory 1130, an interface 1140, and a bus 1150. The memory 1130 and the interface 1140 communicate with each other through the bus 1150.

The controller 1110 includes at least a microprocessor, at least a digital signal processor, at least a microcontroller or other similar process devices. The memory 1130 may be used to store an instruction executed by the controller 1110. The I/O device 1120 can receive data or a signal from the outside of the system 1100 or transmit data or a signal to the outside of the system 1100. For example, the I/O device 1120 may include a keyboard, a keypad, and/or a display device.

The memory 1130 includes a nonvolatile memory device according to an embodiment of the inventive concept. The memory 1130 may further include various types of memories, such as a volatile memory device capable of random access.

The interface 1140 transmits data to a communication network or receives data from a communication network (not shown).

Figure 45:
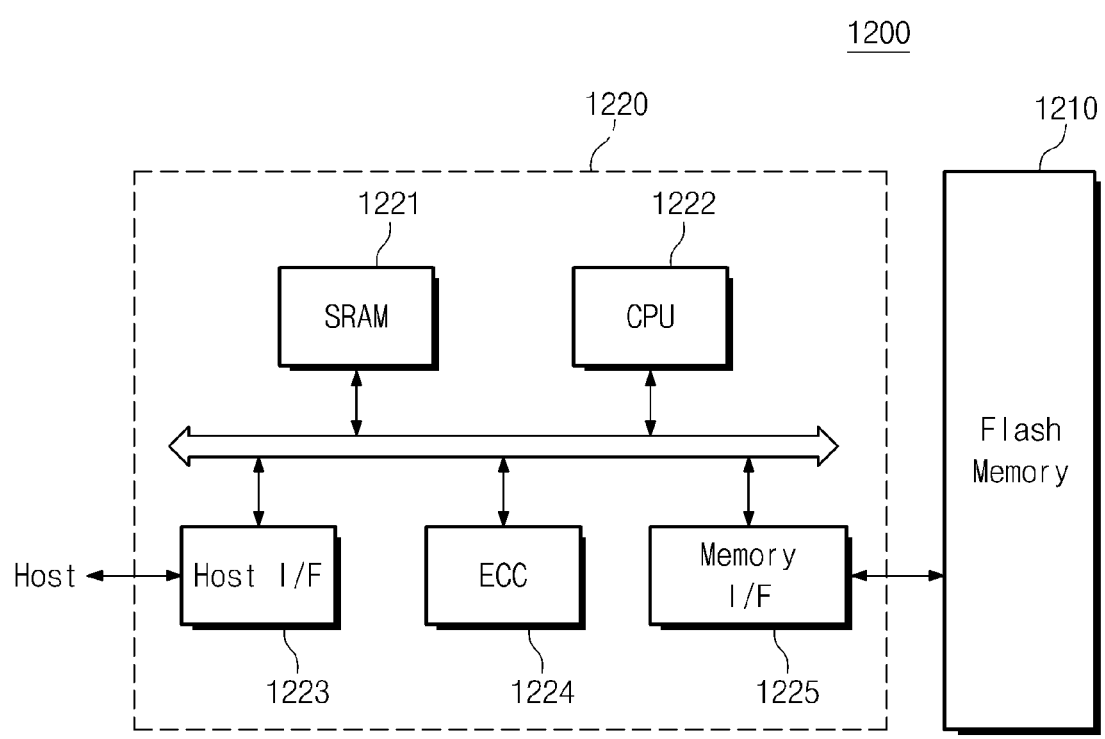
FIG. 45 is a block diagram illustrating an example of a memory card including a three-dimensional semiconductor memory device according to an embodiment of the inventive concept.

FIG. 45 is a block diagram illustrating an example of a memory card including a semiconductor memory device according to an embodiment of the inventive concept.

Referring to FIG. 45, the memory card 1200 for supporting high-capacity data storage includes a FLASH memory device 1210 according to an embodiment of the inventive concept. The memory card 1200 according to an embodiment of the inventive concept includes a memory controller 1220 that controls every data exchange between a host and the FLASH memory device 1210.

A static random access memory (SRAM) 1221 is used as an operation memory of a processing unit (also referred to as "CPU") 1222. A host interface 1223 includes data exchange protocols of a host to be connected to the memory card 1200. An error correction block (also referred to as "ECC") 1224 detects and corrects errors included in data readout from the multi-bit FLASH memory device 1210. A memory interface 1225 interfaces with the FLASH memory device 1210. The processing unit 1222 performs every control operation for exchanging data of the memory controller 1220. According to an embodiment, the memory card 1200 may further include a ROM storing code data for interfacing with the host.

Figure 46:
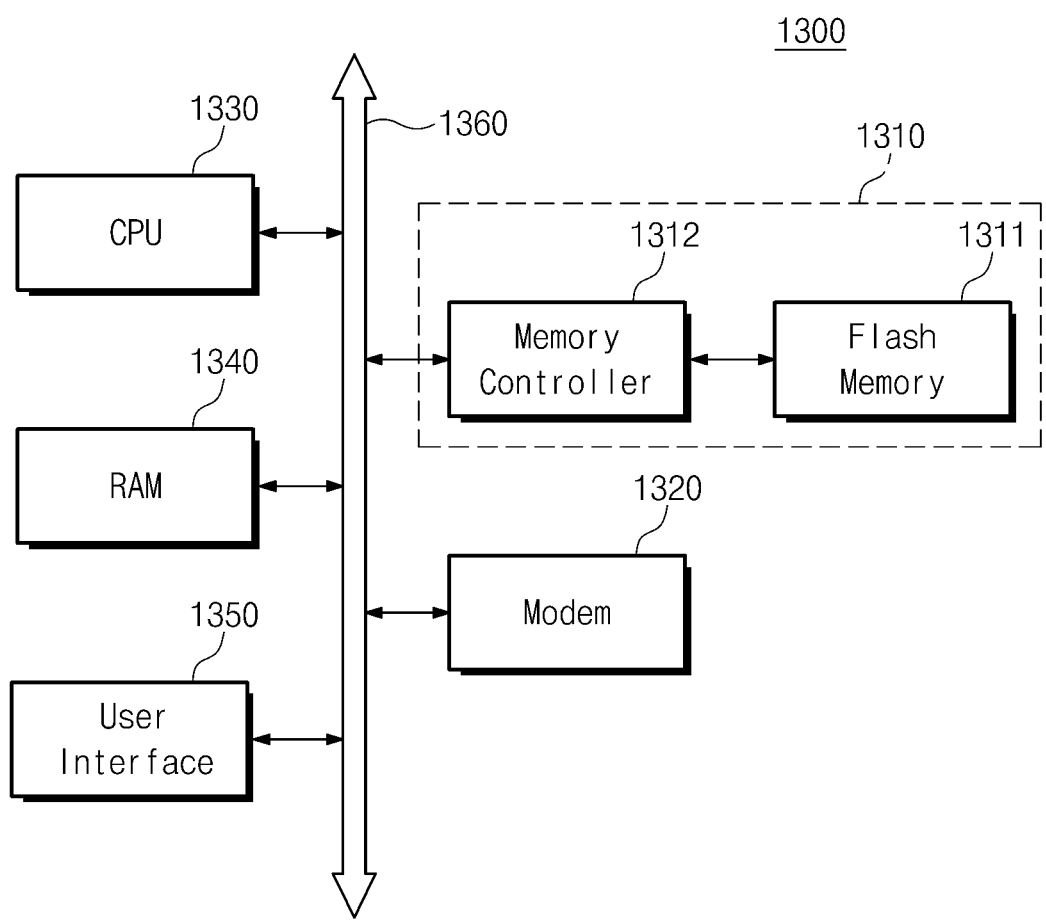
FIG. 46 is a block diagram illustrating an example of an information processing system including a three-dimensional semiconductor memory device according to an embodiment of the inventive concept.

FIG. 46 is a block diagram illustrating an example of an information processing system including a semiconductor memory device according to an embodiment of the inventive concept.

Referring to FIG. 46, a FLASH memory system 1310 according to an embodiment of the inventive concept is built in a data processing system 1300, such as a mobile product or a desk top computer. The data processing system 1300 includes the FLASH memory system 1310 and a modem 1320, a central processing unit ("CPU") 1330, a RAM 1340, and a user interface 1350 that are electrically connected to a system bus 1360. The FLASH memory system 1310 may be to the same or substantially the same as the memory system or the FLASH memory system described above. The FLASH memory system 1310 stores data processed by the central processing unit 1330 or data inputted from an external device (not shown). The FLASH memory system 1310 may include a solid-state disc (SSD) so that the data processing system 1310 can stably store huge amounts of data in the FLASH memory system 1310. As reliability is improved, the FLASH memory system 1310 can reduce resources used to correct errors so that the data processing system 1300 can provide a high-speed data exchange function. According to an embodiment, the data processing unit 1300 may further include an application chipset, a camera image processor (CIS), and/or an input/output device.

The FLASH memory device or memory system according to the embodiments of the inventive concept can be mounted in various types of packages. For example, a FLASH memory device or a memory system according to an embodiment of the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multichip package (MCP), wafer-level fabricated package (WFP), wafer-level processed stack package (WSP) and mounted.

According to the exemplary embodiments of the inventive concept, three-dimensionally arranged electrodes may be horizontally separated by gap-fill insulating patterns and separation patterns that are alternately arranged. The separation patterns may have a smaller width than a width of the gap-fill insulating pattern, and thus it is possible to fabricate the three-dimensional semiconductor device having an increased integration density.

Furthermore, since the separation pattern may structurally support the mold structure 100, the removal of the sacrificial layers and the formation of the conductive patterns may be stably performed, compared with the absence of the separation pattern.

While exemplary embodiments have been particularly shown and described, it will be understood by one of ordinary skill in the art that variations in form and detail may be made therein without departing from the spirit and scope of the claims.

What is claimed is:

1. A three-dimensional (3D) semiconductor device, comprising:
gap-fill insulating layers extending upward from a substrate;
an electrode structure delimited by sidewalls of the gap-fill insulating layers;
vertical structures provided between adjacent ones of the gap-fill insulating layers to penetrate the electrode structure; and
at least one separation pattern extending substantially in parallel with the gap-fill insulating layers and penetrating at least a portion of the electrode structure,
wherein the at least one separation pattern comprises at least one separation semiconductor layer.

2. The 3D semiconductor device of claim 1, wherein at least one of the vertical structures is provided in a corresponding channel hole of channel holes penetrating the electrode structure and comprises a vertical semiconductor layer filling a portion of the corresponding channel hole.

3. The 3D semiconductor device of claim 2, wherein the at least one separation pattern is provided in a first trench exposing the substrate, and wherein the separation semiconductor layer fills at least a portion of the first trench and comprises substantially the same material as the vertical semiconductor layer.

4. The 3D semiconductor device of claim 1, wherein the at least one separation pattern comprises vertical barrier patterns, wherein at least one of the vertical barrier patterns includes the separation semiconductor layer and a separation insulating layer surrounded by the separation semiconductor layer, and wherein
the vertical barrier patterns are provided in vertical holes disposed along an extending direction of the gap-fill insulating layers and exposing the substrate.

5. The 3D semiconductor device of claim 4, wherein the vertical barrier patterns have substantially the same shape as the vertical structures.

6. The 3D semiconductor device of claim 4, wherein the vertical barrier patterns are disposed spaced apart from each other along the extending direction of the gap-fill insulating layers, and wherein
the at least one separation pattern further comprises connection insulating layers between the vertical barrier patterns.

7. The 3D semiconductor device of claim 6, wherein the electrode structure comprises a string selection line and word lines provided under the string selection line, and
wherein bottom surfaces of the connection insulating layers are lower than a bottom surface of the string selection line.

8. The 3D semiconductor device of claim 7, wherein the bottom surfaces of the connection insulating layers are higher than a top surface of an uppermost one of the word lines.

9. The 3D semiconductor device of claim 4, wherein the vertical barrier patterns are connected to each other along the extending direction of the gap-fill insulating layers, and wherein
the separation semiconductor layers of the vertical barrier patterns are connected to each other.

10. The 3D semiconductor device of claim 4, wherein the vertical barrier patterns further comprise vertical separation patterns between sidewalls of the vertical holes and the separation semiconductor layers, wherein
the vertical separation patterns are connected to each other along the extending direction of the gap-fill insulating layers, and wherein
the separation semiconductor layers are spaced apart from each other by the vertical separation patterns.

11. The 3D semiconductor device of claim 10, wherein the vertical structures comprise memory layers provided on sidewalls of channel holes penetrating the electrode structure, and wherein
the vertical separation patterns and the memory layers are formed of same layers.

12. The 3D semiconductor device of claim 1, wherein the electrode structure comprises horizontal structures sequentially stacked on the substrate, and wherein
the three-dimensional semiconductor device comprises:
a cell array region provided with the vertical structures; and
a pad region provided at one side or two opposite sides of the cell array region to include a stepwise structure formed by end portions of the horizontal structures,
wherein the at least one separation pattern extends from the cell array region to the pad region.

13. The 3D semiconductor device of claim 12, wherein the pad region comprises:
a plurality of pad portions sequentially stacked on the substrate; and
contact plugs electrically connected to the pad portions,
wherein the at least one separation pattern extends between the contact plugs.

14. The 3D semiconductor device of claim 12, wherein the pad region comprises a plurality of pad portions sequentially stacked on the substrate, and wherein the at least one separation pattern penetrates a sidewall of a lowermost one of the pad portions.

15. The 3D semiconductor device of claim 1, wherein, in plain view, the at least one separation pattern is shaped substantially like circles partially overlapping each other along the extending direction of the gap-fill insulating layers.

16. The 3D semiconductor device of claim 1, wherein the electrode structure comprises electrodes and insulating layers alternatingly stacked on each other, and wherein the three-dimensional semiconductor device further comprises memory layers between the electrodes and the vertical structures,
wherein the memory layers extend between the at least one separation pattern and the electrodes and electrically isolate the at least one separation pattern from the electrodes.

17. A three-dimensional (3D) semiconductor device, comprising:
horizontal structures sequentially stacked on a substrate;
vertical structures penetrating the horizontal structures; and
at least one separation pattern extending between the vertical structures and penetrating at least partially the horizontal structures,
wherein the horizontal structures comprise end portions constituting a stepwise pad region, and
the at least one separation pattern comprises vertical barrier patterns penetrating the pad region and including at least one layer formed of the same material as the vertical structures.

18. The 3D semiconductor device of claim 17, wherein the vertical structures are provided in channel holes penetrating the horizontal structures, and the vertical barrier patterns are provided in vertical holes penetrating the pad region.

19. The 3D semiconductor device of claim 17, wherein the at least one separation pattern further comprises connection insulating layers connecting the vertical barrier patterns with each other and penetrating at least one of the horizontal structures.

20. The 3D semiconductor device of claim 17, wherein the vertical barrier patterns and the vertical structures are formed of same layers.

21. A semiconductor device comprising:
- a substrate;
- a plurality of horizontal structures stacked on a top surface of the substrate;
- a row of vertical structures penetrating the horizontal structures in a first direction substantially perpendicular to the top surface of the substrate, wherein the vertical structures are spaced apart from each other in a second direction substantially parallel to the top surface of the substrate;
- a separation pattern penetrating at least one of the horizontal structures in the first direction, wherein the separation pattern extends in the second direction, and wherein the separation pattern has a cross section shaped substantially like circles that are spaced apart from each other or partially overlap each other; and
- a gap-fill insulating pattern penetrating the horizontal structures in the first direction.

* * * * *